US011626162B2

(12) United States Patent
Sakui et al.

(10) Patent No.: US 11,626,162 B2
(45) Date of Patent: Apr. 11, 2023

(54) PARTIAL BLOCK MEMORY OPERATIONS

(71) Applicant: Micron Technology, Inc., Boise, ID (US)

(72) Inventors: Koji Sakui, Setagayaku (JP); Akira Goda, Boise, ID (US); Peter Sean Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 16/744,675

(22) Filed: Jan. 16, 2020

(65) Prior Publication Data
US 2020/0152271 A1 May 14, 2020

Related U.S. Application Data

(62) Division of application No. 13/564,458, filed on Aug. 1, 2012, now Pat. No. 10,541,029.

(51) Int. Cl.
*G11C 16/04* (2006.01)
*G11C 16/08* (2006.01)
(Continued)

(52) U.S. Cl.
CPC .......... *G11C 16/0483* (2013.01); *G11C 16/08* (2013.01); *G11C 16/10* (2013.01); *G11C 16/16* (2013.01); *G11C 2213/75* (2013.01)

(58) Field of Classification Search
CPC .................. G11C 16/0483; G11C 2213/75
(Continued)

(56) References Cited

U.S. PATENT DOCUMENTS 5,615,152 A 3/1997 Bergemont
5,835,396 A 11/1998 Zhang
(Continued)

FOREIGN PATENT DOCUMENTS

CN 101681677 A 3/2010
CN 103782344 A 6/2014
(Continued)

OTHER PUBLICATIONS

"European Application Serial No. 20170725.4, Extended European Search Report dated Aug. 12, 2020", 8 pgs.
(Continued)

*Primary Examiner* — Anthan Tran
(74) *Attorney, Agent, or Firm* — Schwegman Lundberg & Woessner, P.A.

(57) ABSTRACT

Methods and apparatuses are disclosed, such as those including a block of memory cells that includes strings of charge storage devices. Each of the strings may comprise a plurality of charge storage devices formed in a plurality of tiers. The apparatus may comprise a plurality of access lines shared by the strings. Each of the plurality of access lines may be coupled to the charge storage devices corresponding to a respective tier of the plurality of tiers. The apparatus may comprise a plurality of sub-sources associated with the strings. Each of the plurality of sub-sources may be coupled to a source select gate of each string of a respective subset of a plurality of subsets of the strings, and each sub-source may be independently selectable from other sub-sources to select the strings of its respective subset independently of other strings corresponding to other subsets.

11 Claims, 40 Drawing Sheets

(51) Int. Cl.
 *G11C 16/10* (2006.01)
 *G11C 16/16* (2006.01)
(58) Field of Classification Search
 USPC .................................................. 365/185.17
 See application file for complete search history.

(56) References Cited

U.S. PATENT DOCUMENTS

| | | |
|---|---|---|
| 5,969,990 A | 10/1999 | Arase |
| 6,154,391 A | 11/2000 | Takeuchi et al. |
| 6,272,044 B2 | 8/2001 | Yamamoto et al. |
| 6,307,781 B1 | 10/2001 | Shum |
| 6,870,769 B1 | 3/2005 | Ha |
| 7,023,739 B2 | 4/2006 | Chen et al. |
| 7,196,930 B2 | 3/2007 | Han et al. |
| 7,259,991 B2 | 8/2007 | Aritome |
| 7,433,231 B2 | 10/2008 | Aritome |
| 7,433,233 B2 | 10/2008 | Chen et al. |
| 7,440,321 B2 | 10/2008 | Aritome |
| 7,599,228 B1 | 10/2009 | Lu et al. |
| 7,626,866 B2 | 12/2009 | Aritome |
| 7,630,236 B2 | 12/2009 | Han et al. |
| 7,924,619 B2 | 4/2011 | Aritome |
| 7,940,564 B2 | 5/2011 | Park et al. |
| 8,004,885 B2 | 8/2011 | Yun et al. |
| 8,134,868 B2 | 3/2012 | Chandrasekhar |
| 8,213,235 B2 | 7/2012 | Kim |
| 8,237,213 B2 | 8/2012 | Lin |
| 8,542,533 B2 | 9/2013 | Maejima et al. |
| 8,599,614 B2 | 12/2013 | Miida et al. |
| 8,797,806 B2 | 8/2014 | Goda et al. |
| 9,318,199 B2 | 4/2016 | Abraham et al. |
| 9,318,200 B2 | 4/2016 | Sakui |
| 9,378,839 B2 | 6/2016 | Goda et al. |
| 9,653,171 B2 | 5/2017 | Abraham et al. |
| 9,779,816 B2 | 10/2017 | Goda et al. |
| 10,170,189 B2 | 1/2019 | Goda et al. |
| 10,541,029 B2 | 1/2020 | Sakui et al. |
| 10,783,967 B2 | 9/2020 | Goda et al. |
| 11,211,126 B2 | 12/2021 | Goda et al. |
| 2002/0088976 A1 | 7/2002 | Shin et al. |
| 2004/0190324 A1 | 9/2004 | Yamamura |
| 2005/0128807 A1 | 6/2005 | Chen et al. |
| 2005/0232012 A1 | 10/2005 | Park |
| 2006/0245252 A1 | 11/2006 | Han et al. |
| 2006/0245263 A1 | 11/2006 | Sakui |
| 2006/0261404 A1 | 11/2006 | Forbes |
| 2007/0252201 A1 | 11/2007 | Kito et al. |
| 2007/0253253 A1 | 11/2007 | Aritome |
| 2007/0263462 A1 | 11/2007 | Roohparvar |
| 2008/0068875 A1 | 3/2008 | Choi |
| 2008/0181020 A1* | 7/2008 | Yu ..................... G11C 16/0483 365/185.27 |
| 2008/0219053 A1 | 9/2008 | Kim |
| 2009/0175083 A1 | 7/2009 | Ajika et al. |
| 2009/0180324 A1 | 7/2009 | Ramaswamy et al. |
| 2009/0230454 A1 | 9/2009 | Pekny |
| 2010/0124116 A1 | 5/2010 | Maeda et al. |
| 2010/0172179 A1 | 7/2010 | Gorobets |
| 2010/0207194 A1 | 8/2010 | Tanaka et al. |
| 2010/0214839 A1 | 8/2010 | Guzzi et al. |
| 2010/0238732 A1 | 9/2010 | Hishida et al. |
| 2010/0257308 A1 | 10/2010 | Hsu et al. |
| 2010/0309729 A1 | 12/2010 | Chang et al. |
| 2010/0322000 A1 | 12/2010 | Shim et al. |
| 2011/0049607 A1 | 3/2011 | Yahashi |
| 2011/0051512 A1 | 3/2011 | Violette |
| 2011/0141788 A1 | 6/2011 | Balakrishnan et al. |
| 2011/0149655 A1* | 6/2011 | Tanzawa ............ G11C 16/0483 365/185.17 |
| 2011/0194357 A1 | 8/2011 | Hau et al. |
| 2011/0249503 A1 | 10/2011 | Yamada et al. |
| 2011/0298011 A1 | 12/2011 | Lee et al. |
| 2011/0299314 A1 | 12/2011 | Samachisa et al. |
| 2012/0081957 A1 | 4/2012 | Kim et al. |
| 2012/0320678 A1* | 12/2012 | Maejima ............ G11C 16/0483 365/185.11 |
| 2013/0044549 A1 | 2/2013 | Goda |
| 2013/0272067 A1 | 10/2013 | Lee et al. |
| 2014/0036590 A1 | 2/2014 | Feeley et al. |
| 2014/0043915 A1 | 2/2014 | Choi |
| 2014/0340963 A1 | 11/2014 | Goda et al. |
| 2015/0206587 A1 | 7/2015 | Hasegawa et al. |
| 2016/0019970 A1 | 1/2016 | Sakui |
| 2016/0232979 A1 | 8/2016 | Abraham et al. |
| 2016/0343438 A1 | 11/2016 | Goda |
| 2018/0122481 A1 | 5/2018 | Goda et al. |
| 2019/0279715 A1 | 9/2019 | Goda et al. |
| 2019/0392907 A1 | 12/2019 | Her et al. |
| 2021/0174874 A1 | 6/2021 | Goda et al. |
| 2022/0189552 A1 | 6/2022 | Goda et al. |

FOREIGN PATENT DOCUMENTS

| | | |
|---|---|---|
| CN | 104903964 A | 9/2015 |
| CN | ZL201380062847.6 | 2/2018 |
| EP | 2912665 A1 | 9/2015 |
| EP | 2912665 B1 | 9/2019 |
| EP | 2745295 B1 | 4/2020 |
| JP | 2001135100 A | 5/2001 |
| JP | 2002231835 A | 8/2002 |
| JP | 2002245786 A | 8/2002 |
| JP | 2004326864 A | 11/2004 |
| JP | 2010520571 A | 6/2010 |
| JP | 2010192569 A | 9/2010 |
| JP | 2011016530 A | 1/2011 |
| KR | 20020060490 | 7/2002 |
| KR | 1020020060490 A | 7/2002 |
| KR | 100624596 B1 | 9/2006 |
| KR | 20090128776 | 12/2009 |
| KR | 20100094384 A | 8/2010 |
| KR | 20110042526 A | 4/2011 |
| KR | 1020110132820 A | 12/2011 |
| KR | 10-1866236 | 6/2018 |
| KR | 102212154 B1 | 2/2021 |
| KR | 102274276 B1 | 7/2021 |
| TW | 200849261 A | 12/2008 |
| TW | 201126531 A | 8/2011 |
| TW | 201145300 A | 12/2011 |
| TW | 201209827 A | 3/2012 |
| TW | I590048 | 7/2017 |
| WO | WO-2007005891 A2 | 1/2007 |
| WO | WO-2011019794 A2 | 2/2011 |
| WO | WO-2013025710 A1 | 2/2013 |
| WO | WO-2014066829 A1 | 5/2014 |

OTHER PUBLICATIONS

"Korean Application Serial No. 10-2015-7013333, Notice of Preliminary Rejection dated Jul. 14, 2020", 5 pgs.

"Korean Application Serial No. 10-2015-7013333, Response filed Mar. 2, 2020 to Notice of Preliminary Rejection dated Dec. 31, 2019", w/ English Claims, 26 pgs.

"Korean Application Serial No. 10-2018-7015781, Office Action dated Apr. 24, 2020", w/English translation, 12 pgs.

"Korean Application Serial No. 10-2018-7015781, Response filed Jun. 24, 2020 to Office Action dated Apr. 24, 2020", w/ English Claims, 19 pgs.

U.S. Appl. No. 13/210,194 U.S. Pat. No. 8,797,806, filed Aug. 15, 2011, Apparatus and Methods Including Source Gates.

U.S. Appl. No. 14/451,145 U.S. Pat. No. 9,378,839, filed Aug. 4, 2014, Apparatus and Methods Including Source Gates.

U.S. Appl. No. 15/166,029 U.S. Pat. No. 9,779,816, filed May 26, 2016, Apparatus and Methods Including Source Gates.

U.S. Appl. No. 15/721,007 U.S. Pat. No. 10,170,189, filed Sep. 29, 2017, Apparatus and Methods Including Source Gates.

U.S. Appl. No. 16/237,337, filed Dec. 31, 2018, Apparatus and Methods Including Source Gates.

U.S. Appl. No. 13/564,458 U.S. Pat. No. 10,541,029, filed Aug. 1, 2012, Partial Block Memory Operations.

(56) References Cited

OTHER PUBLICATIONS

U.S. Appl. No. 13/661,321 U.S. Pat. No. 9,318,199, filed Oct. 26, 2012, Partial Page Memory Operations.
U.S. Appl. No. 15/131,719 U.S. Pat. No. 9,653,171, filed Apr. 18, 2016, Partial Page Memory Operations.
U.S. Appl. No. 17/027,425, filed Sep. 21, 2020, Apparatus and Methods Including Source Gates.
"Korean Application Serial No. 10-2015-7013333, Response filed Nov. 16, 2020 to Notice of Preliminary Rejection dated Jul. 14, 2020", w English Claims, 27 pgs.
"European Application Serial No. 20170725.4, Response filed Mar. 9, 2021 to Extended European Search Report dated Aug. 12, 2020", 21 pgs.
"Chinese Application Serial No. 201280043709.9 Response filed Feb. 15, 2015 to Office Action dated Nov. 4, 2014", With the English claims, 14 pgs.
"Chinese Application Serial No. 201280043709.9, Amendment filed Aug. 8, 2014", W/ English Translation, 14 pgs.
"Chinese Application Serial No. 201280043709.9, Office Action dated Nov. 4, 2014", W/ English Translation, 8 pgs.
"Chinese Application Serial No. 201380062847.6, Office Action dated Apr. 27, 2017", w/English Translation, 30 pgs.
"Chinese Application Serial No. 201380062847.6, Response filed Sep. 12, 2017 to Office Action dated Apr. 27, 2017", w/English Claims, 29 pgs.
"European Application Serial No. 12824349.0, Communication Pursuant to Article 94(3) EPC dated Dec. 8, 2017", 5 pgs.
"European Application Serial No. 12824349.0, Communication pursuant to Rules 70(2) and 70a(2) EPC dated Feb. 11, 2016", 1 pg.
"European Application Serial No. 12824349.0, Extended European Search Report dated Jan. 25, 2016", 6 pgs.
"European Application Serial No. 12824349.0, Office Action dated Mar. 26, 2014", 3 pgs.
"European Application Serial No. 12824349.0, Response filed Apr. 18, 2018 to Communication Pursuant to Article 94(3) EPC dated Dec. 8, 2017", w/ English Claims, 14 pgs.
"European Application Serial No. 12824349.0, Response filed Oct. 6, 2014 to Office Action dated Mar. 26, 2014", 30 pgs.
"European Application Serial No. 13848265.8, Extended European Search Report dated Jun. 1, 2016", 7 pgs.
"European Application Serial No. 13848265.8, Response filed Dec. 28, 2016 to Extended European Search Report dated Jun. 1, 2016", 15 pgs.
"European Application Serial No. 13848265.8,Preliminary Amendment filed Dec. 16, 2015", 4 pgs.
"International Application Serial No. PCT/US2012/050783, International Preliminary Report on Patentability dated Feb. 27, 2014", 7 pgs.
"International Application Serial No. PCT/US2012/050783, International Search Report dated Dec. 17, 2012", 3 pgs.
"International Application Serial No. PCT/US2012/050783, Written Opinion dated Dec. 17, 2012", 5 pgs.
"International Application Serial No. PCT/US2013/066931, International Preliminary Report on Patentability dated May 7, 2015", 9 pgs.
"International Application Serial No. PCT/US2013/066931, International Search Report dated Feb. 10, 2014", 3 pgs.
"International Application Serial No. PCT/US2013/066931, Written Opinion dated Feb. 10, 2014", 7 pgs.
"Japanese Application Serial No. 2014-526130, Office Action dated Aug. 18, 2015", W/ English Translation, 11 pgs.
"Japanese Application Serial No. 2014-526130, Response filed Nov. 18, 2015", W/ English Claims, 14 pgs.
"Japanese Application Serial No. 2015-539863, Office Action dated Feb. 7, 2017", w/English Translation, 8 pgs.
"Japanese Application Serial No. 2015539863, Response filed Mar. 8, 2017 to Office Action dated Feb. 7, 2017", w/English Claims, 16 pgs.
"Korean Application Serial No. 10-2014-7006646, Notice of Preliminary Rejection dated Oct. 19, 2017", With English Translation, 10 pgs.
"Korean Application Serial No. 10-2014-7006646, Response filed Dec. 19, 2017 to Notice of Preliminary Rejection dated Oct. 19, 2017", w/English Claims, 31 pgs.
"Korean Application Serial No. 10-2015-7013333, Notice of Preliminary Rejection dated Dec. 31, 2019", W/English Translation, 8 pgs.
"Taiwanese Application Serial No. 102138824, Office Action dated Nov. 28, 2016", w/English Translation, 7 pgs.
"Taiwanese Application Serial No. 102138824, Response filed Mar. 1, 2017 to Office Action dated Nov. 28, 2016", w/English Translation, 39 pgs.
Jang, J., et al., "Vertical cell array using TCAT(Terabit Cell Array Transistor) technology for ultra high density NAND flash memory", Symposium on VLSI Technology, (2009), 192-193.
U.S. Appl. No. 17/561,656, filed Dec. 23, 2021, Apparatus and Methods Including Source Gates.

* cited by examiner

PARTIAL BLOCK MEMORY OPERATIONS

PRIORITY APPLICATION

This application is a divisional of U.S. application Ser. No. 13/564,458, filed Aug. 1, 2012, which is incorporated herein by reference in its entirety.

BACKGROUND

A memory block of a memory device, such as a NAND memory, may comprise a group of strings of charge storage devices that share the same set of access lines. The memory block may be grouped into a plurality of pages, and each page may comprise all or a subset of the charge storage devices corresponding to a respective tier of each of the group of strings, for example, depending on whether the charge storage devices are single-level cells or multi-level cells.

Under existing semiconductor memory techniques, a memory operation may be performed on an entire memory block (e.g., if the memory operation is an erase), or on a page within the memory block (e.g., if the memory operation is a program, read or verify). Accordingly, as the page size becomes larger, the power used during a data line swing or page buffer flip may increase, so that a relatively large amount of power may be consumed when relatively small amounts of data, such as 4 KB, are read, programmed, erased or verified. This tendency may be enhanced when an ABL (all-bit line) architecture is used, in comparison with a SBL (shielded bit line) architecture. Thus, as the size of the memory block or page increases, so does the current consumption and/or parasitic current leakage when memory operations are performed.

This problem may be aggravated in three-dimensional (3D) memory devices. For example, in a 3D memory device, wiring for a plurality of control gates (CGs) or source select gates (SGSs) of the strings may be physically merged into what is hereinafter sometimes referred to as a "plate" that may comprise a plurality of horizontal CGs or SGSs, such as 16 CGs or 16 SGSs merged together. While reducing the number of high-voltage driver transistors needed to bias the CGs or SGSs (or other elements in the 3D memory device) to a certain signal (e.g., voltage), this also increases the number of charge storage devices in the memory block or page on which the memory operation may be performed concurrently. Thus, the memory block or page upon which the memory operation is performed may cause extensive current consumption and/or parasitic current leakage. This, in turn, may incur the need to supply the memory device with additional and/or alternative power sources to support the extensive current consumption and/or parasitic leakage.

BRIEF DESCRIPTION OF THE DRAWINGS

FIG. 17A shows a selected partial block of a selected memory block of the 3D NAND memory device FIG. 2 when performing an erase operation on a partial tier in the form of a tile, according to various embodiments.

DETAILED DESCRIPTION

The description that follows includes illustrative apparatuses (circuitry, devices, structures, systems, and the like) and methods (e.g., processes, protocols, sequences, techniques, and technologies) that embody the inventive subject matter. In the following description, for purposes of explanation, numerous specific details are set forth in order to provide an understanding of various embodiments of the inventive subject matter. It will be evident, however, to those of ordinary skill in the art, that various embodiments of the inventive subject matter may be practiced without these specific details. Further, well-known apparatuses and methods have not been shown in detail so as not to obscure the description of various embodiments.

As used herein, the term "or" may be construed in an inclusive or exclusive sense. Additionally, although various embodiments discussed below may primarily focus on multi-level cell memory devices, the embodiments are merely given for clarity of disclosure, and thus, are not limited to apparatuses in the particular form of NOT AND (NAND) or NOT OR (NOR) memory devices or even to memory devices in general. As an introduction to the subject, a few embodiments will be described briefly and generally in the following paragraphs, and then a more detailed description, with reference to the figures, will ensue.

To solve some of the problems described above, as well as others, various embodiments described herein propose breaking the memory block (electrically) into a plurality of "subsets" (sometimes referred to hereinafter as "partial blocks") thereof. Each partial block of the block may be selected (e.g., controlled) independently from other partial blocks to concurrently perform a memory operation on the charge storage devices corresponding to the selected partial block while refraining from performing the memory operation on the charge storage devices corresponding to non-selected partial blocks.

In various embodiments, for example, the apparatus described herein may comprise a plurality of strings of charge storage devices. Each of the plurality of strings may comprise a plurality of charge storage devices formed in a plurality of tiers. The apparatus may comprise a plurality of access lines shared by the plurality of strings. Each of the plurality of access lines may couple to the charge storage devices corresponding to a respective tier of the plurality of tiers. The apparatus may comprise a plurality of sub-sources associated with the plurality of strings. Each of the plurality of sub-sources may couple to a source select gate (SGS) of each string of a respective subset of a plurality of subsets of the plurality of strings, and each sub-source may be independently selectable from other sub-sources to select the strings of its respective subset independently of other strings corresponding to other subsets. Various embodiments that incorporate these mechanisms are described below in more detail.

Figure 1:
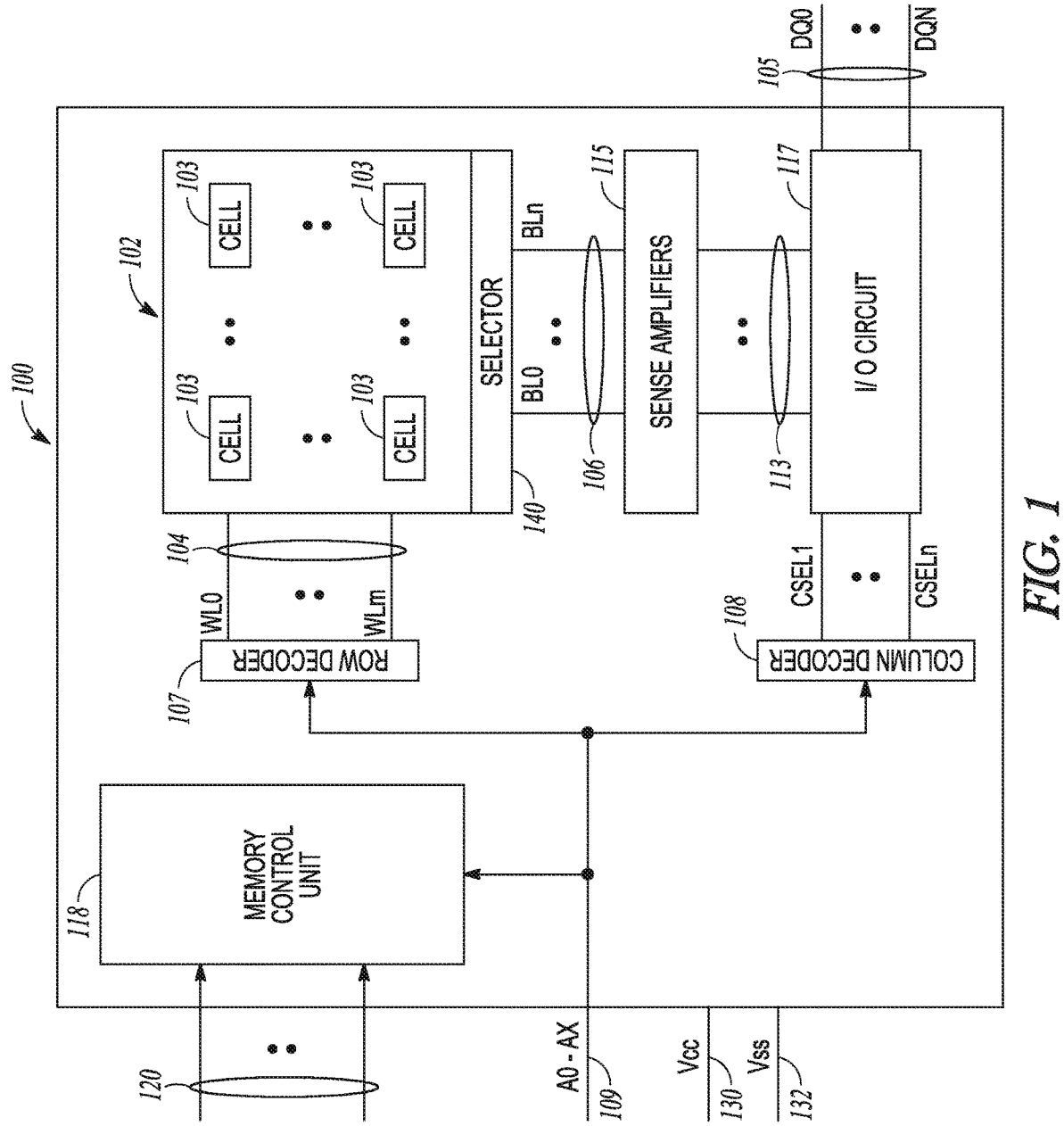
FIG. 1 shows a block diagram of a memory device having a memory array with memory cells, according to various embodiments.

FIG. 1 shows a block diagram of an apparatus in the form of a memory device 100. The memory device 100 includes a memory array 102 having a plurality of memory cells 103 according to an embodiment. The memory cells 103 can be arranged in rows and columns along with access lines 104 (e.g., word lines to conduct signals WL0 through WLm) and first data lines 106 bit lines to conduct signals BL0 through BLn). The memory device 100 can use the access lines 104 and the first data lines 106 to transfer information to and from the memory cells 103. A row decoder 107 and a column decoder 108 decode address signals A0 through AX on address lines 109 to determine which ones of the memory cells 103 are to be accessed.

Sense circuitry, such as a sense amplifier circuit 115, operates to determine the values of information read from the memory cells 103 in the form of signals on the first data lines 106. The sense amplifier circuit 115 can also use the signals on the first data lines 106 to determine the values of information to be written to the memory cells 103.

The memory device 100 is further shown to include circuitry, such as an I/O circuit 117, to transfer values of information between the memory array 102 and input/output (I/O) lines 105. Signals DQ0 through DQN on the I/O lines 105 can represent values of information read from or to be written into the memory cells 103. The I/O lines 105 can include nodes within the memory device 100 (or alternatively, pins, solder balls, or other interconnect technologies such as controlled collapse chip connection (C4), or flip chip attach (FCA)) on a package where the memory device 100 resides. Other devices external to the memory device 100 (e.g., a memory controller or a processor, not shown in FIG. 1) can communicate with the memory device 100 through the I/O lines 105, the address lines 109, or the control lines 120.

The memory device 100 can perform memory operations, such as a read operation, to read values of information from selected ones of the memory cells 103 and a programming operation (also referred to as a write operation) to program (e.g., to write) information into selected ones of the memory cells 103. The memory device 100 can also perform a memory erase operation to clear information from some or all of the memory cells 103.

A memory control unit 118 controls memory operations to be performed on the memory cells 103 based on signals on the electrical state of signals on the control lines 120. Examples of the signals on the control lines 120 can include one or more clock signals and other signals to indicate which operation (e.g., a programming or read operation) the memory device 100 can or should perform. Other devices external to the memory device 100 (e.g., a processor or a memory controller) can control the values of the control signals on the control lines 120. Specific combinations of values of the signals on the control lines 120 can produce a command (e.g., a programming or read command) that can cause the memory device 100 to perform a corresponding memory operation (e.g., a program, read, or erase operation).

Although various embodiments discussed herein use examples relating to a single-bit memory storage concept for ease in understanding, the inventive subject matter can be applied to numerous multiple-bit schemes as well. For example, each of the memory cells 103 can be programmed to a different one of at least two data states to represent, for example, a value of a fractional bit, the value of a single bit or the value of multiple bits such as two, three, four, or more numbers of bits.

For example, each of the memory cells 103 can be programmed to one of two data states to represent a binary value of "0" or "1" in a single bit. Such a cell is sometimes called a single-level cell (SLC).

In another example, each of the memory cells 103 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to one of more than two data states is sometimes referred to as a multi-level cell (MLC). Various operations on these types of cells are discussed in more detail below.

The memory device 100 can receive a supply voltage, including supply voltage signals Vcc and Vss, on a first supply line 130 and a second supply, line 132, respectively. Supply voltage signal Vss may, for example, be at a ground potential having a value of approximately zero volts). Supply voltage signal Vcc can include an external voltage supplied to the memory device 100 from an external power source such as a battery or alternating-current to direct-current (AC-DC) converter circuitry (not shown in FIG. 1).

The memory device 100 is further shown to include a select circuit 140 and an input/output (I/O) circuit 117. The select circuit 140 can respond, via the I/O circuit 117, to signals CSEL1 through CSELn to select signals on the first data lines 106 and the second data lines 113 that can represent the values of information to be read from or to be programmed into the memory cells 103. The column decoder 108 can selectively activate the CSEL1 through CSELn signals based on the A0 through AX address signals on the address lines 109. The select circuit 140 can select the signals on the first data lines 106 and the second data lines 113 to provide communication between the memory array 102 and the I/O circuit 117 during read and programming operations.

The memory device 100 may comprise a non-volatile memory device and the memory cells 103 can include non-volatile memory cells such that the memory cells 103 can retain information stored therein when power (e.g., Vcc 130, Vss 132, or both) is disconnected from the memory device 100.

Each of the memory cells 103 can include a memory element having material, at least a portion of which can be programmed to a desired data state (e.g., by storing a corresponding amount of charge on a charge storage structure, such as a floating gate or charge trap, or by being programmed to a corresponding resistance value). Different data states can thus represent different values of information programmed into each of the memory cells 103.

The memory device 100 can perform a programming operation when it receives (e.g., from an external processor or a memory controller) a programming command and a value of information to be programmed into one or more selected ones of the memory cells 103. Based on the value of the information, the memory device 100 can program the selected memory cells to appropriate data states to represent the values of the information to be stored therein.

One of ordinary skill in the art may recognize that the memory device 100 may include other components, at least some of which are discussed herein. However, several of these components are not necessarily shown in the figure, so as not to obscure the various embodiments described. The memory device 100 may include devices and memory cells, and operate using memory operations (e.g., programming and erase operations) similar to or identical to those described below with reference to various other figures and embodiments discussed herein.

Figure 2:
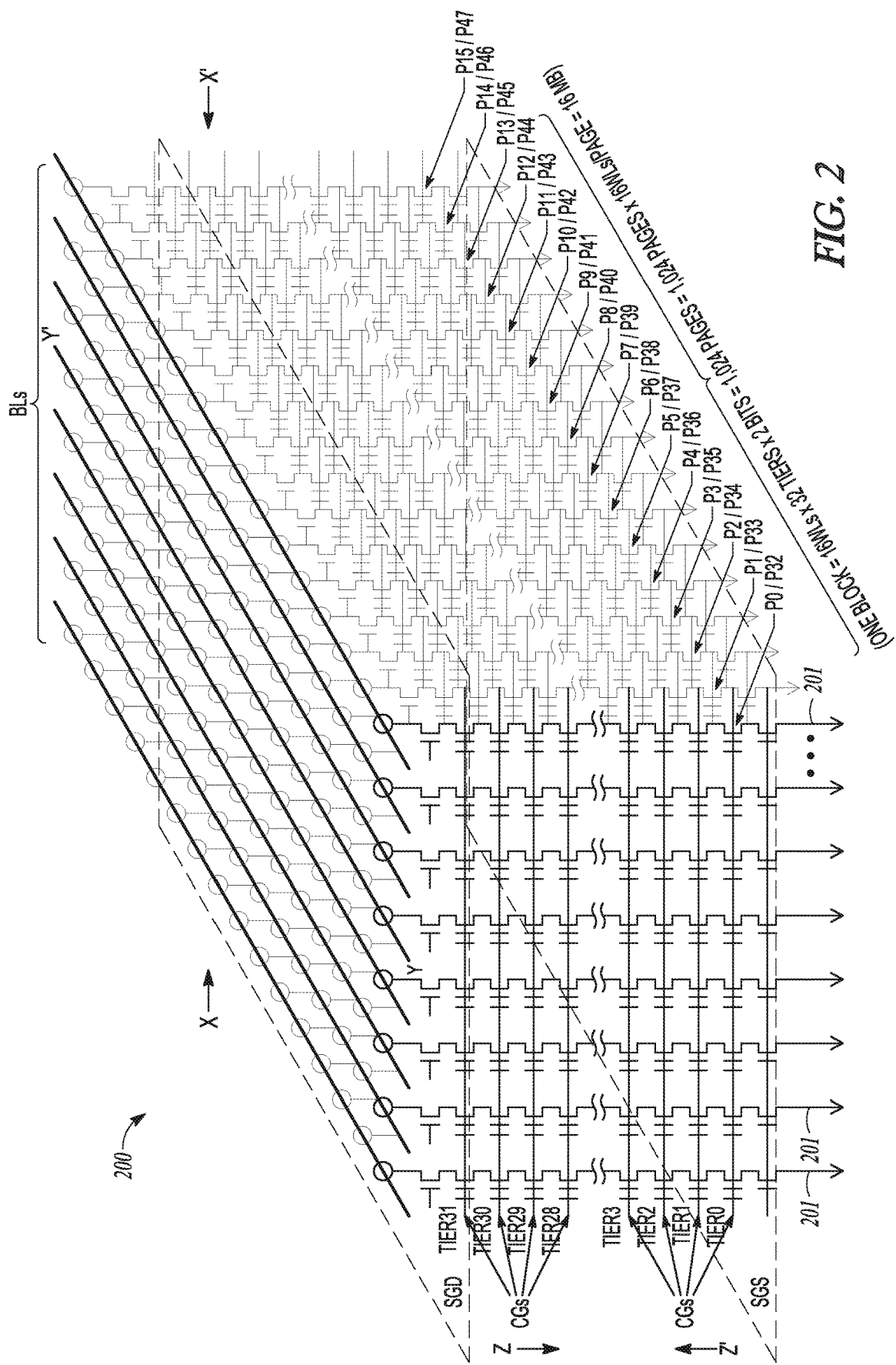
FIG. 2 shows a schematic diagram of the memory array of FIG. 1 in the form of a 3D NAND memory device, according to various embodiments.

FIG. 2 shows a block diagram of a memory array (e.g., the memory array 102) in the form of a 3D NAND memory device 200, according to various embodiments. Referring to FIG. 2, the 3D NAND memory device 200 may comprise a plurality of strings of charge storage devices. In various embodiments, in a first (e.g., Z-Z') direction, each string of charge storage devices may comprise, for example, thirty two charge storage devices stacked over one another with each charge storage device corresponding to one of, for example, thirty two tiers (e.g., Tier0-Tier31). The charge storage devices of a respective string may share a common channel region, such as one formed in a respective pillar of semiconductor material (e.g., polysilicon) about which the string of charge storage devices are formed.

In various embodiments, in a second (e.g., X-X') direction, each first group of, for example, sixteen first groups of the plurality of strings may comprise, for example, eight strings sharing a plurality (e.g., thirty two) of access lines (WLs). Each of the plurality of access lines (hereinafter used interchangeably with "global control gate (CG) lines") may couple (e.g., electrically or otherwise operably connect) the charge storage devices corresponding to a respective tier of the plurality of tiers of each string of a corresponding one of the first groups. The charge storage devices coupled by the same access line (and thus corresponding to the same tier) may be logically grouped into, for example, two pages, such as P0/P32, P1/P33, P2/P34 and so on, when each charge storage device comprise a multi-level cell capable of storing two bits of information.

In various embodiments, in a third (e.g., Y-r) direction, each second group of, for example, eight second groups of the plurality of strings may comprise sixteen strings coupled by a corresponding one of eight data lines (BLs). In one embodiment, due to a CG driver layout limitation, for example, the CGs of the (e.g., sixteen) charge storage devices corresponding to a respective tier of the (e.g., sixteen) strings of each second group of strings may be physically coupled by a respective plate. Similarly, SGSs of the (e.g., sixteen) strings of each second group of strings may be physically coupled by a single plate. In such a scenario, for example, the size of a memory block may comprise 1,024 pages and total about 16 MB (e.g., 16 WLs×32 Tiers×2 bits=1,024 pages/block, block size=1,024 pages×16 KB/page=16 MB). As is known to a person of ordinary skill in the art, the number of the strings, tiers, access lines, data lines, first groups, second groups and/or pages may be greater or smaller than those shown in FIG. 2. More detailed explanations of the 3D NAND memory device 200 are provided below with respect to FIGS. 3-40.

Figure 3:
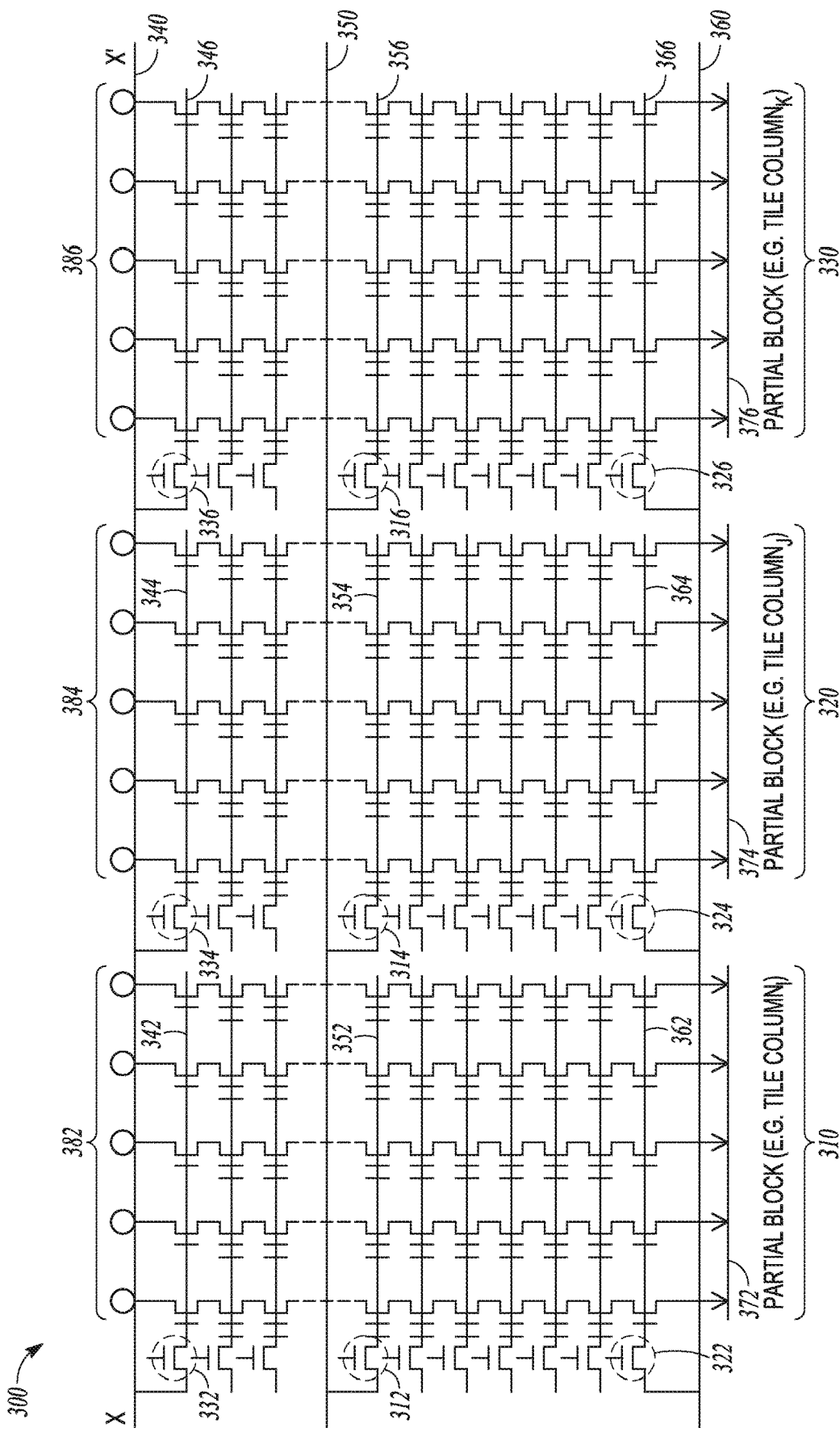
FIG. 3 shows a cross sectional view of the 3D NAND memory device of FIG. 2 in an X-X' direction, according to various embodiments.

FIG. 3 shows a cross sectional view of a memory block 300 of the 3D NAND memory device 200 of FIG. 2 in an X-X' direction, but in this embodiment including fifteen strings of charge storage device in one of the, for example, sixteen first groups of strings described with respect to FIG. 2. The plurality of strings of the memory block 300 may be grouped into a plurality (e.g., three) of subsets 310, 320, 330 (e.g., tile columns), such as tile column$_i$, tile column$_j$ and tile column$_k$, with each subset (e.g., tile column) comprising a "partial block" of the memory block 300. A global SGD line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332-336 may concurrently couple or cut off the SGDs of the strings of a corresponding partial block (e.g., tile column) independently of those of other partial blocks, for example, when the corresponding partial block should be isolated from the other partial blocks.

Similarly, a global SOS line 360 may be coupled to the SOSs of the plurality of strings. For example, the global SGS line 360 may be coupled to a plurality (e.g., three) of sub-SOS lines 362, 364, 366 with each sub-SOS line corresponding to the respective subset (e.g., tile column), via a corresponding one of a plurality (e.g., three) of sub-SOS drivers 322, 324, 326. Each of the sub-SOS drivers 322-326 may concurrently couple or cut off the SGSs of the strings of a corresponding partial block (e.g., tile column) independently of those of other partial blocks, for example, to electrically isolate the corresponding partial block from other partial blocks.

In various embodiments, as shown in FIG. 2, for a respective tier of the plurality of tiers of the strings of the memory block 300, a global access line (e.g., a global CG line) 350 may couple the charge storage devices corresponding to the respective tier of each of the plurality of strings. Each global CG line (e.g., the global CG line 350) may be coupled to a plurality (e.g., three) of sub-access lines (e.g., sub-CG lines) 352, 354, 356 via a corresponding one of a plurality (e.g., three) of sub-string drivers 312, 314 and 316. Each of the sub-string drivers may concurrently couple or cut off the charge storage devices corresponding to the respective partial block and/or tier independently of those of other partial blocks and/or other tiers, for example, to isolate the corresponding partial block and/or tier from other partial blocks and/or tiers. The charge storage devices corresponding to the respective subset (e.g., partial block) and the respective tier may comprise a "partial tier" (e.g., a single "tile") of charge storage devices. In various embodiments, a memory operation may be performed on a partial block (e.g., tile column) and/or a partial tier (e.g., single tile).

In various embodiments, each of the sub-string drivers 312-316 may comprise a voltage transistor to support a voltage range, for example, up to about 20V, and its channel length may be about 2 μm while that of a memory cell (e.g., a charge storage device) may be about 20 nm. In various embodiments, the sub-string drivers 312-316 may be located in row decoders, and the row decoders may be placed under a memory array (e.g., the memory array 102) using, for example, CMOS Under Array (CUA) technologies. This allows reducing the area needed for the circuits.

The strings corresponding to the respective subset (e.g., partial block) may be coupled to a corresponding one of sub-sources 372, 374 and 376 (e.g., "tile source") with each sub-source being coupled to a respective power source, such as a sub-source driver (not shown). In various embodiments, a partial block source decoder (e.g., tile column source decoder) and/or a partial block drain decoder (e.g., tile column drain decoder) may be used to receive a column address (e.g., an address for a string) from, for example, an external processor, and to select a sub-source (e.g., tile source) or a sub-SGD line of a partial block using the column address. Each of the sub-source drivers may concurrently couple or cut off the sources of the strings of a corresponding partial block independently of those of other partial blocks when the corresponding partial block should be isolated from the other partial blocks.

Figure 4:
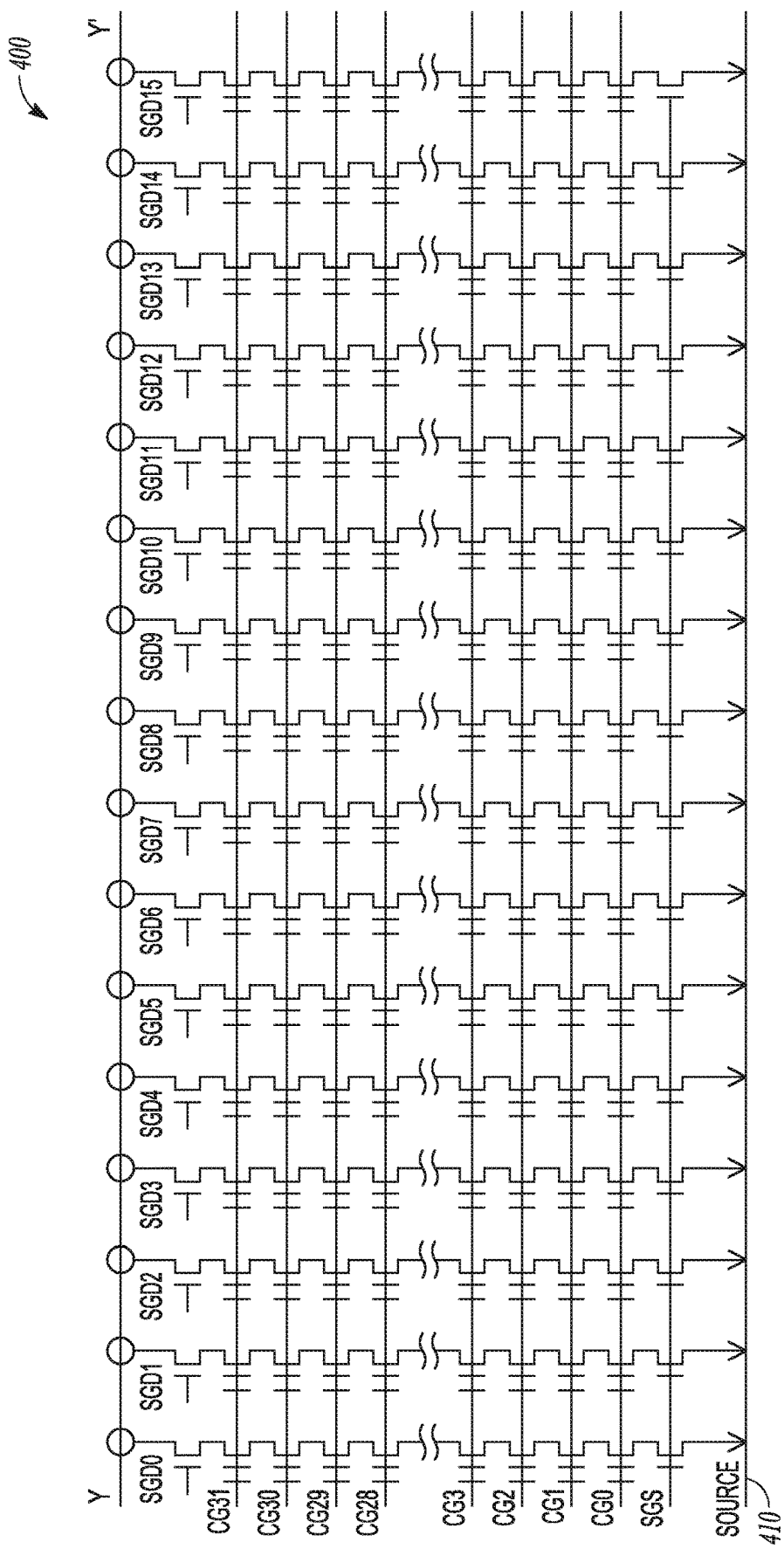
FIG. 4 shows a cross sectional view of the 3D NAND memory device of FIG. 2 in a Y-Y' direction, according to various embodiments.

FIG. 4 shows a cross sectional view of a memory block 400 of the 3D NAND memory device 200 of FIG. 2 in a Y-Y' direction, according to various embodiments. Referring to FIG. 4, the memory block 400 may comprise a plurality (e.g., sixteen) of strings of charge storage devices that are coupled to the same data line (shown as the line YY'), and correspond to one of the, for example, eight second groups of strings described with respect to FIG. 2. As noted with respect to FIG. 2, in various embodiments, each charge storage device of a respective tier may be coupled to the same plate (e.g., one of plates CG0-CG31). Similarly, the (e.g., sixteen) SGSs of the plurality strings may be coupled to a same SGS plate. In various embodiments, each of the SGDs (e.g., SCUD0-SGD15) of the plurality of strings may be separated from one another. In various embodiments, the plurality of strings may be coupled to a (shared) source 410.

Figure 5:
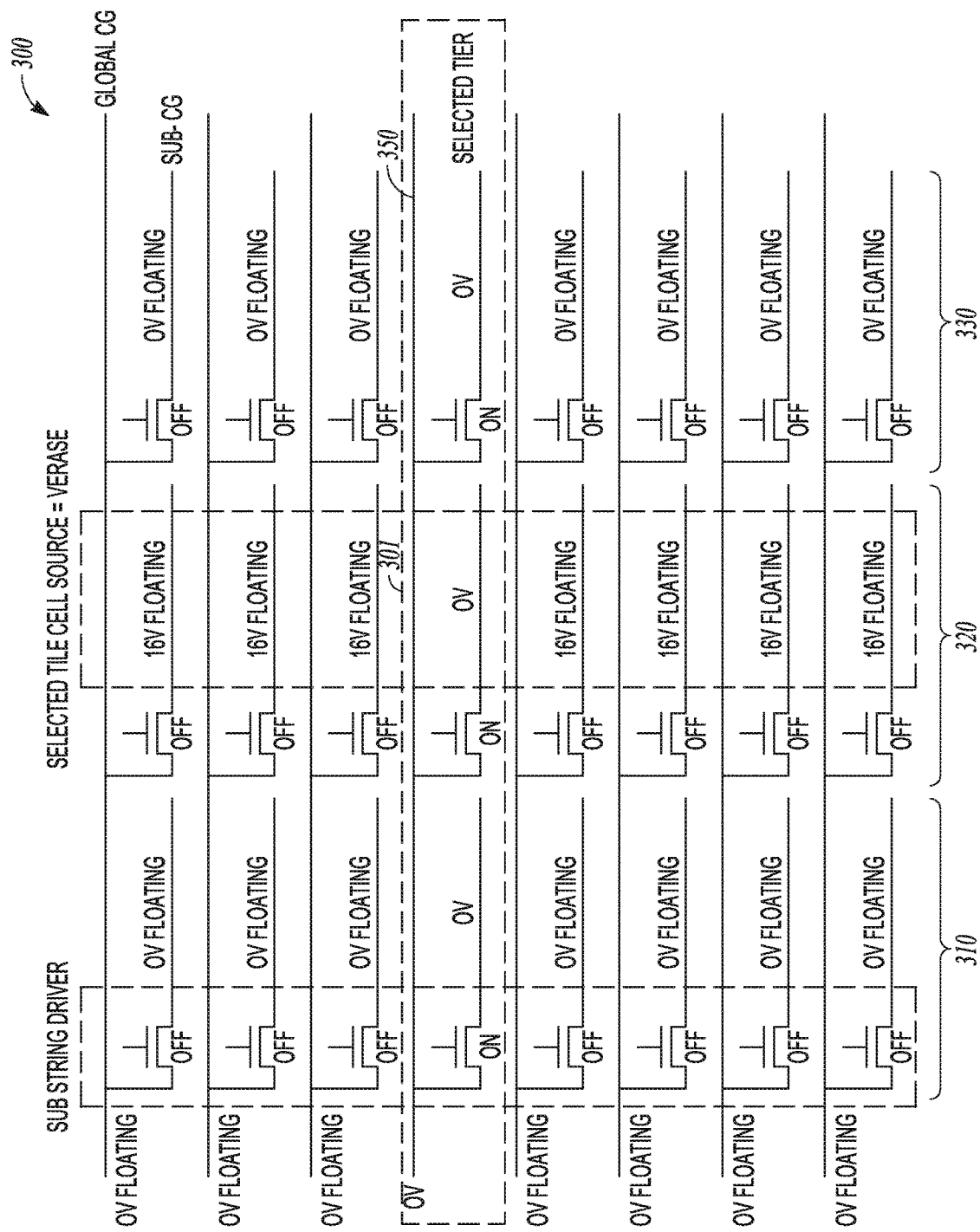
FIG. 5 shows a selected memory block of the 3D NAND memory device of FIG. 2 in the X-X' direction when performing a memory operation, according to various embodiments.

FIG. 5 shows a selected memory block (e.g., the memory block 300) of the 3D NAND memory device of FIG. 2 when performing a memory operation, according to various embodiments. It is noted that although various embodiments herein are described in a particular order with respect to operations, such as selecting (e.g., coupling, cutting off, decoding, etc.) relevant components of the 3D NAND memory device 200, such as the sub-sources 372-376, data lines 382-386, sub-SGD lines 342-346, sub-CG lines 352-356 and/or sub-SGS lines 362-366, these particular orders are used for ease of explanation, and clarity. Different orders of selecting and other operations related to various components may be used.

Referring to FIG. 5, in various embodiments, each partial block of the partial blocks 310-330 of the (selected) memory block 300 may be independently selected from other partial blocks, for example, by applying different control signals (e.g., voltages) to corresponding portions of the partial blocks, such as sub-sources or sub-SGD lines. In various embodiments, "applying" a control signal (e.g., a control voltage) may comprise active biasing (e.g., driving with a driver) or passive biasing (e.g., pulling a signal up or down through capacitive coupling) or a combination thereof. For example, in various embodiments, for an erase operation, the partial block 320 may be selected by applying the voltage "Verase" to the sub-source corresponding to the partial block 320 (e.g., sub-source 374) and the voltage "Verase_inhibit" to the sub-sources corresponding to the partial blocks 310 and 330 (e.g., sub-sources 372 and 376). When the partial block (e.g., partial block 320) is selected, the memory operation (e.g., the erase operation) may be performed only on the charge storage devices of the strings corresponding to the selected partial block while refraining from performing the memory operation on the charge storage devices corresponding to the other partial blocks.

Figure 6:
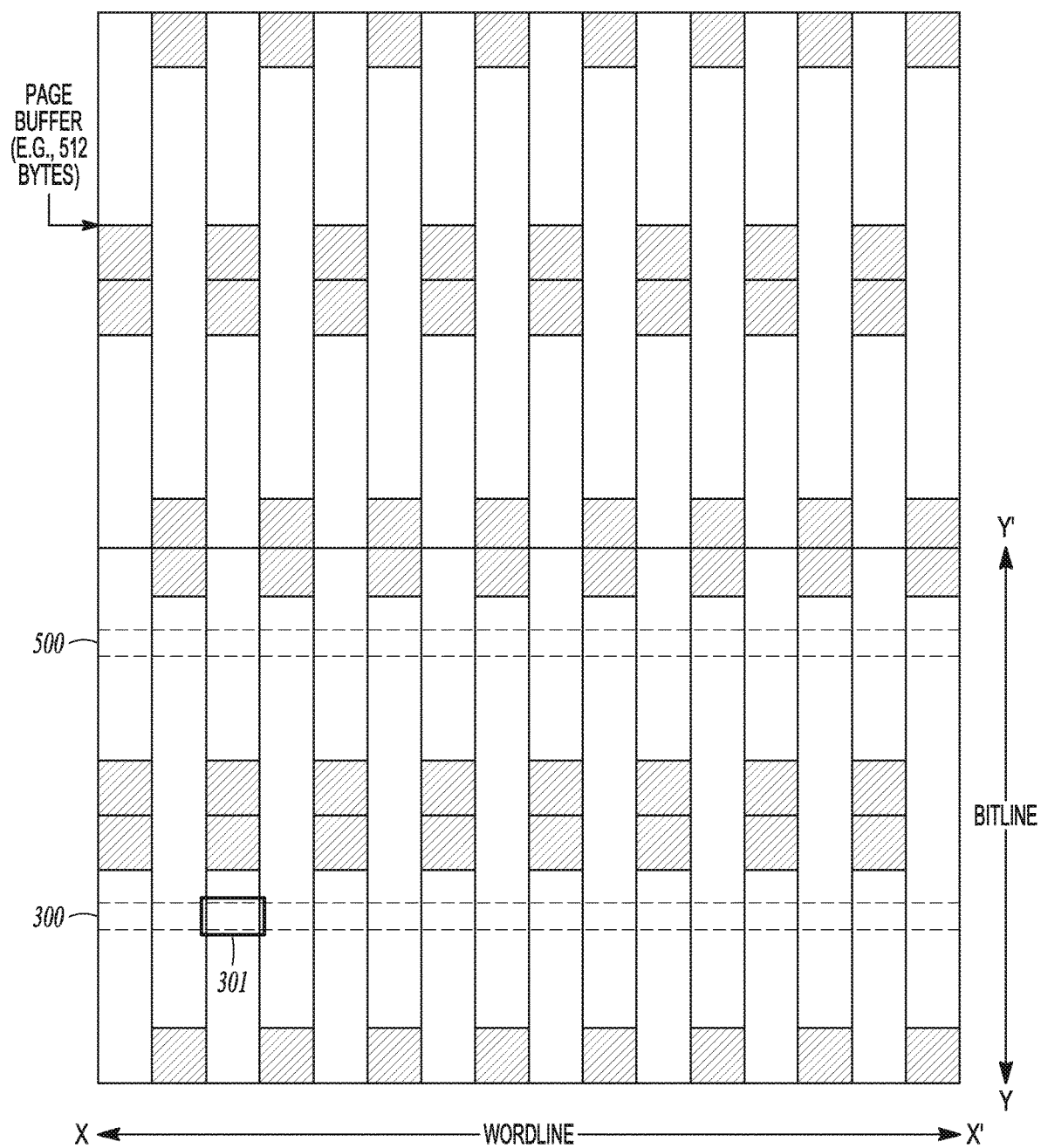
FIG. 6 shows a top view of the 3D NAND memory device of FIG. 2 when performing a memory operation on a partial block and/or partial tile in the form of a tile column and/or tile, respectively, according to various embodiments.

To continue the example shown in FIG. 5, once the partial block 320 is selected, a tier may be further selected from the plurality of tiers to select a partial tier 301 (e.g., single tile or sector) of charge storage devices. For example, in one embodiment, a first control signal (e.g., about 0V) may be applied to the global CG line 350 corresponding to the selected tier while a second control signal (e.g., about 0V floating) may be applied to other global CG-lines corresponding to non-selected tiers. In other embodiments, a target partial tier (e.g., the partial tier 301) may be selected by first selecting a tier (e.g., tier represented by the global CG line 350) and then selecting a partial block (e.g., the partial block 320). The memory operation may be performed only on the charge storage devices of the partial tier 301 corresponding to the (selected) tier associated with the global CG line 350, and the (selected) partial block 320. A top view of the 3D NAND memory device 200, including the (selected) memory block 300 and a (unselected) memory block 500, during such a memory operation (e.g., the erase) by partial block and/or partial tier, is shown in FIG. 6.

In various embodiments, referring to FIGS. 2-6, each subset (e.g., partial block) of the subsets of strings may comprise a "sector column." In such a scenario, the charge storage devices of the partial tier corresponding to the respective subset of strings and the respective tier of tiers may comprise a single "sector" of charge storage devices. Deployment of the tile structure and/or the sector structure for partial blocks of the 3D NAND memory device 200 may depend on, for example, a page address mapping scheme employed by the 3D NAND memory device 200.

Figure 7:
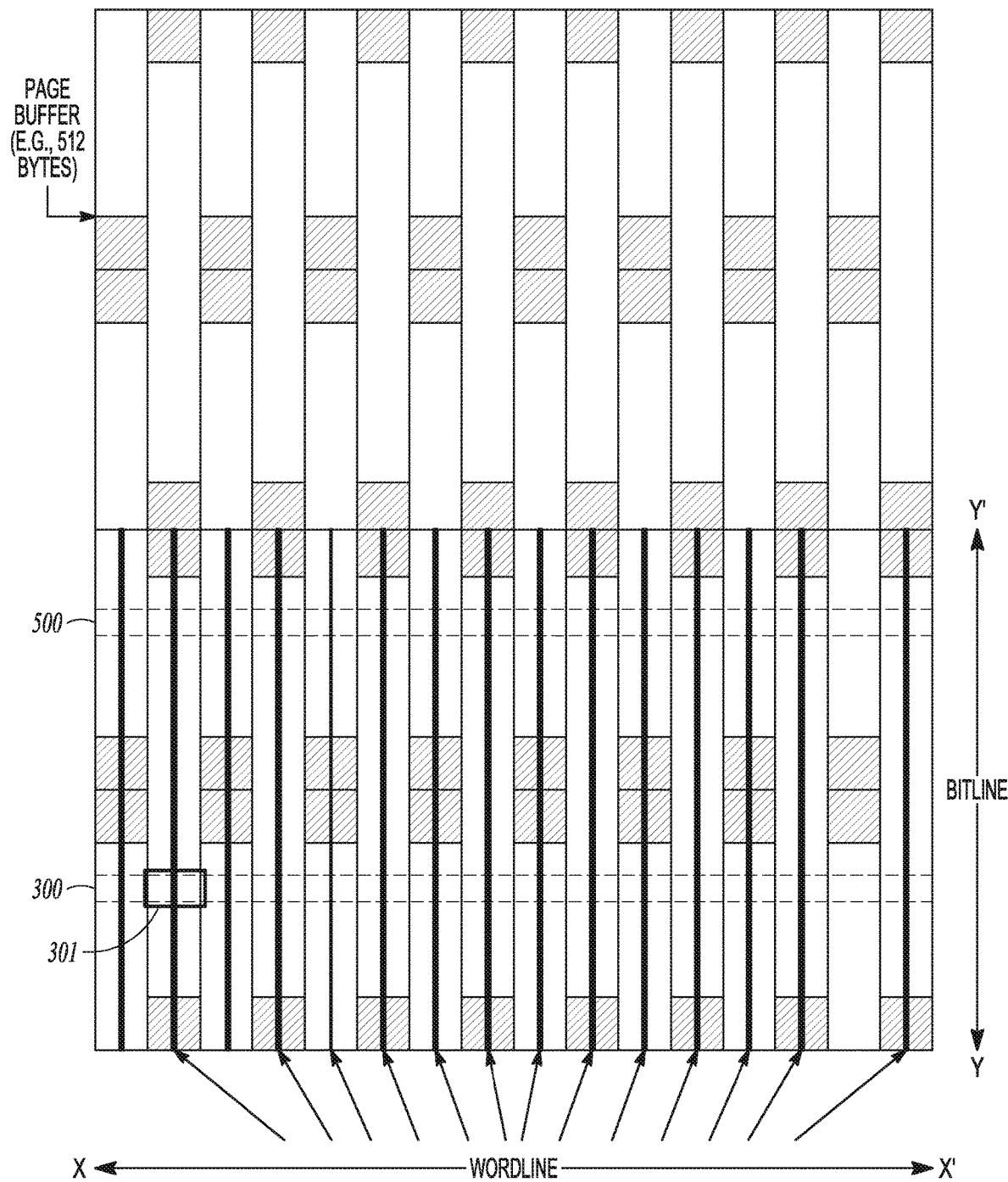
FIG. 7 shows a top view of the 3D NAND memory device of FIG. 2 when performing a memory operation on a partial block and/or partial tier in the form of a sector column and/or sector, according to various embodiments.

In various embodiments, in the case of an intensive address mapping where memory addresses are mapped tile by tile in order, a physical block of the tile column (and tiles thereof) may be used as the subset of strings. This may facilitate separating operations between different states (e.g., active and inactive states) tile by tile, for example, by selecting the tile source and using the sub decoder circuits (e.g., the sub-string drivers), as shown in FIG. 5. When a scattered address mapping is employed, as shown in FIG. 7, for example, to improve the I/O speed by using a smaller number of pre-sense amplifiers, a logical block of the sector column (and sectors thereof) may be used. Each sector column (and sectors thereof) may comprise a set of fractions of one or more (contiguous or non-contiguous) physical blocks of tile columns (and tiles thereof), and the configuration of the logical block of the sector column (and sectors thereof) may be changeable easily based on the address mapping. It is noted that the memory block architecture in FIG. 5 may be applicable for both the intensive address mapping scheme (e.g., as shown in FIG. 6), and the scattered address mapping (e.g., as shown in FIG. 7).

For example, in the case of scattered page address mapping, when a page of a memory block comprises sixteen tiles with each tile being about 1 KB, one sector may comprise sixteen fractions of the sixteen tiles with each fraction being, for example, one fourth of a corresponding tile. Then, the sector size may be about 16×128B×2 (left/right buffers)=4 KB. If the tile is split into smaller fractions, for instance, with each fraction being about 64B, then the sector size may be about 16×64B×2 (left/right buffers)=2 KB. In such a scenario where the sector comprises a set of fractions of tiles, the memory operation an erase operation) by partial block may be concurrently performed in a plurality of partial blocks (e.g., tile columns).

For example, in various embodiments, as shown in FIG. 7, a sector column comprising sixteen fractions of sixteen partial blocks 301 (e.g., tile columns) may be selected, and then a memory operation may be concurrently performed only on the selected sector column. In various embodiments, a (target) tier may be further selected from the sector columns, such as the set of sixteen selected fractions of the tile columns. Then, the memory operation may be performed only on the selected (target) tier of the set of, for example, sixteen selected fractions of the tile columns. In such a case, in various embodiments, global CG lines may be used instead of sub-CG lines to select the set of, for example, sixteen fractions of the tile columns. This may obviate the need for the sub-CG lines and/or the sub-string drivers associated therewith.

In the case of an intensive page address mapping, the tile size may be the same as the sector size. Alternatively, one sector may still comprise 4 KB corresponding to several (e.g., four) tiles. Thus, various embodiments allow performing memory operations by partial block (e.g., tile column or sector column), and/or by partial tier (e.g., single tile or sector) instead of performing the memory operations by the traditional operational units, such as a block (e.g., 16 MB) or a page (e.g., 16 KB), without substantially increasing a die size. Yet, various embodiments may be implemented with respect to the page address mapping schemes and the structure and/or size of the partial block (e.g., tile column or sector column) and/or partial tier (e.g., tile or sector). More detailed explanations of performing memory operations by the partial block and/or partial tier in the form of the tile column or sector column and/or tile or sector are provided below with respect to FIGS. 8-40.

Figure 8:
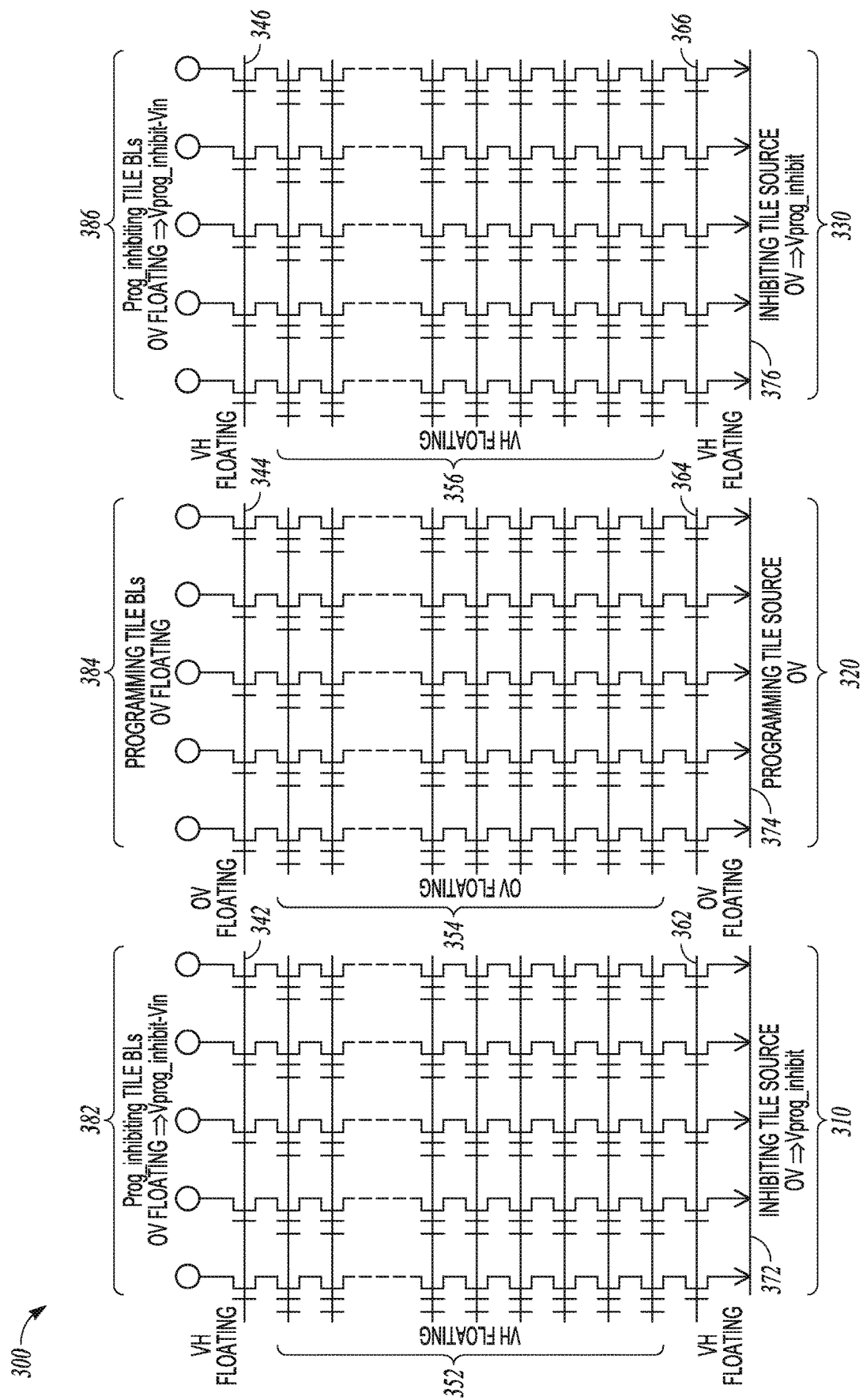
FIG. 8 shows a selected memory block of the 3D NAND memory device of FIG. 2 during a first phase of performing a program operation on a partial block in the form of a tile column, according to various embodiments.
Figure 9:
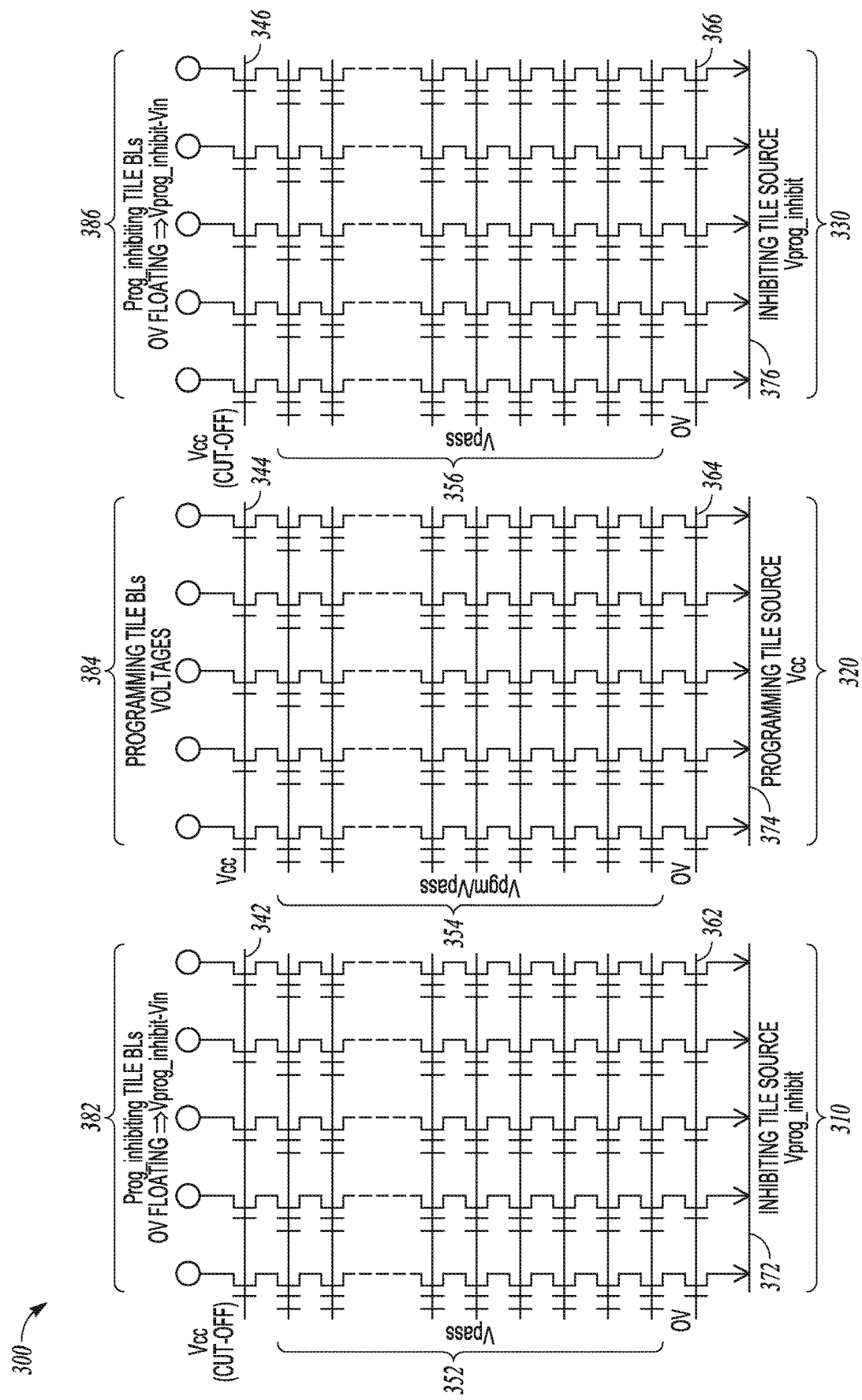
FIG. 9 shows the selected memory block of the 3D NAND memory device of FIG. 2 during a second phase of performing a program operation on a partial block in the form of a tile column, according to various embodiments.
Figure 10:
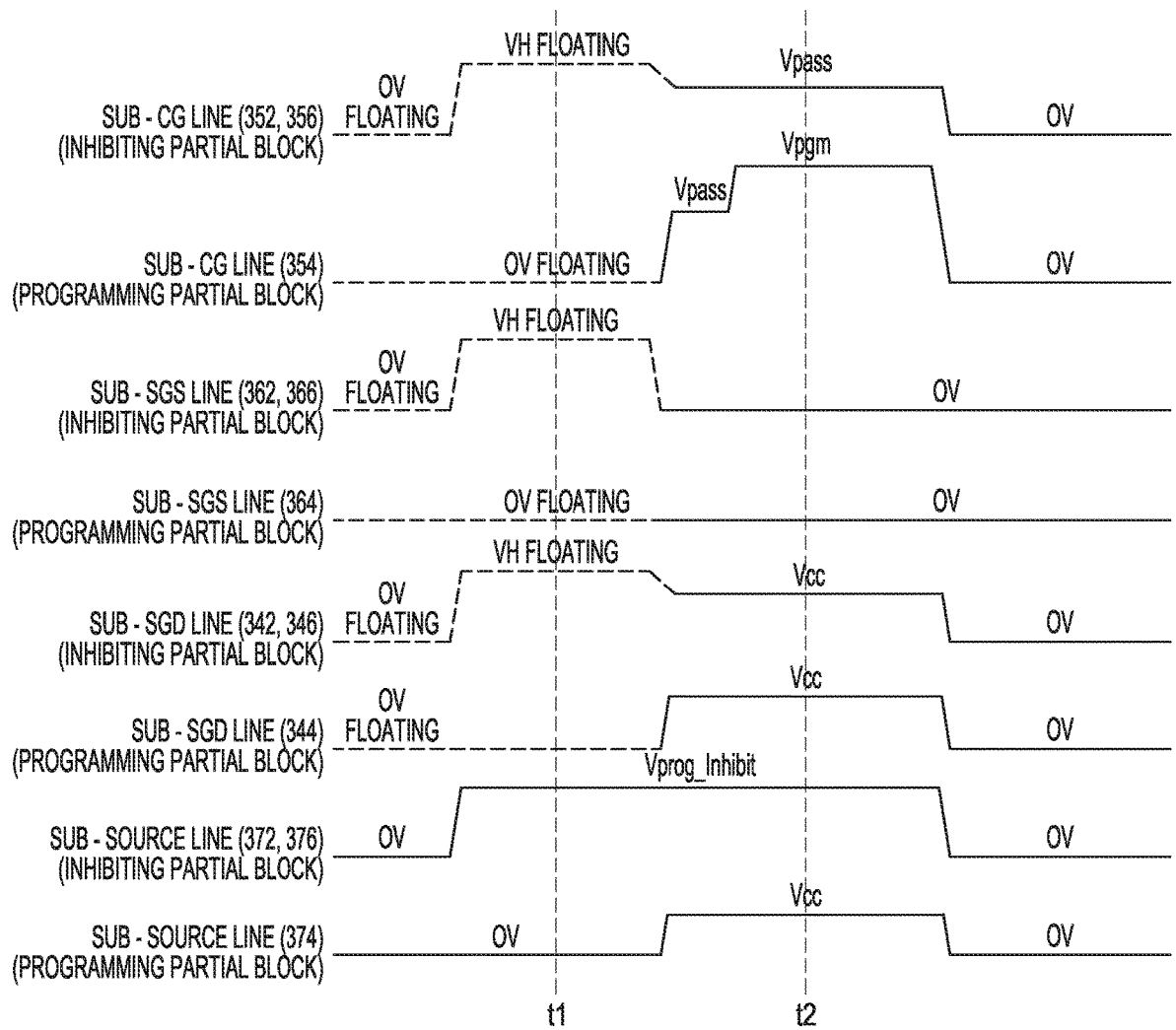
FIG. 10 shows waveforms of control signals applied to the selected memory block of the 3D NAND memory device of FIG. 2 during the first and second phases of performing a program operation on a partial block in the form of a tile column, according to various embodiments.

FIG. 8 shows a selected memory block (e.g., the memory block 300) of the 3D NAND memory device of FIG. 2 during a first phase ('t1') of performing a program operation on a partial block in the form of a tile column, according to various embodiments. FIG. 9 shows the selected memory block of the 3D NAND memory device of FIG. 2 during a second phase ('t2') of performing a program operation on a partial block in the form of a tile column, according to various embodiments. FIG. 10 shows waveforms of control signals applied to the selected memory block of the 3D NAND memory device of FIG. 2 during the first (t1) and second (t2) phases of performing the program operation on a partial block in the form of a tile column, according to various embodiments.

Referring to FIGS. 8 and 10, during the first phase (t1) of the program operation on a partial block, all of the sub-CG lines, data lines (BLs), sub-SGD lines, sub-SGS lines and sub-sources may be initially set to a floating voltage (e.g., about 0V floating). In one embodiment, the floating voltage (e.g., about 0V floating) may be changed later by capacitive coupling.

In various embodiments, to select the partial block 320 (e.g., tile column) as a target partial block to be programmed, the sub-source 374 corresponding to the partial block 320 may be biased to a programming enable voltage, such as about 0V. The sub-sources 372 and 376 corresponding to the partial blocks 310 or 330 may be biased to a programming inhibit voltage, such as the voltage "Vprog_inhibit."

The data lines 384 corresponding to the (selected) partial block 320 remain at the initial floating voltage (e.g., 0V floating). The data lines 382 and 386 corresponding to the (unselected) partial blocks 310 or 330 may be biased to the voltage "Vprog_inhibit−Vin" from the initial floating voltage (e.g., about 0V floating). For example, in one embodiment, the voltage Vprog_inhibit may comprise a voltage about 8V-10V, and the voltage Vin may comprise a voltage about 0.8V.

The sub-SCID line 344 corresponding to the (selected) partial block 320 may remain at the initial floating voltage (e.g., about 0V floating). The sub-SGD lines 342 and 346 corresponding to the (unselected) partial blocks 310 or 330 may be pulled up to the voltage "VH floating" from the initial floating voltage (e.g., about 0V floating).

The sub-CG lines 354 corresponding to the (selected) partial block 320 may remain at the initial floating voltage (e.g., about 0V floating). The sub-CG lines 352 and 356 corresponding to the (unselected) partial blocks 310 or 330 may be pulled up to the voltage VH floating from the initial floating voltage (e.g., about 0V floating).

The sub-SGS line 364 corresponding to the (selected) partial block 320 may remain at the initial floating voltage (e.g., about 0V floating). The sub-SGS lines 362 and 366 corresponding to the (unselected) partial blocks 310 or 330 may be pulled up to the voltage VH floating from the initial floating voltage (e.g., about 0V floating).

In various embodiments, for example, when the sub-sources 372 and 376 corresponding to the (unselected) partial blocks 310 or 330 are biased to the voltage Vprog_inhibit, GIDL (Gate Induced Drain Leakage) current may occur, and then the channel potential of the strings (e.g., in pillars of semiconductor material about which the strings are formed) of the (unselected) partial blocks 310 and 330 may be boosted. As a result, the sub-SGD lines 342 and 346, sub-CG lines 352 and 356, and sub-SOS lines 362 and 366 corresponding to the (unselected) partial blocks 310 or 330 may be boosted up to the voltage VH floating. For example, in one embodiment, the voltage VH floating may comprise a voltage equal to a multiplication of a capacitive coupling ratio (e.g., about 0.8) and the voltage Vprog_inhibit-Vin.

Referring to FIGS. 9 and 10, during the second phase (t2) of the program operation on a partial block, the sub-source 374 corresponding to the (selected) partial block 320 may be biased to the voltage "Vcc". The sub-sources 372 and 376 corresponding to the (unselected) partial blocks 372 or 376 may remain at the same voltage (e.g., Vprog_inhibit) as in the first phase (t1).

The data lines 384 corresponding to the (selected) partial block 320 may be biased to a programming voltage, such as about 0V to about 1V. In one embodiment, by applying a small positive voltage (e.g., about 1V) instead of about 0V, the speed of the programming operation may be slowed down. The data lines 382 and 386 corresponding to the (unselected) partial blocks 310 or 330 may remain at the same voltage (e.g., Vprog_inhibit−Vin) as in the first phase (a).

The sub-SGD line 384 corresponding to the (selected) partial block 320 may be biased to the voltage Vcc (e.g., about 3V). The sub-SGD lines 382 and 386 corresponding to the (unselected) partial blocks 310 or 330 may be biased to the voltage Vcc.

All sub-CG lines corresponding to the (selected) partial block 320 may be biased to the voltage "Vpass." Then, a selected sub-CG line of the sub-CG lines 354 corresponding to the (selected) partial block 320 may be biased to the voltage "Vpgm" at a time while the other sub-CG lines of the sub-CG lines 354 remain biased at the voltage Vpass. When the charge storage devices (e.g., a tile) corresponding to the selected sub-CG line are programmed, a next sub-CG line (e.g., a sub-CG line one tier higher than the selected sub-CG line) may be selected and biased to the voltage Vpgm to program the charge storage devices corresponding to the next sub-CG line. This operation may be repeated until all the charge storage devices corresponding to the (selected) partial block 320 (e.g., a tile column) are programmed.

Unlike existing 2D memory devices where page programming always starts from a source side word line (e.g., tier0) toward a data line side word line (e.g., tier31), in various embodiments, any random tier (e.g., tier5) of a plurality of tiers (e.g., tier0-tier31) may be initially chosen to select a respective sub-CG line corresponding to the (chosen) random tier (e.g., tier5) as the selected sub-CG line. Also, in various embodiments, the next sub-CG line to be programmed does not have to be one corresponding to one tier higher than the tier for the initially (selected) sub-CG line. A sub-CG line in a random direction (e.g., one tier down) may be selected as the next sub-CG line. Such random partial block progranimning is explained in detail, for example, with respect to FIG. 11.

The sub-CG lines 352 and 356 corresponding to the (unselected) partial block 310 or 330 may be biased to the voltage Vpass, and remain biased at the same voltage. Unlike the sub-CG lines 354, all the sub-CGs 352 and 356 remain at the voltage Vpass. For example, in one embodiment, the voltage Vpgm may comprise a voltage about 16V~20V, and the voltage Vpass may comprise a voltage about a half of the voltage Vpgm, such as about 8V~10V.

The sub-SGS line 364 corresponding to the (selected) partial block 320 may be biased to about 0V. The sub-SGS lines 362 and 366 corresponding to the (unselected) partial blocks 310 or 330 may be biased to about 0V.

Figure 11:
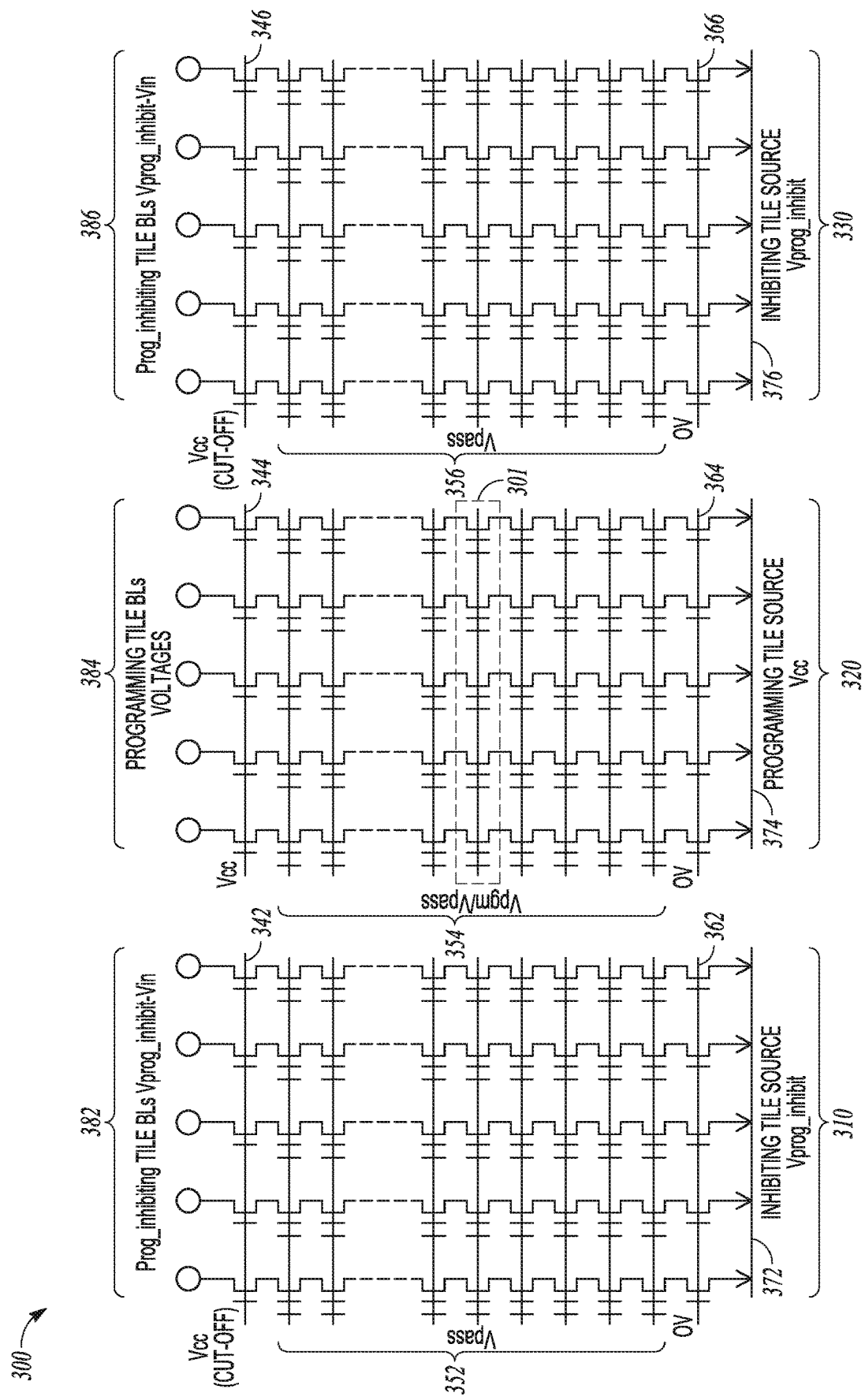
FIG. 11 shows a selected memory block of the 3D NAND memory device of FIG. 2 when performing a program operation on a partial tier of a random tier in the form of a tile, according to various embodiments.

FIG. 11 shows a selected memory block (e.g., the memory block 300) of the 3D NAND memory device of FIG. 2 when performing a program operation on a partial tier in the form of a tile, according to various embodiments. As noted above with respect to FIG. 9, under conventional 2D NAND technologies, there may be back-gate bias effect so that page programming should start from a (starting) word line near the source, and then program up to a (ending) word line near the data line sequentially (e.g., one word line at each time). According to various embodiments, there may be no back-gate bias effect for the 3D NAND because a silicon pillar for each string of memory cells may be fully depleted, allowing the random page programming in which the programming does not have to start from the source side word line or move up in the direction from the source side to the data line side. Therefore, the random tier program of the partial block is available, for example, after the random tier erase, as shown in FIG. 11.

In various embodiments, for example, one tier (e.g., tier5 in FIG. 2) of the plurality (e.g., thirty two) of tiers of the selected partial block may be further selected to identify the subset of the selected partial block corresponding to the tier as a (target) partial tier (e.g., the partial tier 301). Then, a memory operation, such as a program, erase, read or verify, may be performed on the target partial tier corresponding to the selected partial block (e.g., the partial block 320) and the selected tier. During the first phase of performing a program operation on a partial tier, the same functions as in the first phase (t1) of performing the program operation on a partial block described with respect to FIGS. 6-8 may be applied.

Referring to FIG. 11, during the second phase (t2) of performing a program operation on a partial tier, for example, the sub-CG line corresponding to the (selected) partial tier 301 may be biased to the voltage Vpgm/Vpass, for example, first to the voltage Vpass, and then to the voltage Vpgm. The sub-CG lines 354 corresponding to the other (unselected) tiers of the (selected) partial block 320 may be biased to the voltage Vpass. The sub-CG lines 352 and 356 corresponding to the (unselected) partial blocks 310 or 330 and the (selected) tier may be biased to the voltage Vpass, but not to the voltage Vpgm. In various embodiments, different voltages may be used. Regarding the sub-sources 372-376, data lines 382-386, sub-SGD lines 342-346 and sub-SGS lines 362-366, for example, the same functions (e.g., control signals) as described with respect to FIGS. 8-10 may be applied.

Figure 12:
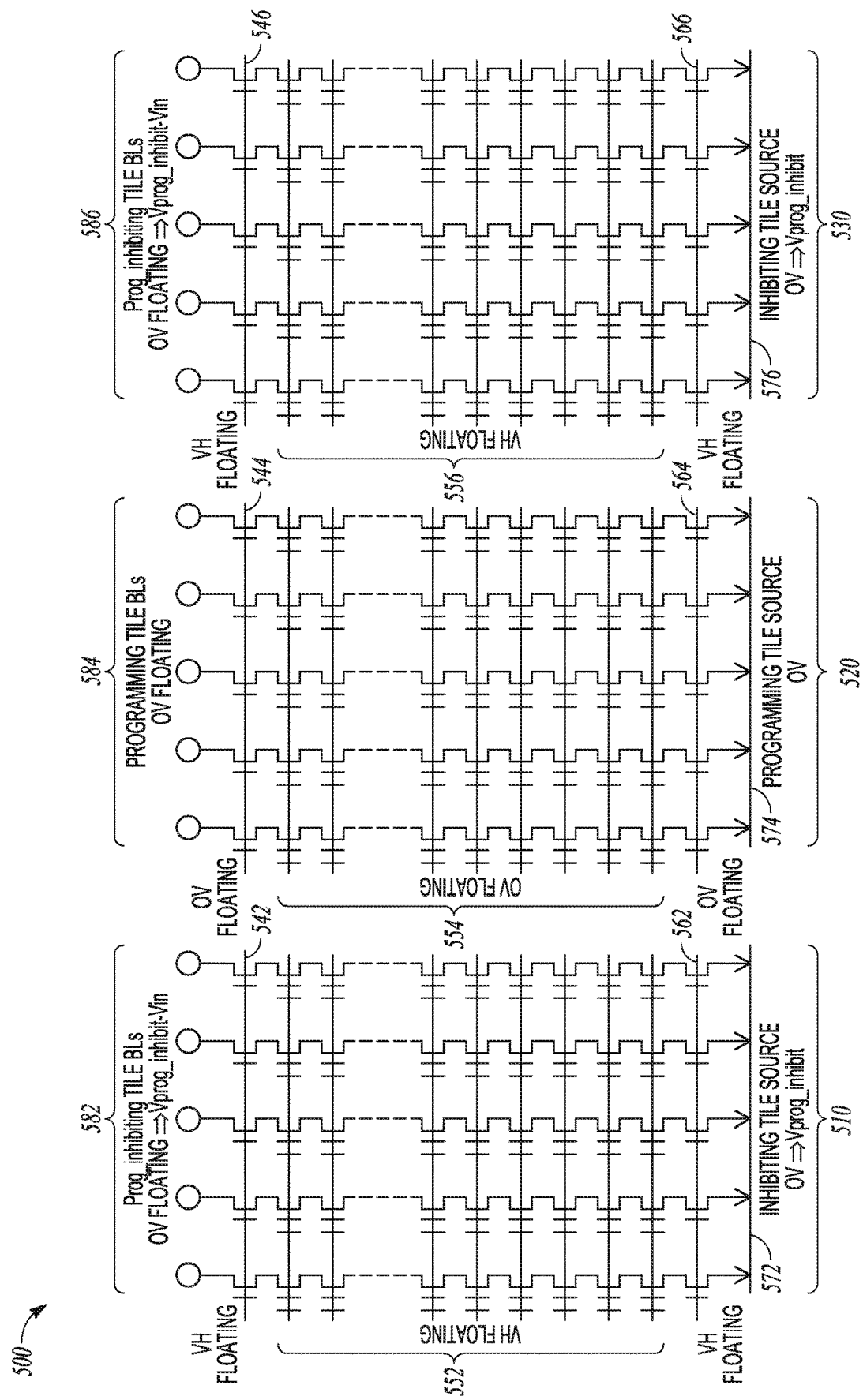
FIG. 12 shows an unselected memory block of the 3D NAND memory device of FIG. 2 during the first phase of performing a program operation on a partial block in the form of a tile column, according to various embodiments.
Figure 13:
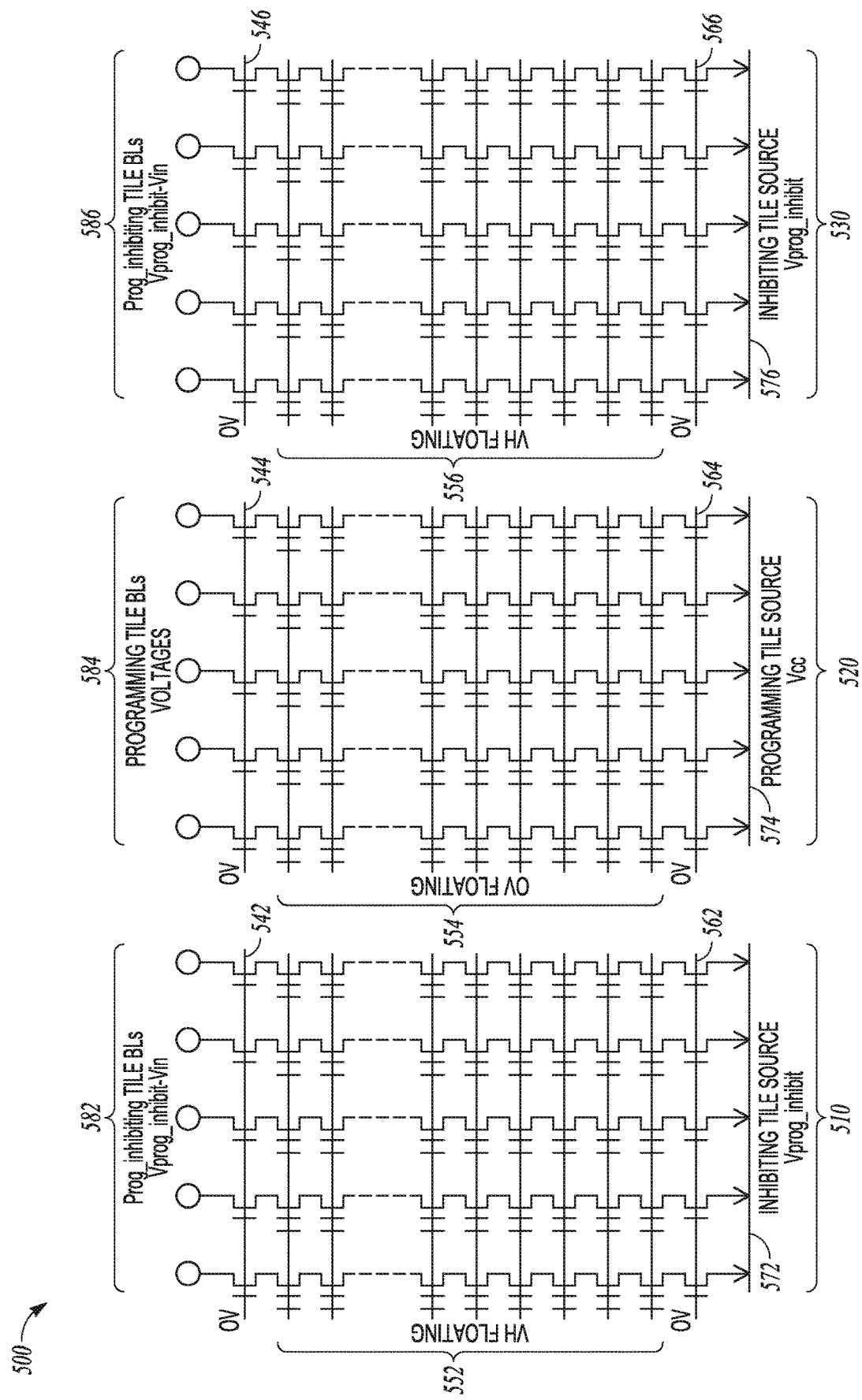
FIG. 13 shows the unselected memory block of the 3D NAND memory device of FIG. 2 during the second phase of performing a program operation on a partial block in the form of a tile column, according to various embodiments.

FIG. 12 shows an unselected memory block 500 of the 3D NAND memory device of FIG. 2 during the first phase (t1) of performing a program operation on a partial block in the form of a tile column according to various embodiments. FIG. 13 shows the unselected memory block 500 of the 3D NAND memory device of FIG. 2 during the second phase (t2) of performing a program operation on a partial block in the form of a tile column, according to various embodiments. The unselected memory block 500 may comprise a memory block parallel to the selected memory block (e.g., the memory block 300), as shown in FIGS. 6 & 7. For example, in various embodiments, referring to FIGS. 2 and 3, the unselected memory block 500 may comprise one or more first groups of the plurality (e.g., sixteen) of first groups of the strings in the second (e.g., X-X') direction that are parallel to the selected first group of the strings (e.g., the memory block 300).

Referring to FIG. 12, during the first phase (t1) of performing the program operation on a partial block, the unselected block 500 (and the partial blocks 510, 520 and 530 (e.g., tile columns) thereof) may operate the same way as the (selected) memory block 300, as described with respect to FIG. 8. For example, in various embodiments, all of the sub-CG lines 552, 554 and 556, data lines (BLs) 582, 584 and 586, sub-SGD lines 542, 544 and 546, sub-SGS lines 562, 564 and 566 and sub-sources 572, 574 and 576 may be initially set to a floating voltage (e.g., about 0V floating). In one embodiment, the floating voltage (e.g., about 0V floating) may be changed later by capacitive coupling.

In various embodiments, the sub-source 574 of the partial block 520 corresponding (e.g., parallel) to the (selected) partial block 320 may be biased to about 0V. The sub-sources 572 and 576 of the respective partial blocks 510 and 530 corresponding (e.g., parallel) to the respective (unselected) partial blocks 310 and 330 may be biased to the voltage Vprog_inhibit. Accordingly, each string of the plurality (e.g., five) of strings corresponding to the partial block 520 may be selected for the memory operation.

The data lines 584 of the partial block 520 remain at the initial floating voltage (e.g., about 0V floating). The data lines 582 and 586 of the respective partial blocks 510 or 530 may be biased to the voltage Vprog_inhibt-Vin. For example, in one embodiment, the voltage Vprog_inhibit may comprise a voltage about 8V-10V, and the voltage Vin may comprise a voltage about 0.8V. As shown in FIG. 2, in various embodiments, the data lines 582-586 may be commonly coupled to all memory blocks (e.g., the sixteen first groups of strings) of the 3D NAND memory in the X-X' direction, including the selected memory block 300 and the unselected memory block 500. Accordingly, the data lines 582-586 may operate in the same way for the selected memory block 300 and the unselected memory block 500 with respect to the respective partial blocks (e.g., tile columns) not only during the first phase (t1), as described above, but also during the second phase (t2), as described below with respect to FIG. 13.

The sub-SGD line 544 of the partial block 520 may remain at the initial floating voltage (e.g., about 0V floating). The sub-SGD lines 542 and 546 of the respective partial blocks 510 or 530 may be pulled up to the voltage VH floating from the initial floating voltage (e.g., about 0V floating).

The sub-CG lines 554 of the partial block 520 may remain at the initial floating voltage (e.g., about 0V floating). The sub-CG lines 552 and 556 of the respective partial blocks 510 and 530 may be pulled up to the voltage VH floating from the initial floating voltage (e.g., about 0V floating).

The sub-SGS line 564 of the partial block 520 may remain at the initial floating voltage (e.g., about 0V floating). The sub-SGS lines 562 and 566 of the respective partial blocks 510 and 530 may be pulled up to the voltage VH floating from the initial floating voltage (e.g., about 0V floating).

In various embodiments, for example, when the sub-sources 572 and 576 of the respective partial blocks 510 and 530 are biased to the voltage Vprog_inhibit, GIDL (Gate induced Drain Leakage) current may occur, and then the channel potential of the strings of the respective partial blocks 510 and 530 may be boosted. As a result, the sub-SCiD lines 542 and 546, sub-CG lines 552 and 556, and sub-SGS lines 562 and 566 of the respective partial blocks 510 and 530 may be boosted up to the voltage VH floating. For example, in one embodiment, the voltage VH floating may comprise a voltage equal to a multiplication of a capacitive coupling ratio (e.g., about 0.8) and the voltage Vprog_inhbt–Vin.

Referring to FIG. 13, during the second phase (t2) of performing the program operation on a partial block, the sub-source 574 of the partial block 520 may be biased to the voltage Vcc. The sub-sources 572 and 576 of the respective partial blocks 572 and 576 may remain at the same voltage (e.g., Vprog_inhibit) as in the first phase (t1).

The data lines 584 of the partial block 520 may be biased to a programming voltage, such as about 0V to about 1V, The data lines 582 and 586 of the respective partial blocks 510 and 530 may remain at the same voltage (e.g., Vprog_inhibit–Vin) as in the first phase (t1).

The sub-SGD line 584 of the partial block 520 may be biased to about 0V. The sub-SGD lines 582 and 586 of the respective partial blocks 510 and 530 may be biased to about 0V.

The sub-CG lines 554 of the partial block 520 may remain at the same voltage (e.g., about 0V floating) as in the first phase. The sub-CG lines 552 and 556 of the respective partial blocks 510 and 530 may remain at the same voltage (e.g., VH floating) as in the first phase.

The sub-SGS line 564 of the partial block 520 may be biased to about 0V. The sub-SGS lines 562 and 566 of the respective partial blocks 510 and 530 may be biased to about 0V.

As described with respect to FIGS. 9 and 13, in various embodiments, at least the following differences may exist with respect to the second phase (t2) between the unselected memory block 500 and the selected memory block 300. First, the sub-SGD lines 542-546 of the unselected memory block 500 may be biased to, for example, about 0V while the sub-SGD lines 342-346 of the selected memory block 300 may be biased to the voltage Vcc.

Also, the sub-CG lines 554 of the partial block 520 of the unselected memory block 500 may remain at the same voltage (e.g., about 0V floating) as in the first phase (t1) while the sub-CG lines 354 of the (selected) partial block 320 of the selected memory block 300 may be biased to the voltage Vpass, and then to the voltage Vpgm. Similarly, the sub-CG lines 552 and 556 of the respective partial blocks 510 and 530 of the unselected memory block 500 may remain at the same voltage (e.g., VH floating) as in the first phase (t1), for example, while the sub-CG lines 352 and 356 of the respective (unselected) partial blocks 310 and 330 of the selected memory block 300 may be biased to the voltage Vpass.

Figure 14:
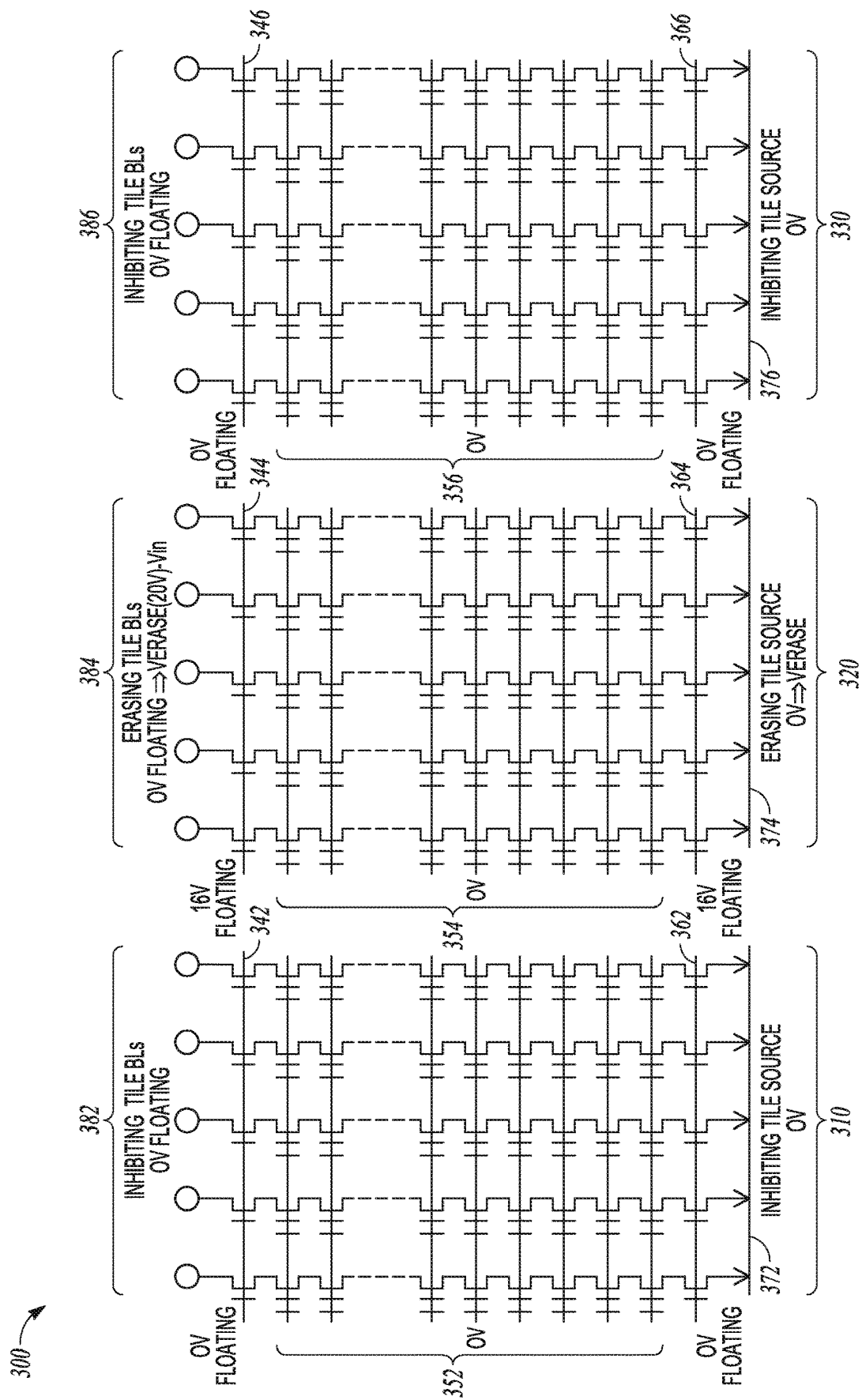
FIG. 14 shows a selected memory block of the 3D NAND memory device of FIG. 2 when performing an erase operation on a partial block in the form of a tile column, according to various embodiments.

FIG. 14 shows a selected memory block (e.g., the memory block 300) of the 3D NAND memory device of FIG. 2 when performing an erase operation on a partial block in the form of a tile column, according to various embodiments. Similar to the program operation, any partial block (e.g., the partial block 320) may be selected and erased independently of other partial blocks. In various embodiments, for example, to select a target partial block to be erased, each sub-source corresponding to the respective partial blocks may be independently decoded of other sub-sources. All sub-CG lines may be biased to about 0V, and all data lines, sub-SGD lines, and sub-SGS lines allowed to float.

Referring to FIG. 14, for example, in various embodiments, the sub-source 374 of the partial block 320 (to be erased) may be biased to an erasing enable voltage, such as the voltage "Verase" (e.g., about 20V), and the sub-sources 372 and 376 of the respective partial blocks 310 and 330 (that are not to be erased) may be biased to an erasing inhibit voltage, such as about 0V. The data lines 384 of the (selected) partial block 320 may be biased to the voltage "Verase–Vin" while the data lines 382 and 386 of the respective (unselected) partial blocks 310 and 330 may remain at the initial floating voltage (e.g., about 0V floating). The sub-SGD line 344 of the (selected) partial block 320 may be pulled up to another floating voltage (e.g., about 16V floating) while the sub-SGD lines 342 and 346 of the respective (unselected) partial blocks 310 and 330 may remain at the initial floating voltage (e.g., about 0V floating). The sub-CG lines 352-356 of the respective partial blocks 310-330 may be biased to about 0V. The sub-SGS line 364 of the (selected) partial block 320 may be pulled to the other floating voltage (e.g., about 16V floating) while the sub-SGS lines 362 and 366 of the respective (unselected) partial blocks 310 and 330 may remain at the initial floating voltage (e.g., about 0V floating).

Figure 15:
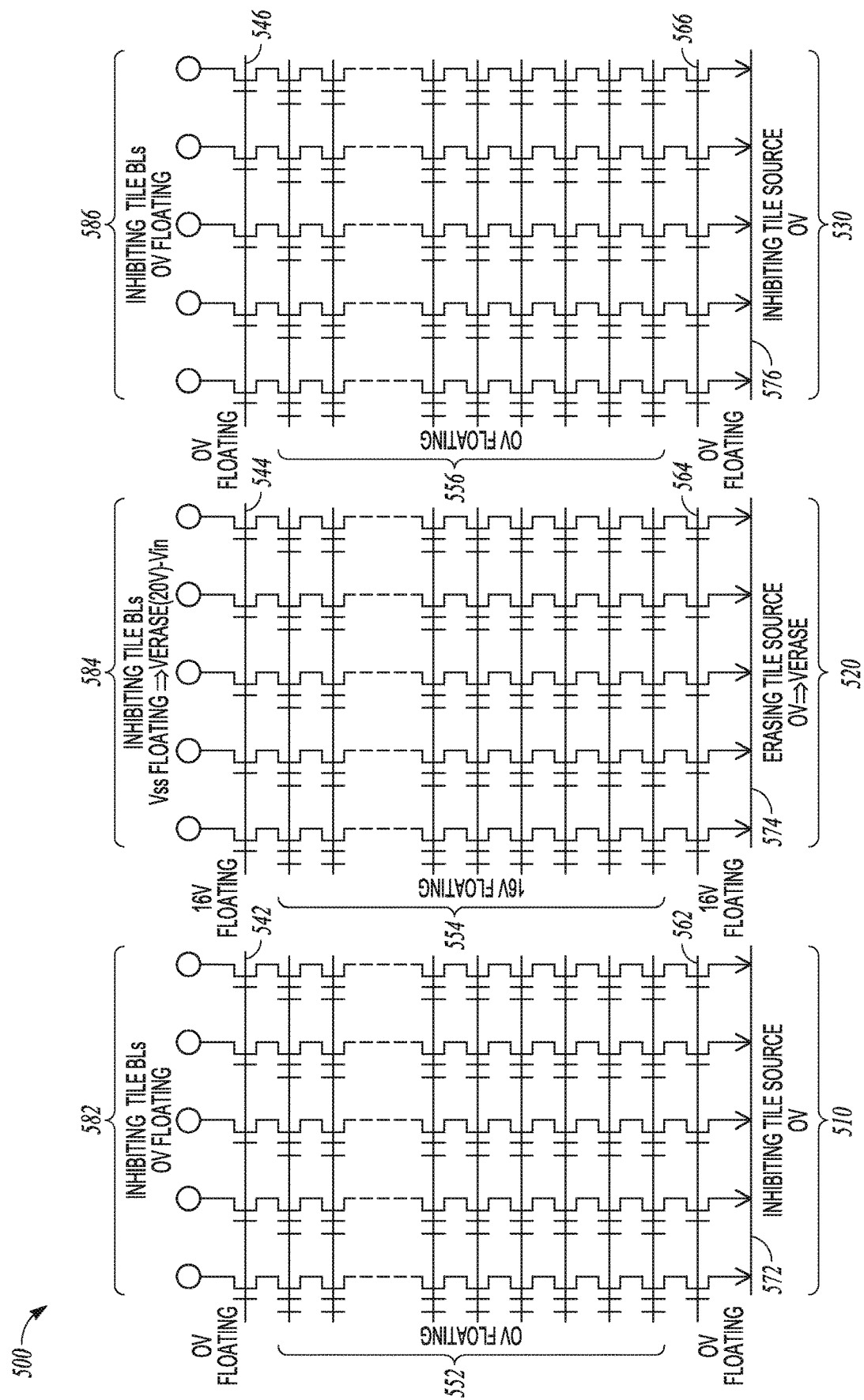
FIG. 15 shows an unselected memory block of the 3D NAND memory device of FIG. 2 when performing an erase operation on a partial block in the form of a tile column, according to various embodiments.

FIG. 15 shows an unselected memory block (e.g., the memory block 500) of the 3D NAND memory device of FIG. 2 when performing an erase operation on a partial block in the form of a tile column, according to various embodiments. In the unselected memory block, not only data lines, sub-SGD lines and sub-SGS lines but also all sub-CG lines may be pulled to floating voltages. Referring to FIG. 15, compared to the selected memory block 300 of FIG. 14, the sub-CG line 554 of the partial block 520 corresponding to the (selected) partial block 320 of the selected memory block 300 may be pulled to the other floating voltage (e.g., 16V floating) instead of being biased to about 0V. Similarly, the sub-CG lines 552 and 556 of the respective partial blocks 510 and 530 corresponding to the (unselected) partial blocks 310 and 330 of the selected memory block 300 may remain at the initial floating voltage (e.g., about 0V floating) instead of being biased to about 0V.

Figure 16:
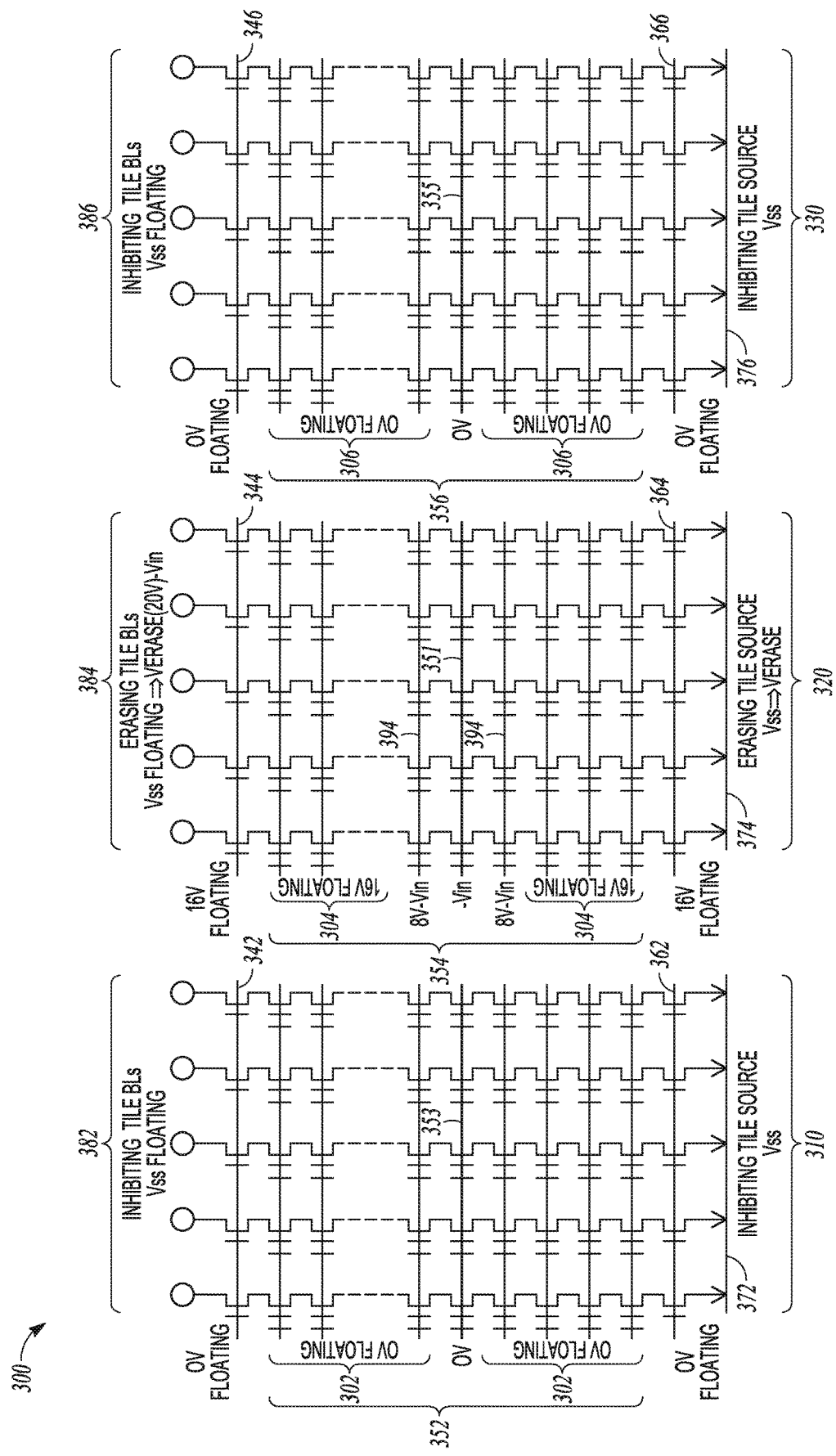
FIG. 16 shows a selected memory block of the 3D NAND memory device of FIG. 2 when performing an erase operation on a partial tier in the form of a tile, according to various embodiments.
Figure 17:
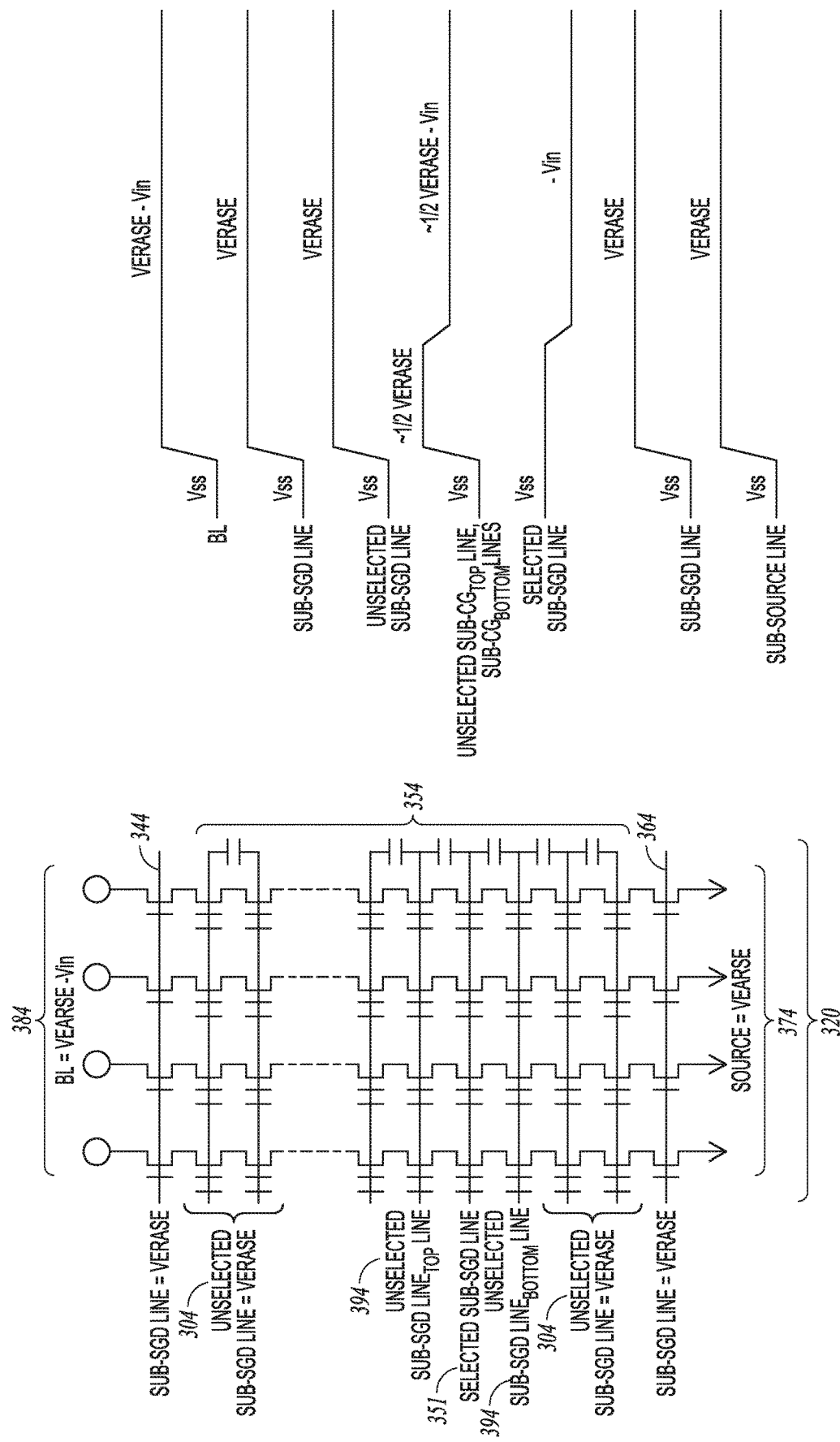
FIG. 17 B shows waveforms applied to a selected partial block of a selected memory block of the 3D NAND memory device of FIG. 2 when performing an erase operation on a partial tier in the form of a tile, according to various embodiments.

FIG. 16 shows a selected memory block (e.g., the memory block 300) of the 3D NAND memory device of FIG. 2 when performing an erase operation on a partial tier in the form of a tile, according to various embodiments. FIG. 17A shows a selected partial block of the selected memory block (e.g., the partial block 320) of the 3D NAND memory device FIG. 2 when performing the erase operation on a partial tier in the form of a tile, according to various embodiments. FIG. 17B shows waveforms applied to a selected partial block of a selected memory block (e.g., the partial block 320) of the 3D NAND memory device of FIG. 2 when performing the erase operation on a partial tier in the form of a tile, according to various embodiments.

Referring to FIGS. 16, 17A and 17B, in various embodiments, all of the sub-SGD lines 342-346, sub-CG lines 352-356 and sub-SGS lines 362-366 may initially be at a first floating voltage (e.g., about 0V floating), and all of the sub-sources 372-376 and data lines 382-386 may initially be at a second floating voltage (e.g., "Vss floating"). To select the partial block 320 (e.g., tile column) as an erasing partial block, the sub-source 374 of the partial block 320 may be biased to the voltage "Verase" (e.g., about 20V). The sub-sources 372 and 376 of the (inhibiting) partial blocks 310 or 330 may remain at the voltage Vss floating.

The data lines 384 of the (erasing) partial block 320 may be biased to the voltage "Verase–Vin". The data lines 382 and 386 of the respective (inhibiting) partial blocks 310 and 330 may remain at the voltage Vss floating. For example, in one embodiment, the voltage Vin may comprise a built-in voltage (e.g., about 0.8V) of a pn-junction of the strings corresponding to the (erasing) partial block 320.

The sub-SGD line 344 of the (erasing) partial block 320 may be pulled to a third floating voltage while the sub-SGD lines 342 and 346 of the respective (inhibiting) partial blocks 310 and 330 may remain at the first floating voltage (e.g., about 0V floating). For example, in one embodiment, the sub-SGD line 344 may see about 16V floating voltage because of the capacitive coupling between neighboring control gates (e.g., about 16V=Verase (e.g., about 20V)×β, where β=~0.8: capacitive coupling ratio).

The sub-CG line 351 of the (erasing) partial block 320 corresponding to a target tier may be pulled to a negative voltage (e.g., "–Vin"), for example, by utilizing the capacitive coupling between neighboring control gates to perform the erase operation on a partial tier effectively. The (unselected) sub-CG lines 394 (e.g., "unselected sub-CG line top and unselected sub-CG line bottom" as show in FIG. 17) neighboring the (selected) sub-CG line 351 may be biased to the voltage "~½ Verase–Vin" (e.g., about 8V–Vin). The (unselected) sub-CG lines 304 above or below the respective unselected sub-CG line top and the unselected sub-CG line bottom may be pulled to the third floating voltage (e.g., about 16V floating).

The sub-CG lines 353 and 355 of the respective (inhibiting) partial blocks 310 and 330 corresponding to the target tier may be biased to, for example, about 0V. The sub-CG lines 302 and 306 of the respective (inhibiting) partial blocks 310 and 330 corresponding to other (unselected) tiers may remain at the first floating voltage (e.g., about 0V floating).

The sub-SGS line 364 of the (erasing) partial block 320 may remain at the third floating voltage (e.g., about 16V floating). The sub-SGS lines 362 and 366 of the respective (inhibiting) partial blocks 310 and 330 may remain at the first floating voltage (e.g., about 0V floating).

Figure 18:
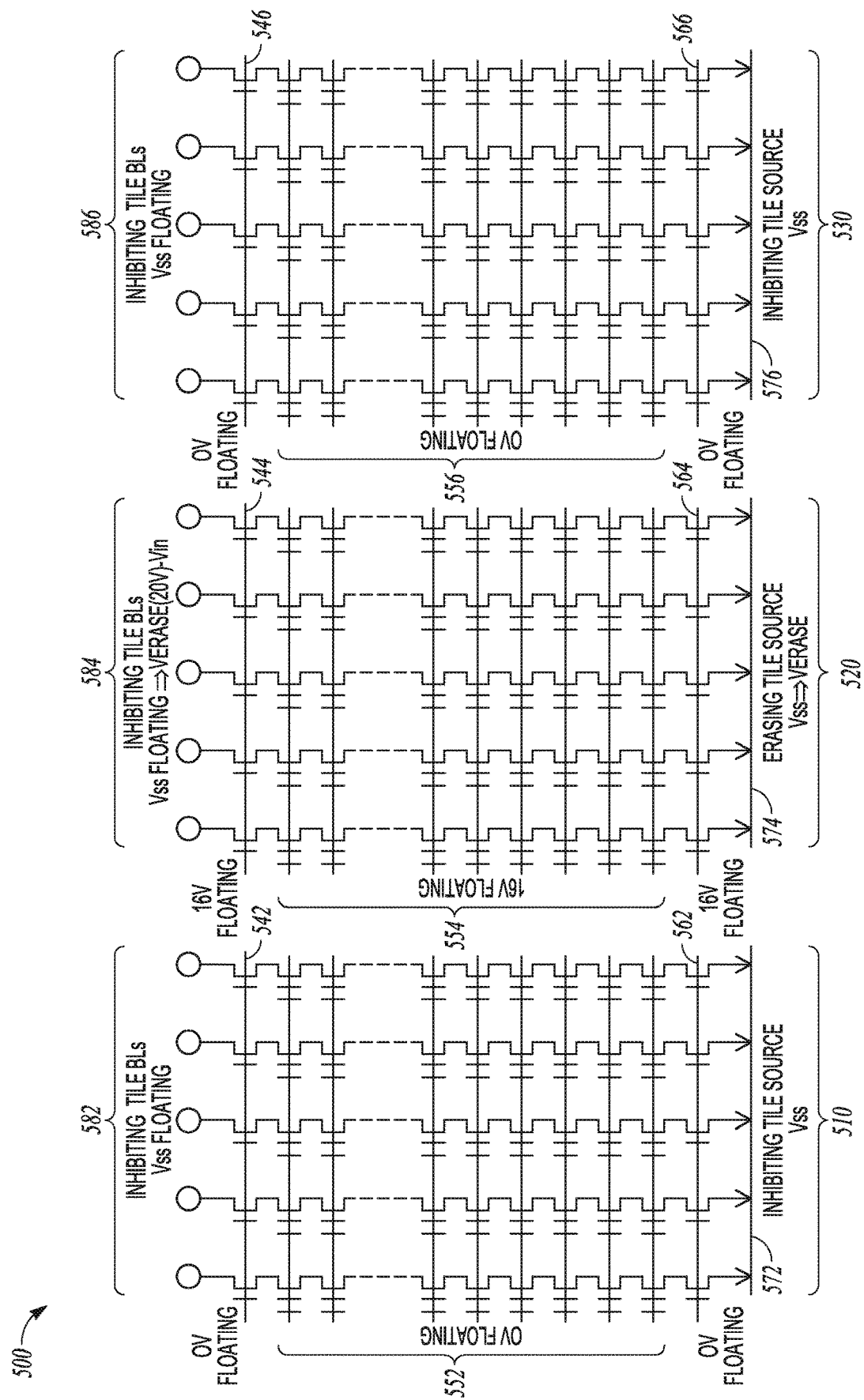
FIG. 18 shows an unselected memory block of the 3D NAND memory device of FIG. 2 when performing an erase operation on a partial tier in the form of a tile, according to various embodiments.

FIG. 18 shows an unselected memory block (e.g., the memory block 500) of the 3D NAND memory device 200 of FIG. 2 when performing an erase operation on a partial tier in the form of a tile, according to various embodiments. The target tier may not be selected for the unselected memory block. Accordingly, for example, referring to FIGS. 13-15, all of the sub-SGD line 544, sub-CG lines 554 and sub-SOS line 564 of the partial block 520 corresponding (e.g., parallel) to the selected (erasing) partial block 320 of the selected memory block 300 may be pulled to a floating voltage (e.g., 16 floating). Similarly, all of the sub-SGD lines 542 and 546, sub-CG lines 552 and 556, and sub-SOS lines 562 and 566 of the respective partial blocks 510 and 530 corresponding (e.g., parallel) to the respective unselected (inhibiting) partial blocks 310 and 330 of the selected memory block 300 may be pulled to another floating voltage (e.g., about 0V floating). The sub-sources 572-576 and data lines 582-586 of the unselected memory block 500 may operate in the same way as the selected memory block 300.

Figure 19:
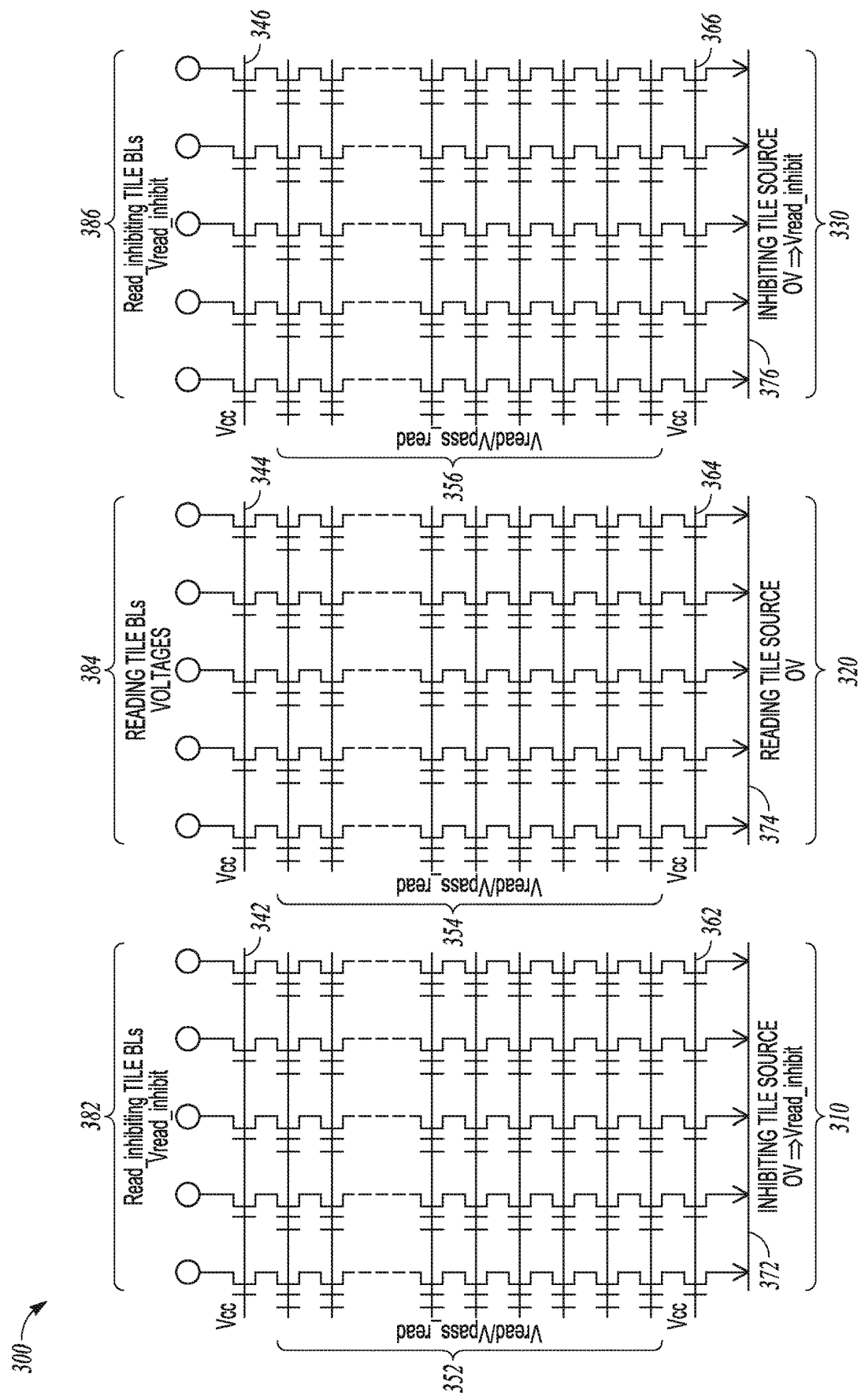
FIG. 19 shows a selected memory block of the 3D NAND memory device of FIG. 2 when performing a read operation on a partial block in the form of a tile column, according to various embodiments.

FIG. 19 shows a selected memory block (e.g., the memory block 300) of the 3D NAND memory device 200 of FIG. 2 when performing a read operation on a partial block in the form of a tile column, according to various embodiments. The read operation on a partial block allows any selected partial block (e.g., tile column) of the selected memory block to be read independently of other (unselected) partial blocks of the selected memory block. The power (current) consumption for the read operation according to various embodiments may be reduced because, for example, the cell current may not flow at the unselected partial blocks and/or page buffers at the unselected partial block may not flip on sensing. The voltage Vread_inhibit may be the same as a data line pre-charge voltage before sensing.

Referring to FIG. 19, in various embodiments, to select the partial block 320 (e.g., tile column) as a target partial block to be read "reading partial block"), the sub-source 374 of the (reading) partial block 320 may be biased to a reading enable voltage, such as about 0V. The sub-sources 372 and 376 of the respective (inhibiting) partial blocks 310 or 330 may be biased to the reading inhibit voltage, such as "Vread_inhibit," for example. The data lines 384 of the (reading) partial block 320 may be biased to one or more voltages. The data lines 382 and 386 of the respective (inhibiting) partial blocks 310 and 330 may be biased to the voltage Vread_inhibit. All of the sub-SGD lines 342-346 and sub-SGS lines 362-366 of the respective partial blocks 310-330 may be biased to the voltage "Vcc." The sub-CG lines 352-356 of the respective partial blocks 310-330 may be selectively biased to either a "Vread" voltage or a Vpass_read" voltage, depending on the page being read.

Figure 20:
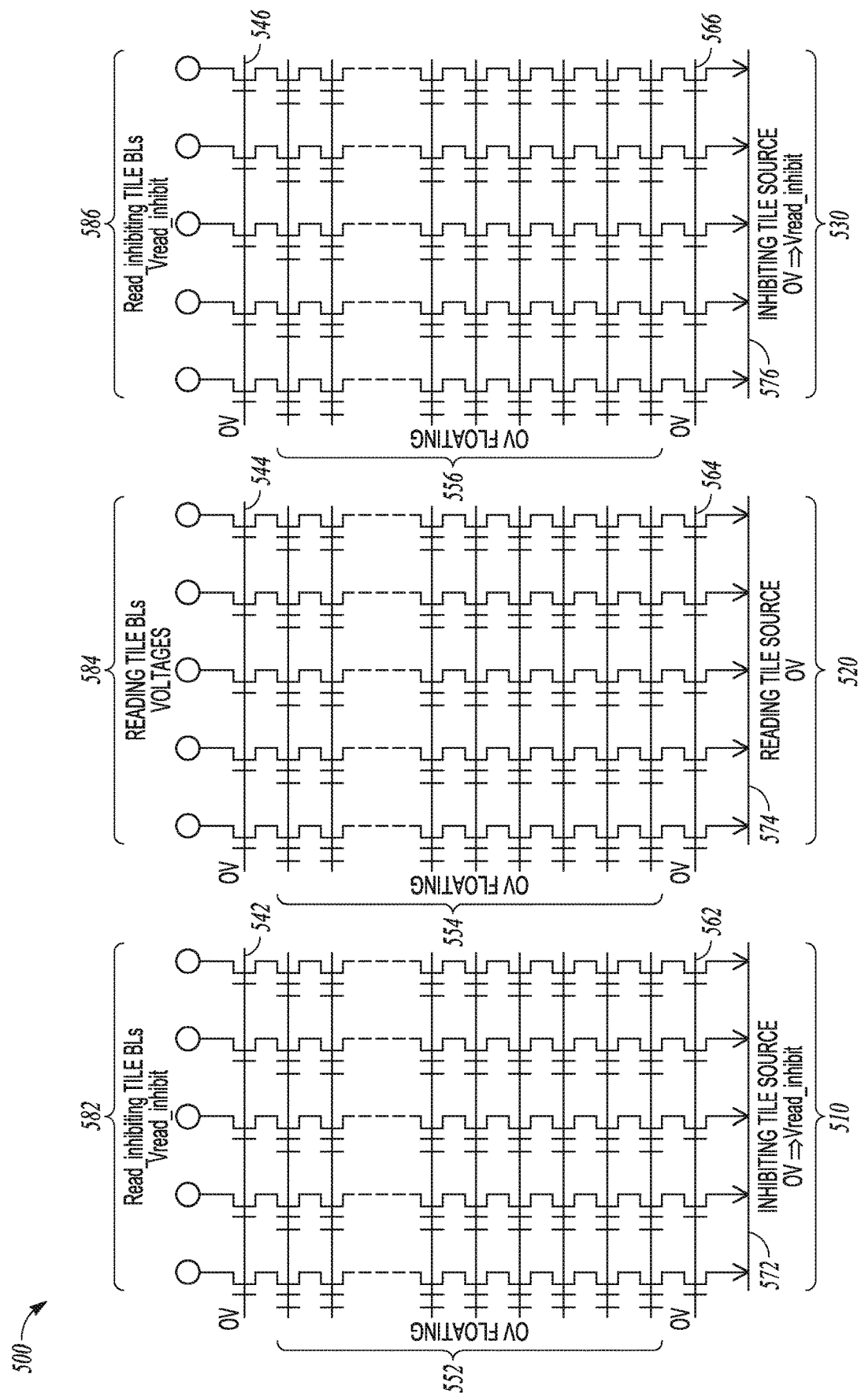
FIG. 20 shows an unselected memory block of the 3D NAND memory device of FIG. 2 when performing a read operation on a partial block in the form of a tile column, according to various embodiments.

FIG. 20 shows an unselected memory block (e.g., the memory block 500) of the 3D NAND memory device 200 of FIG. 2 when performing a read operation on a partial block in the form of a tile column, according to various embodiments. Referring to FIGS. 19 and 20, all of the sub-SGD lines 542-546 and sub-SGS lines 562-566 of the respective partial blocks 510-530 corresponding (e.g., parallel) to the respective partial blocks 310-330 of the selected memory block 300 may be biased to about 0V instead of biasing to the voltage Vcc as in the selected memory block 300. Also, all of the sub-CG lines 552-556 of the respective partial blocks 510-530 may be pulled to a floating voltage (e.g., about 0V floating) instead of biasing to the voltage Vread/Vpass_read as in the selected memory block 300. The sub-sources 572-576 and data lines 582-586 of the unselected memory block 500 may operate in the same way as the selected memory block 300.

Figure 21:
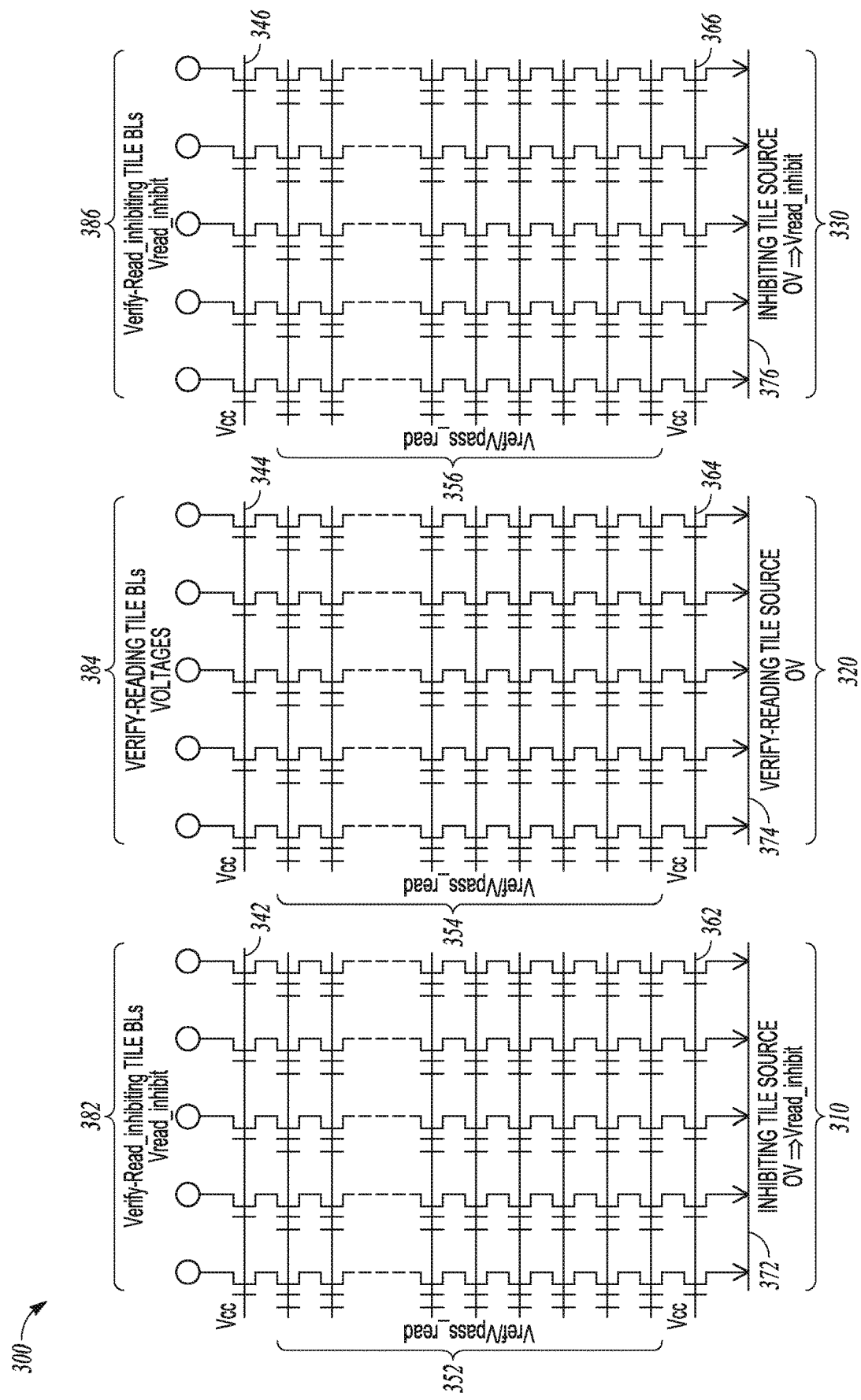
FIG. 21 shows a selected memory block of the 3D NAND memory device of FIG. 2 when performing a verify operation on a partial block in the form of a tile column, according to various embodiments.

FIG. 21 shows a selected memory block (e.g., the memory block 300) of the 3D NAND memory device 200 of FIG. 2 when performing a verify operation for a program/erase operation on a partial block in the form of a tile column, according to various embodiments. The selected memory block (e.g., the memory block 300) may operate in the same way as the (regular) read operation described with respect to FIG. 19. In various embodiments, with respect the normal read and program verify read, only one of the plurality of (e.g., thirty-two (32)) word lines may be read. For the block erase or partial block erase, however, all of the plurality of (e.g., thirty-two (32)) word lines may be erased. In the case of all word line erasure, for example, about 0V may be applied to all of the plurality of (e.g., thirty-two (32)) word lines to verify the read simultaneously because the block or partial block erase verify may be to check if threshold voltages (e.g., Vths) for all of the memory cells become negative. With respect to the tier erase of the partial block erase, the verify may be similar to the program verify, where only one of erased word lines may be biased to about 0V each time, and the other word lines may be biased to the Vpass voltage. As noted earlier, in the 3D NAND memory, a tier erase operation may be possible because the pillar may be fully depleted and there may be no back-bias effect, for example.

Figure 22:
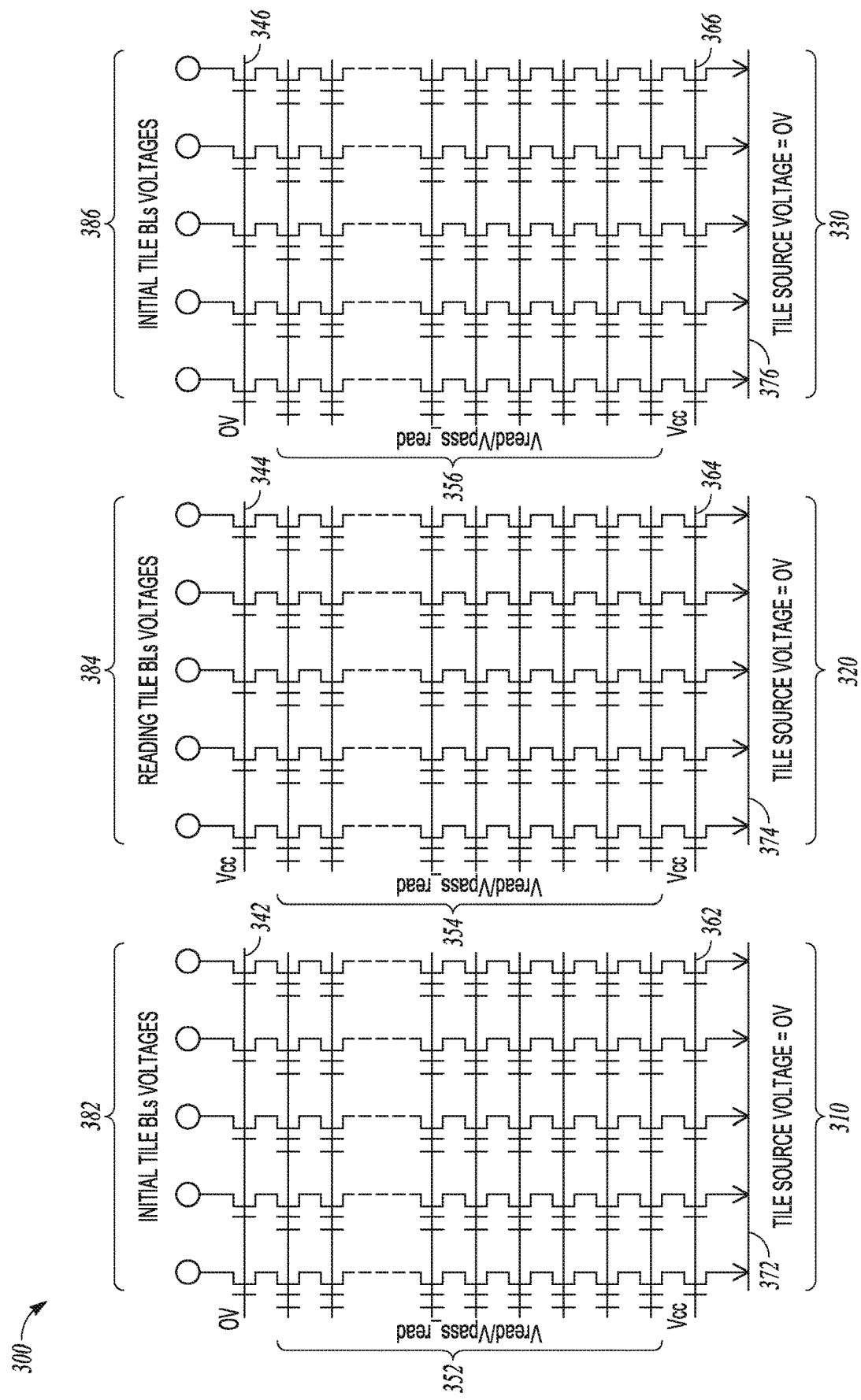
FIG. 22 shows a selected memory block of the 3D NAND memory device of FIG. 2 when performing a read operation on a partial block in the form of a tile column using drain select gate (SGD) decoding, according to various embodiments.

FIG. 22 shows a selected memory block (e.g., the memory block 300) of the 3D NAND memory device of FIG. 2 when performing a read operation on a partial block in the form of a tile column using drain select gate (SGD) decoding, according to various embodiments. Referring to FIG. 22, the partial block 320 of the selected memory block 300 may be selected by applying different control signals (e.g., voltages) to the sub-SGD lines 342-346 independently of one another. Referring to FIG. 22, in various embodiments, to select the partial block 320 as a target partial block to be read (e.g., "reading partial block"), the sub-SGD line 344 of the (reading) partial block 320 may be biased to a reading enable voltage, such as the voltage "Vcc", while the sub-SGD lines 342 and 346 of the respective (inhibiting) partial blocks 310 and 330 may be biased to a reading inhibit voltage, such as about 0V.

The data lines 384 of the (reading) partial block 320 may be biased to one or more voltages from one or more initial data line voltages while the data lines 382 and 386 of the respective (inhibiting) partial blocks 310 and 330 may remain at the one or more initial voltages. All of the sub-CG lines 352-356 of the respective partial blocks 310-330 rimy be biased to a respective one of the "Vread/Vpass_read" voltages, depending on the page being read. All of the sub-SGS lines 362-366 of the respective partial blocks 310-330 may be biased to the voltage Vcc. All of the sub-sources 372-376 of the respective partial blocks 310-330 may be biased to about 0V.

Figure 23:
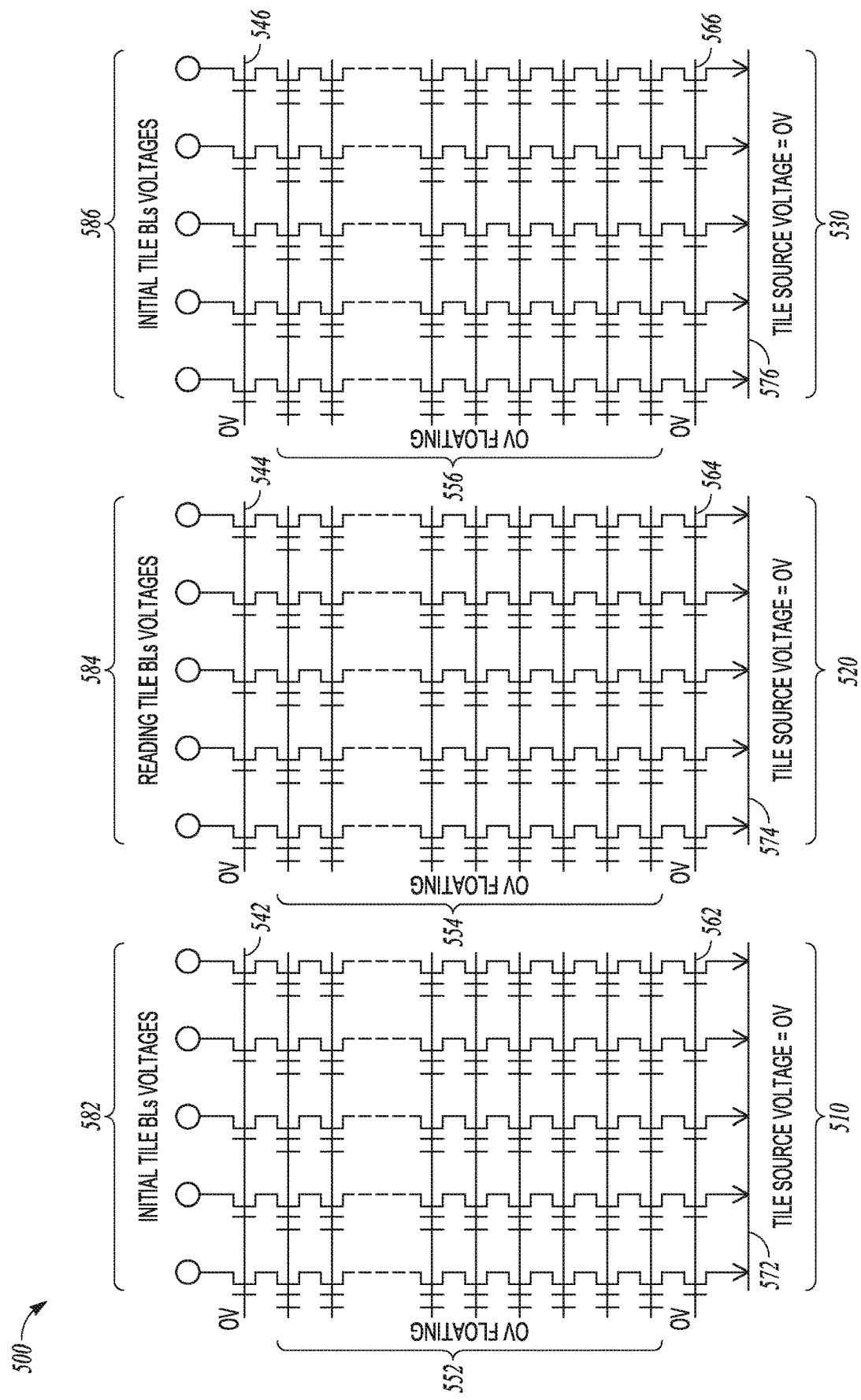
FIG. 23 shows an unselected memory block of the 3D NAND memory device of FIG. 2 when performing the read operation on a partial block in the form of a tile column using the drain select gate (SGD) decoding, according to various embodiments.

FIG. 23 shows an unselected memory block (e.g., the memory block 500) of the 3D NAND memory device of FIG. 2 when performing the read operation on a partial block in the form of a tile column using the drain select gate (SGD) decoding, according to various embodiments. Referring to FIGS. 22 and 23, all of the sub-SGD lines 542-546 and sub-SGS lines 562-566 of the respective partial blocks 510-530 corresponding (e.g., parallel) to the respective partial blocks 310-330 of the selected memory block 300 may be biased to about 0V. All of the sub-CG lines 552-556 of the respective partial blocks 510-530 may be pulled to a floating voltage (e.g., about 0V floating). The sub-sources 572-576 and data lines 582-586 of the unselected memory block 500 may operate in the same way as the selected memory block 300, for example, the sub-sources being biased to about 0V.

Figure 24:
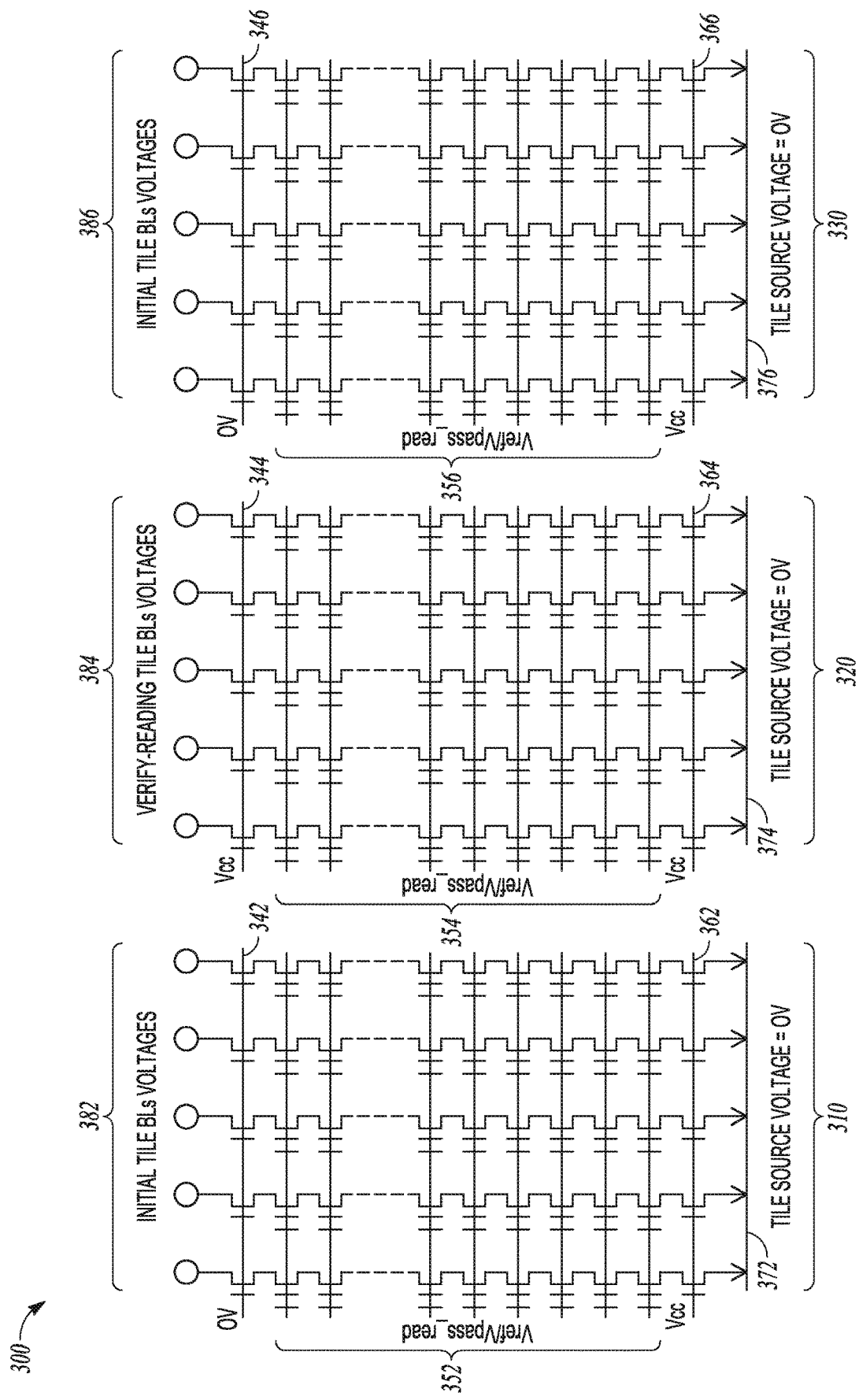
FIG. 24 shows a selected memory block of the 3D NAND memory device of FIG. 2 when performing a verify operation on a partial block in the form of a tile column using the drain select gate (SGD) decoding, according to various embodiments.

FIG. 24 shows a selected memory block (e.g., the memory block 300) of the 3D NAND memory device 200 of FIG. 2 when performing a verify operation on a partial block in the form of a tile column using drain select gate (SGD) decoding, according to various embodiments. The partial block 320 of the selected memory block 300 may be selected by applying different control signals (e.g., voltages) to the sub-SGD lines 342-346 independently of one another. Referring to FIG. 24, in various embodiments, for example, to select the partial block 320 as a target partial block (e.g., "verify-reading tile column") to be verified, the sub-SGD line 344 of the (reading) partial block 320 may be biased to the voltage "Vcc" while the sub-SGD lines 342 and 346 of the respective (inhibiting) partial blocks 310 and 330 may be biased to about 0V.

The data lines 384 of the (reading) partial block 320 may be biased to one or more voltages while the data lines 382 and 386 of the respective (inhibiting) partial blocks 310 and 330 may remain at the one or more initial voltages. All of the sub-CG lines 352-356 of the respective partial blocks 310-330 may be selectively biased to a respective one of the "Vref/Vpass_read" voltages. For example, in one embodiment, the voltage Vref may be applied to the verifying cell and the voltage Vpass_read may be applied to the other cells in the same string. All of the sub-SGS lines 362-366 of the respective partial blocks 310-330 may be biased to the voltage Vcc. All of the sub-sources 372-376 of the respective partial blocks 310-330 may be biased to about 0V.

Figure 25:
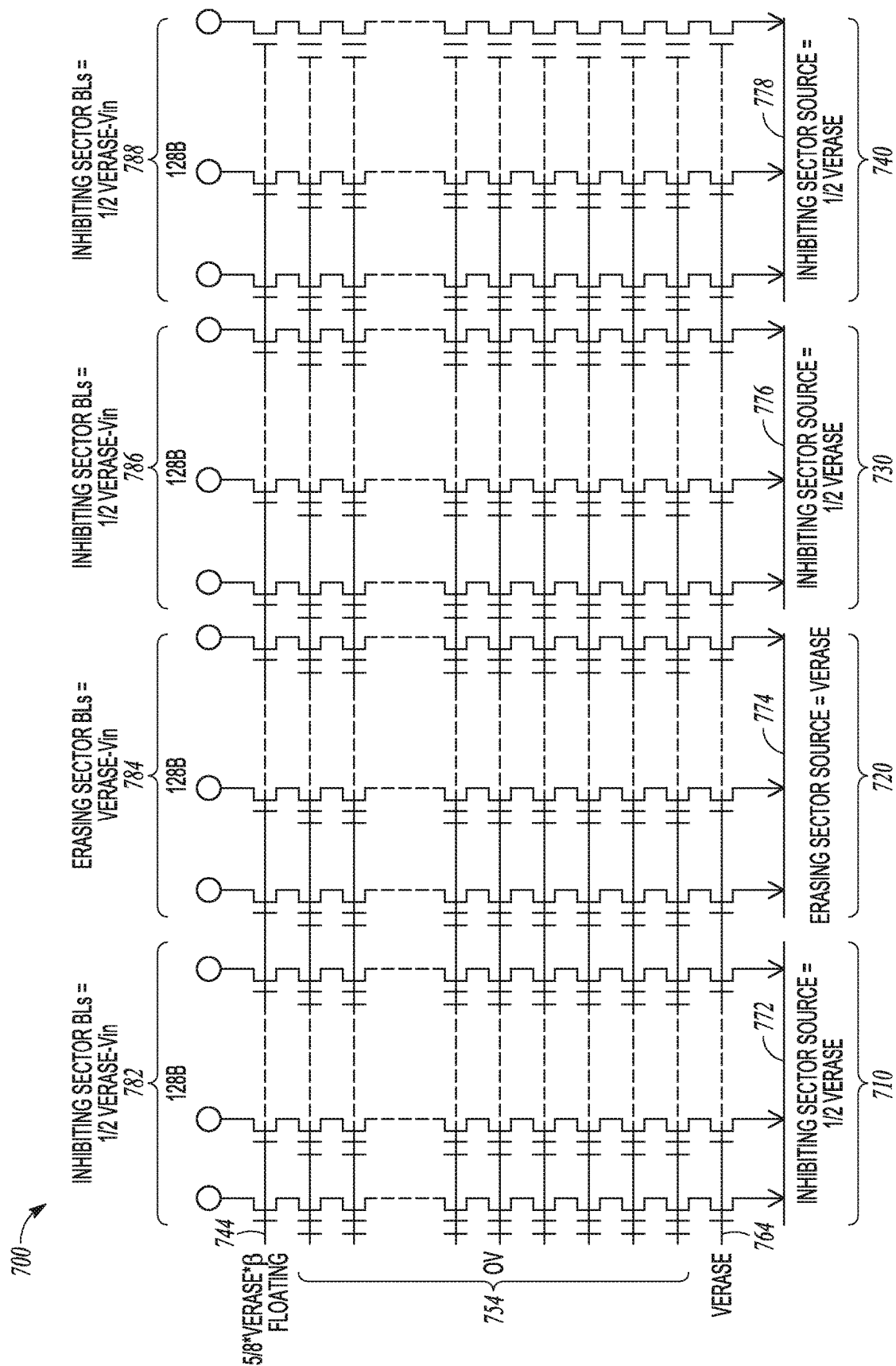
FIG. 25 shows a selected memory block of the 3D NAND memory device of FIG. 2 when performing an erase operation on a partial block in the form of a sector column, according to various embodiments.

FIG. 25 shows a selected memory block 700 of the 3D NAND memory device 200 of FIG. 2 when performing an erase operation on a partial block in the form of a sector column, according to various embodiments. For example, in order to achieve about 500 MB/second throughput and realize single byte unit redundancy replacement, scattered page data mapping may be used for the 3D NAND memory device. In such a case when the scattered page data mapping is used, each partial block (e.g., tile column) of strings may be electrically grouped into a plurality of smaller partial blocks in the form of sector columns, for example, as described with respect to FIGS. 2-7. As also described with respect to FIGS. 2-7, a subset of the charge storage devices of the strings corresponding to a respective sector column and a respective tier of the tiers of the strings may comprise a (single) sector.

In sector-based memory operations, the (single) sector or sector column may be selected (e.g., decoded) and/or operated independently of other sectors (or sector columns). A plurality of sector based memory operations, such as read operations, may be concurrently performed on a number of different sector(s) or sector columns. Similar to the tile-based memory operations, a selected sector source may be biased to an enable voltage, for example, about 0V while an unselected sector source may be biased to an inhibit voltage, for example, the voltage "Vread-inhibit." Power consumption to read may be reduced, for example, because the memory cell current may not flow at the unselected sectors and/or because the page buffers at the unselected sectors may not flip on sensing. In one embodiment, the voltage Vread_inhibit may be the same as the data line pre-charge voltage before sensing.

Referring to FIG. 25, the selected memory block 700, such as the partial block (e.g., tile column) 320 of the selected memory block 300, may be coupled to a plurality of (e.g., 512×8) page buffers, and may be electrically grouped into, for example, four sector columns 710-740 with each sector column being about 128 Bytes. For example, to select sector column 720 as a target sector column to be erased, a sub-source 774 ("erasing sector source") of the sector column 720 may be biased to an erasing enable voltage, such as the voltage "Verase" (e.g., about 20V). The sub-sources 772, 776, 778 ("inhibiting sector sources") of the respective sector columns 710, 730, 740 may be biased to an erasing inhibit voltage, such as about one half of the voltage Verase.

Data lines 784 corresponding to the (selected) sector column 720 may be biased to the voltage "Verase−Vin," for example, while the data lines 782, 786 and 788 corresponding to the respective (unselected) sector columns 710, 730 and 740 may be biased to the voltage "½*Verase−Vin." A sub-SGD line 744 may be pulled to a floating voltage, such as "⅝*Verase−*β floating" where β is a capacitive coupling ratio (e.g., about 0.8V). All sub-CG lines 754 may be biased to about 0V. A sub-SGS line 764 may be pulled to the voltage Verase.

In various embodiments, for example, as shown in FIG. 8, when the selected memory block 700 may comprise the partial block (e.g., tile column) 320, the data lines 782-788 may correspond to the data lines 384, the sub-SGD line 744 to the sub-SGD line 344, the sub-CG lines 754 to the sub-CG lines 354, and the sub-SGS line 764 to the sub-SGD line 364. The sub-sources 772-778 may correspond to the sub-source 374, or may be additional or alternative to the sub-source 374.

Figure 26:
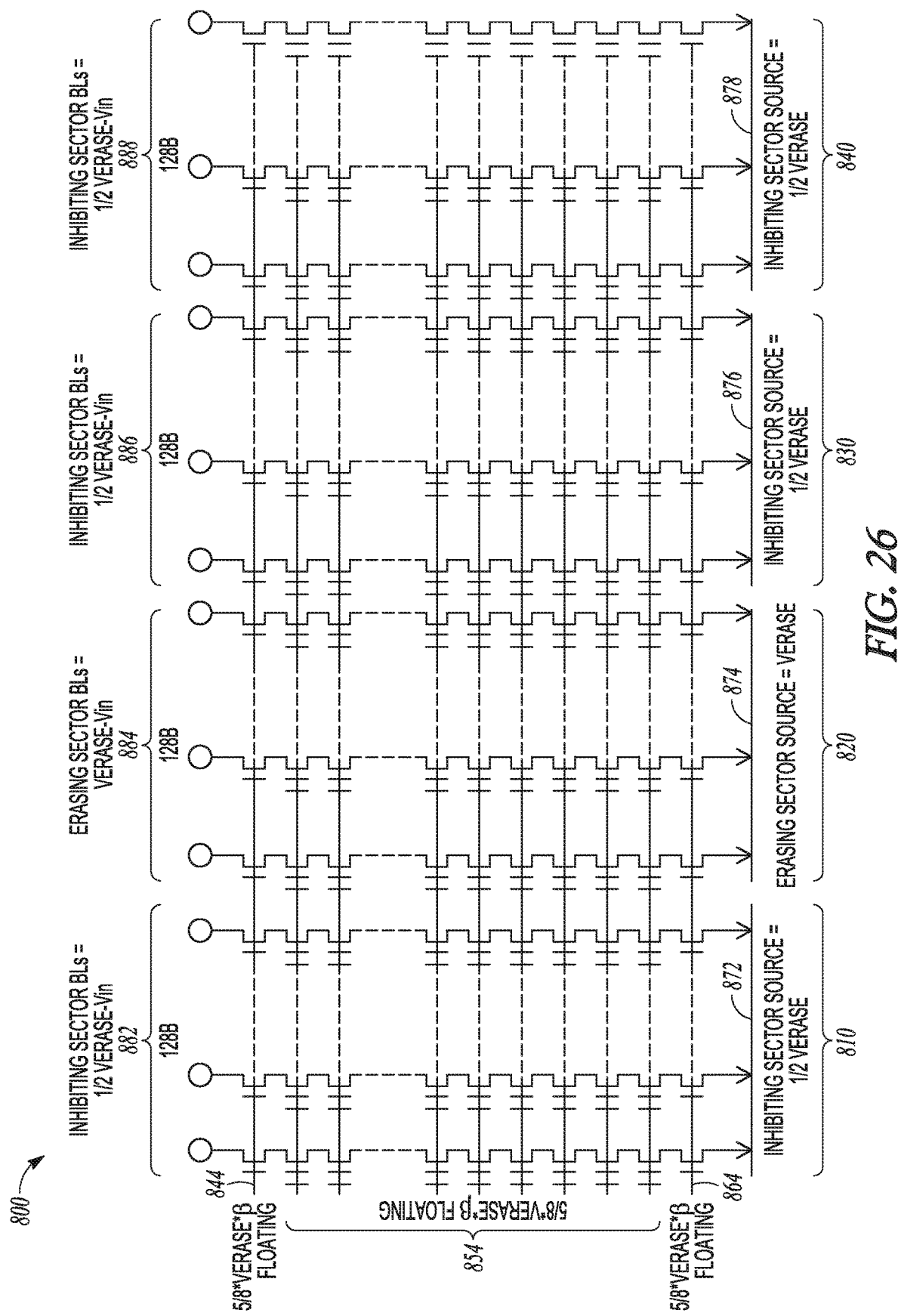
FIG. 26 shows an unselected memory block of the 3D NAND memory device of FIG. 2 when performing an erase operation on a partial block the form of a sector column, according to various embodiments.

FIG. 26 shows an unselected memory block 800 of the 3D NAND memory device of FIG. 2 when performing an erase operation on a partial block in the form of a sector column, according to various embodiments. Referring to FIGS. 25 and 26, sector columns 810-840 of the unselected memory block 800 may correspond (e.g., be parallel) to the respective sector columns 710-740 of the selected memory block 700. All of sub-sources 872-878 and data lines 882-888 of the respective sector columns 810-840 may operate in the same way as those of the selected memory block 700. A sub-SGD line 844, sub-CG lines 854 and a sub-SGS line 864 may be pulled to the floating voltage (e.g., ⅝*Verase*β floating).

For example, in various embodiments, the unselected memory block 800 may comprise the partial block (e.g., tile column) 520 of the unselected memory block 500, for example, as shown in FIG. 12. In such a scenario, the data lines 882-888 may correspond to the data lines 584, the sub-SGD line 844 to the sub-SGD line 544, the sub-CG lines 854 to the sub-CG lines 554, and the sub-SGS line 864 to the sub-SGD line 564. The sub-sources 872-878 may correspond to the sub-source 574, or may be additional or alternative to the sub-source 574.

Figure 27:
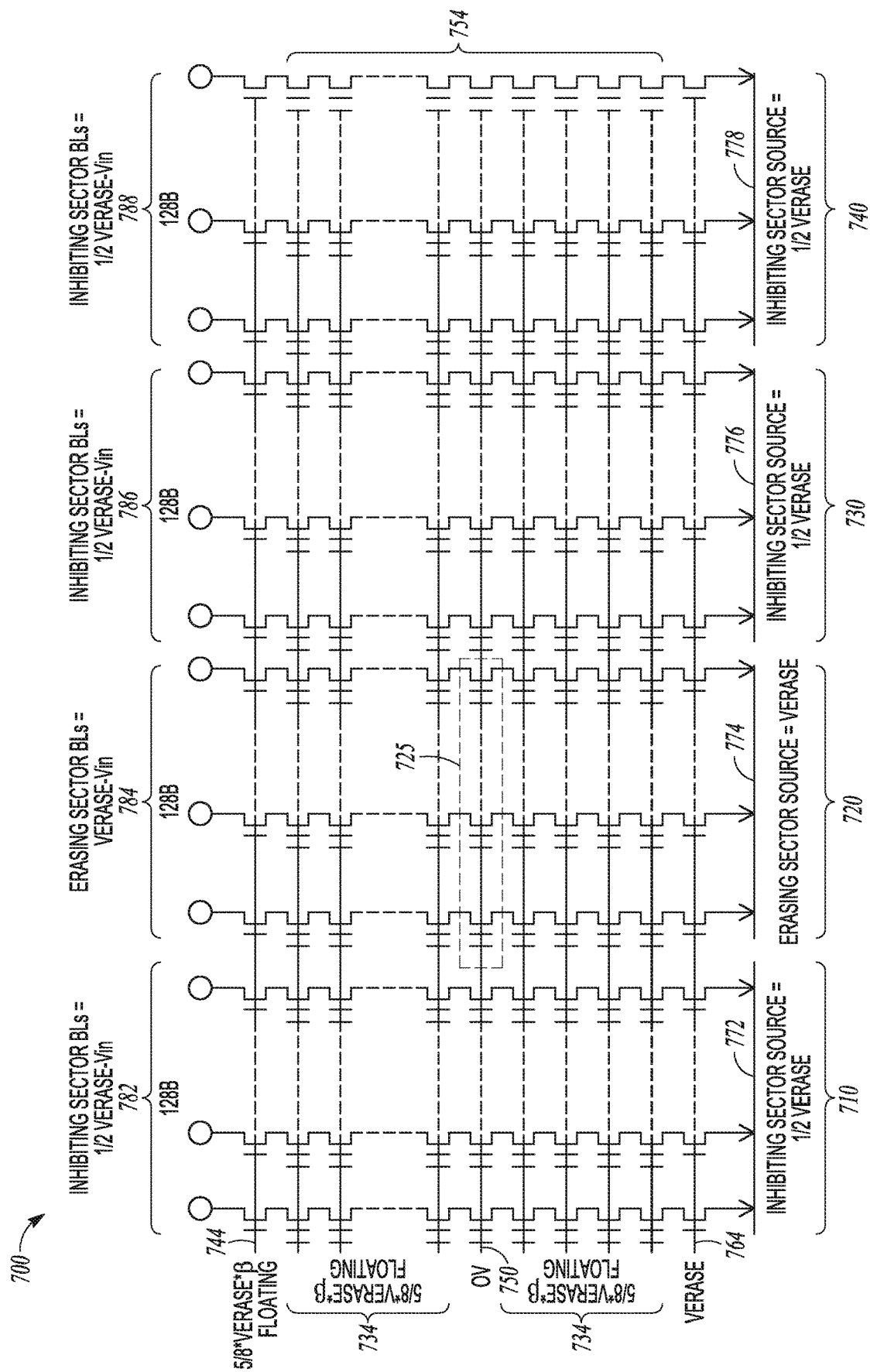
FIG. 27 shows a selected memory block of the 3D NAND memory device of FIG. 2 when performing an erase operation on a partial tier in the form of a sector, according to various embodiments.

FIG. 27 shows a selected memory block (e.g., the selected memory block 700) of the 3D NAND memory device 200 of FIG. 2 when performing an erase operation on a partial tier in the form of a sector, according to various embodiments. Referring to FIG. 27, for example, to select the sector column 720 as a target sector column, the sub-source 774 ("erasing sector source") of the sector column 720 may be biased to the voltage Verase (e.g., about 20V). The sub-sources 772, 776 and 778 ("inhibiting sector sources") of the respective sector columns 710, 730 and 740 (that are not to be erased) may be biased to about one half of the voltage Verase. The data lines 784 of the (selected) sector column 720 may be biased to the voltage "Verase−Vin," and the data lines 782, 786 and 788 of the respective (unselected) sector columns 710, 730 and 740 to the voltage "½*Verase−Vin."

The sub-SGD line 744 may be pulled to a floating voltage, such as "⅝*Verase*β floating" where β is a capacitive coupling ratio (e.g., about 0.8). Compared to performing the erase operation on a sector column described with respect to FIG. 23, a (single) target sector 725 may be further selected from a plurality (e.g., thirty two) of sectors of the selected sector column 720, for example, by applying about 0V only to the sub-CG lines 750 corresponding to a target tier that includes the target sector 725. The sub-CG lines 734 corresponding to other (unselected) tiers may be pulled to the same voltage (e.g., ⅝*Verase*β floating) as the sub-SGD line 744. The sub-SGS line 764 may be pulled to the voltage Verase.

Figure 28:
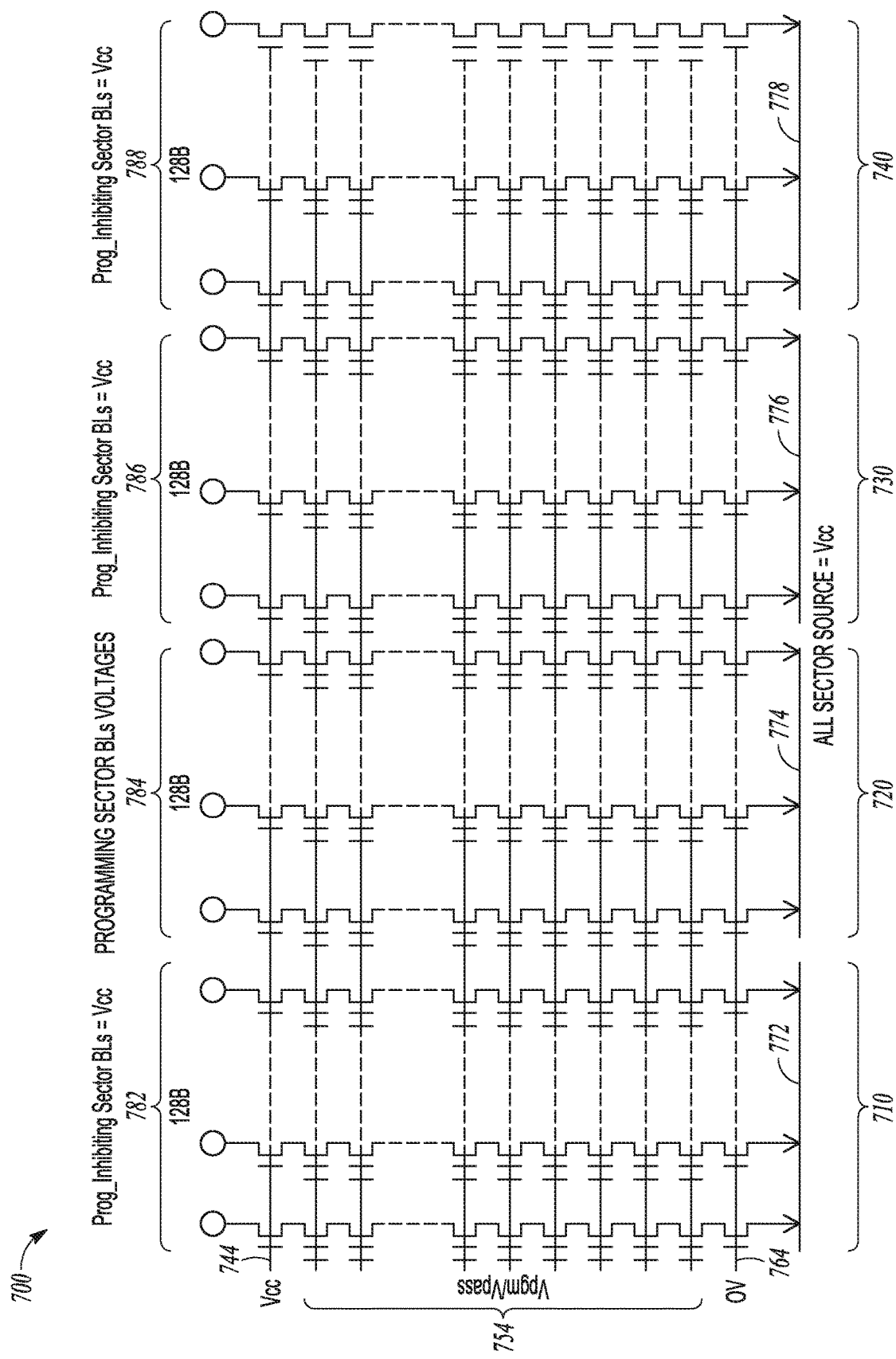
FIG. 28 shows a selected memory block of the 3D NAND memory device of FIG. 2 when performing a program operation on a partial block in the form of a sector column, according to various embodiments.

FIG. 28 shows a selected memory block (e.g., the selected memory block 700) of the 3D NAND memory device 200 of FIG. 2 when performing a program operation on a partial block in the form of a sector column, according to various embodiments. Referring to FIG. 28, all of the sub-sources 772-778 may be biased to the voltage "Vcc." The data lines 782, 786 and 788 of the respective (inhibiting) sector columns 710, 730 and 740 may be biased to the voltage Vcc, and the data lines 784 of the (programming) sector column 720 to one or more voltages different from the voltage Vcc. The sub-SGD line 744 may be biased to the voltage Vcc. For example, in various embodiments, all of the sub-CG lines 754 may be biased to the voltage "Vpass" simultaneously, and then only one selected sub-CG of the sub-CG lines 754 may be biased up to the voltage "Vpgm" at a time (while the rest of the sub-CG lines 754 remain at the voltage Vpass) to program the charge storage devices corresponding to the selected sub-CG. The sub-SGS line 764 may be biased to about 0V.

Figure 29:
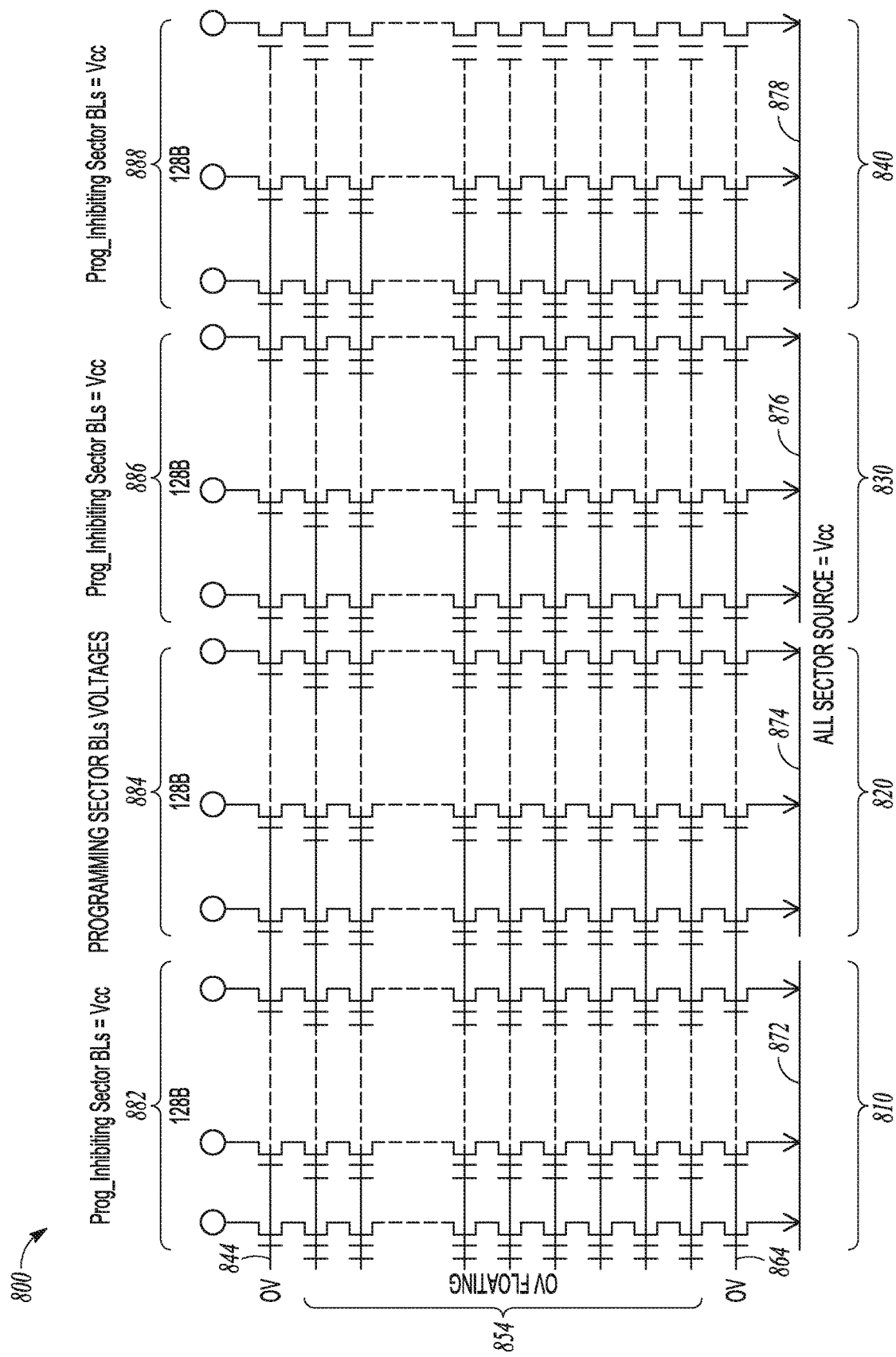
FIG. 29 shows an unselected memory block of the 3D NAND memory device of FIG. 2 when performing a program operation on a partial block in the form of a sector column, according to various embodiments.

FIG. 29 shows an unselected memory block (e.g., the unselected memory block 800) of the 3D NAND memory device 200 of FIG. 2 when performing a program operation on a partial block in the form of a sector column, according to various embodiments. Referring to FIGS. 28 and 29, all of the sub-sources 872-878 may be biased to the voltage Vcc. The data lines 882, 886 and 888 of the respective (inhibiting) sector columns 810, 830 and 840 may be biased to the voltage Vcc, and the data lines 884 of the (programming) sector column 820 may be biased to one or more voltages different from the voltage Vcc. The sub-SGD line 844 and sub-SGS line 864 may be biased to about 0V. All of the sub-CG lines 854 may be at a floating voltage (e.g., about 0V floating).

Figure 30:
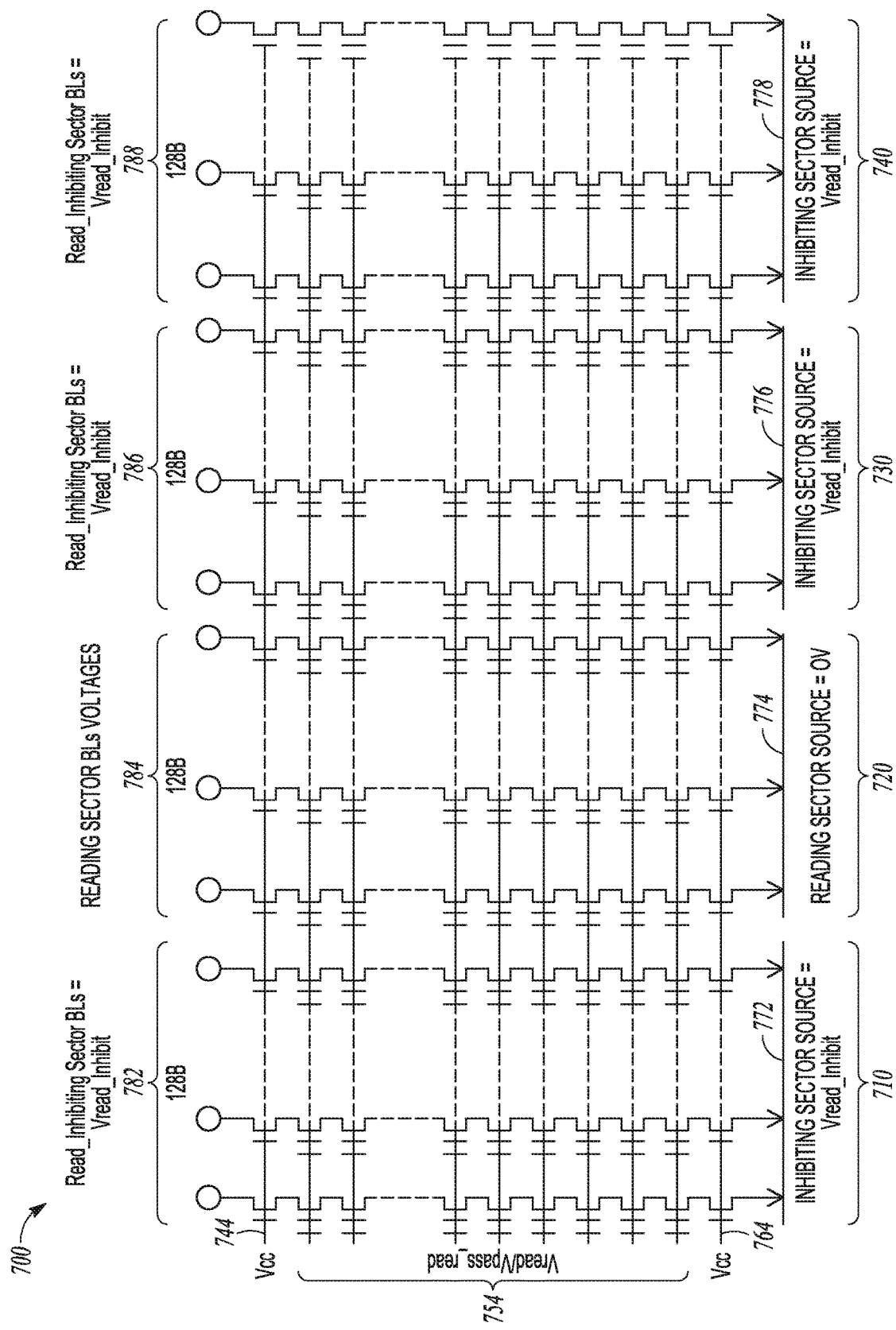
FIG. 30 shows a selected memory block of the 3D NAND memory device of FIG. 2 when performing a read operation on a partial block in the form of a sector column, according to various embodiments.

FIG. 30 shows a selected memory block (e.g., the selected memory block 700) of the 3D NAND memory device 200 of FIG. 2 when performing a read operation on a partial block in the form of a sector column, according to various embodiments. Referring to FIG. 30, for example, to select a sector column 720 as a target sector column to be read, a sub-source 774 ("reading sector source") of the sector column 720 may be biased to a reading enable voltage, such as about 0V. The sub-sources 772, 776 and 778 ("inhibiting sector sources") of the respective sector columns 710, 730 and 740 may be biased to a reading inhibit voltage, such as the voltage "Vread_inhibit". Data lines 784 corresponding to the (selected) sector column 720 may be biased to one or more voltages different from the voltage Vread_inhibit, and the data lines 782, 786 and 788 corresponding to the respective (unselected) sector columns 710, 730 and 740 may be biased to the voltage Vread_inhibit. The sub-SGD line 744 may be biased to the voltage "Vcc." All of the sub-CG lines 754 may be selectively biased to a respective one of the "Vread/Vpass_read" voltages, depending on the page being read. For example, in one embodiment, the voltage Vread may be applied to the selected cell which is to be read, and the voltage Vpass_read may be applied to the other cells in the same string. The sub-SGS line 764 may be biased to the voltage Vcc.

Figure 31:
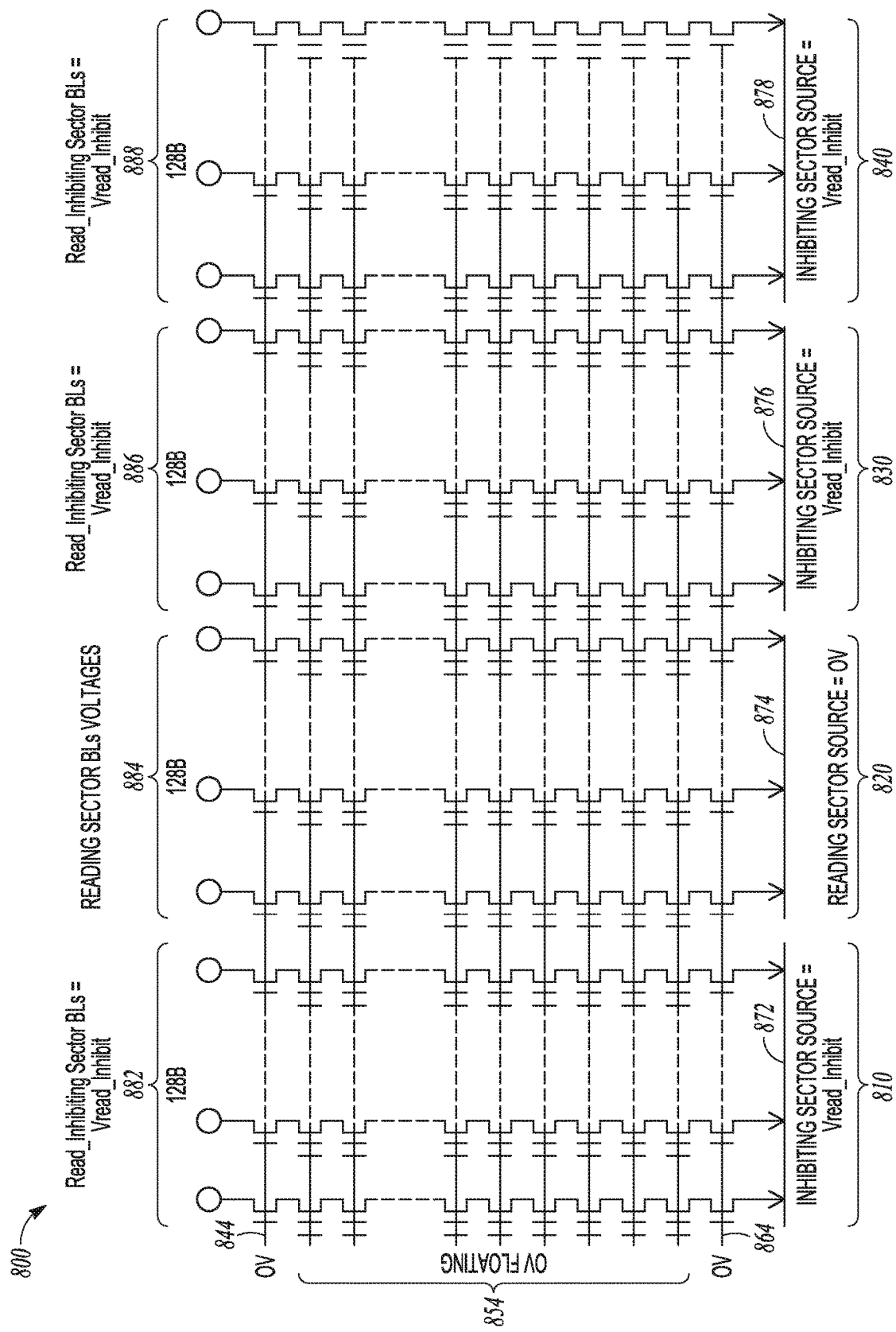
FIG. 31 shows an unselected memory block of the 3D NAND memory device of FIG. 2 when performing a read operation on a partial block in the form of a sector column, according to various embodiments.

FIG. 31 shows an unselected memory block (e.g., the unselected memory block 800) of the 3D NAND memory device 200 of FIG. 2 when performing a read operation on a partial block in the form of a sector column, according to various embodiments. Referring to FIGS. 30 and 31, the sub-source 874 ("reading sector source") of the sector column 820 may be biased to about 0V. The sub-sources 872, 876 and 878 ("inhibiting sector sources") of the respective sector columns 810, 830 and 840 may be biased to the voltage Vread_inhibit. The data lines 882, 886 and 888 of the respective (inhibiting) sector columns 810, 830 and 840 may be biased to the voltage Vread_inhibit, and the data lines 884 of the (reading) sector column 820 to one or more voltages different from the voltage Vread_inhibit. The sub-SGD line 844 and sub-SGS line 864 may be biased to about 0V. All of the sub-CG lines 854 may be pulled to a floating voltage, such as about the voltage "0V Floating."

Figure 32:
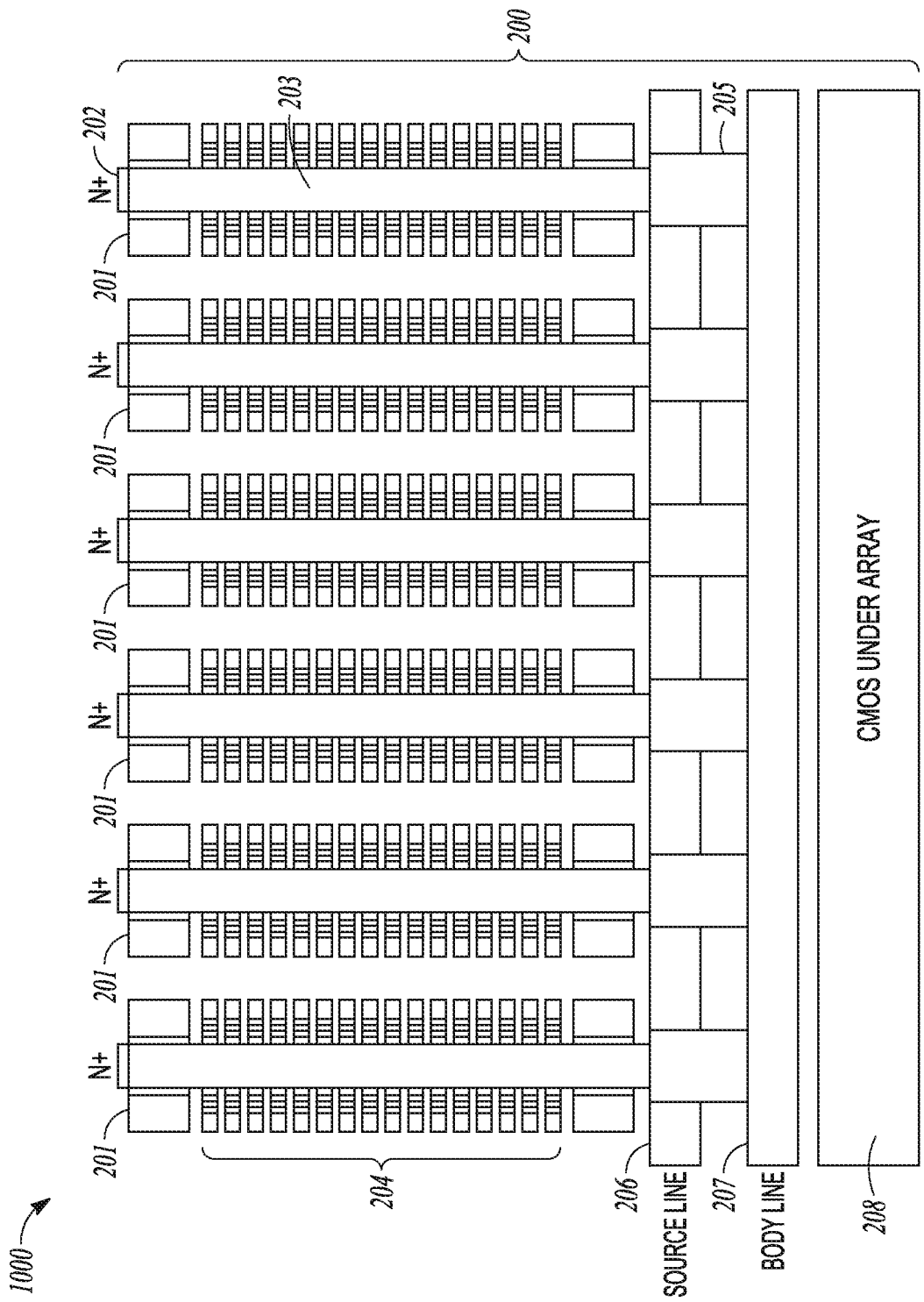
FIG. 32 shows an enlarged cross sectional view of the 3D NAND memory device of FIG. 2 in the X-X' direction, according to various embodiments.

FIG. 32 shows an enlarged cross (e.g., X-X') sectional view of a partial block 1000 of a 3D NAND memory device, such as the 3D NAND memory device 200 of FIG. 2, according to various embodiments. It is noted that some elements, such as sub-access lines and data lines, are not shown for clarity. Also, although FIG. 32 shows only one partial block (e.g., the partial block 320) comprising a respective tile column, it can be seen that the entire 3D NAND memory device (e.g., the 3D NAND memory device of FIG. 2) may be fabricated employing the architecture shown in FIG. 32. In such a case, a respective source and body for the entire 3D memory device may be formed into a plurality of sub-sources and sub-bodies such that each sub-source and sub-body may correspond to a respective tile column (and tiles thereof) and be electrically separated or selected (e.g., decoded) based on the respective tile column. For example, in various embodiments, etching technologies may be used to simultaneously pattern the source line and body line for the plurality of partial blocks tile columns).

In various embodiments, for example, the partial block 1000 in FIG. 32 may comprise a plurality of strings of charge storage devices 201, at least one source (e.g., a source line) 206, at least one body (e.g., a body line) 207 and at least one area of CMOS devices (complementary metal oxide semiconductor) under the array 208. At least one of the strings 201 may comprise, for example, a cap 202, a pillar 203 having charge storage devices 204 (e.g., the cells 100) formed thereabout, and a connecting portion 205. At least one of the strings 201 may be formed over the at least one body 207 such that the pillar 203 may go through the at least one source 206 and contact the at least one body 207 via the connecting portion 205.

In various embodiments, the diameter of the connecting portion 205 may be larger than that of the pillar 203, for example, to preserve mask alignment margins. In various embodiments, the cap 202 may comprise N+ Poly-Silicon, the pillar 203 (and the connecting portion 205) may comprise P Poly-Silicon, the at least one source 206 may comprise N+ Poly-Silicon, and the at least one body 207 may comprise P+ Poly-Silicon. In various embodiments, each of the charge storage devices 204 may comprise a FG (Floating Gate) memory cell or CT (Charge Trap) memory cell.

In various embodiments, the plurality of strings 201 may form a partial block (e.g., the tile column 310, 320, 330, 410, 420 or 430, or the sector column 710, 720, 730, 740, 810, 820, 830 or 840 in the form of a logical block comprising a set of fractions of corresponding tile columns) of a corresponding memory block (e.g., the memory block 300, 500, 700 or 800). In such a scenario, the at last one source 206 may comprise a sub-source (e.g., the sub-source 372, 374, 376, 472, 474, 476, 772, 774, 776, 778, 872, 874, 876 or 878) corresponding to the partial block. Similarly, the at least one body 207 may comprise a sub-body corresponding to the partial block. It is noted that only six strings are shown in FIG. 32 for clarity; in other embodiments a different number of strings 201 may be used to form the partial block.

In various embodiments, the at least one body 207 of a respective partial block may be decoded in addition to or as an alternative to decoding a sub-source or a sub-SGD line of the respective partial block, as described with respect to FIGS. 5-31. Such sub-body decoding may allow for performing memory operations on a partial block (e.g., tile column or sector column) and/or partial tier (e.g., tile or sector) using lower voltages, for example, voltages similar to those of a two dimensional (2D) NAND memory, as shown in Table 1. By using sub-body decoding, for example, the need to use GIDL current may be obviated. The sub-body decoding may also stabilize the strings 201. For example, the strings 201 may be direct current (DC)-biased by the sub-body decoding, which may in turn provide a more reliable bias condition in comparison with the floating string biased by the GIDL. More detailed explanations of the sub-body decoding to perform memory operations are provided below with respect to FIGS. 33-40.

TABLE 1

Voltages for Memory Operations on a Partial Block and/or Partial Tier with Sub-body Decoding

| | | Program | | |
| --- | --- | --- | --- | --- |
| | Read | Program | Inhibit | Erase |
| Data Line | Vpre (~about 1.2 V) | Vss (about 0 V) | Vcc (~about 2.5 V) | Verase − Vin (~about 20 V) |
| (Sub) Source | Vss (about 0 V) | Vcc (~about 2.5 V) | Verase − Vin (~about 20 V) |
| (Sub) Body Line | Vss (about 0 V) | Vss (about 0 V) | Verase (~about 20 V) |

Figure 33:
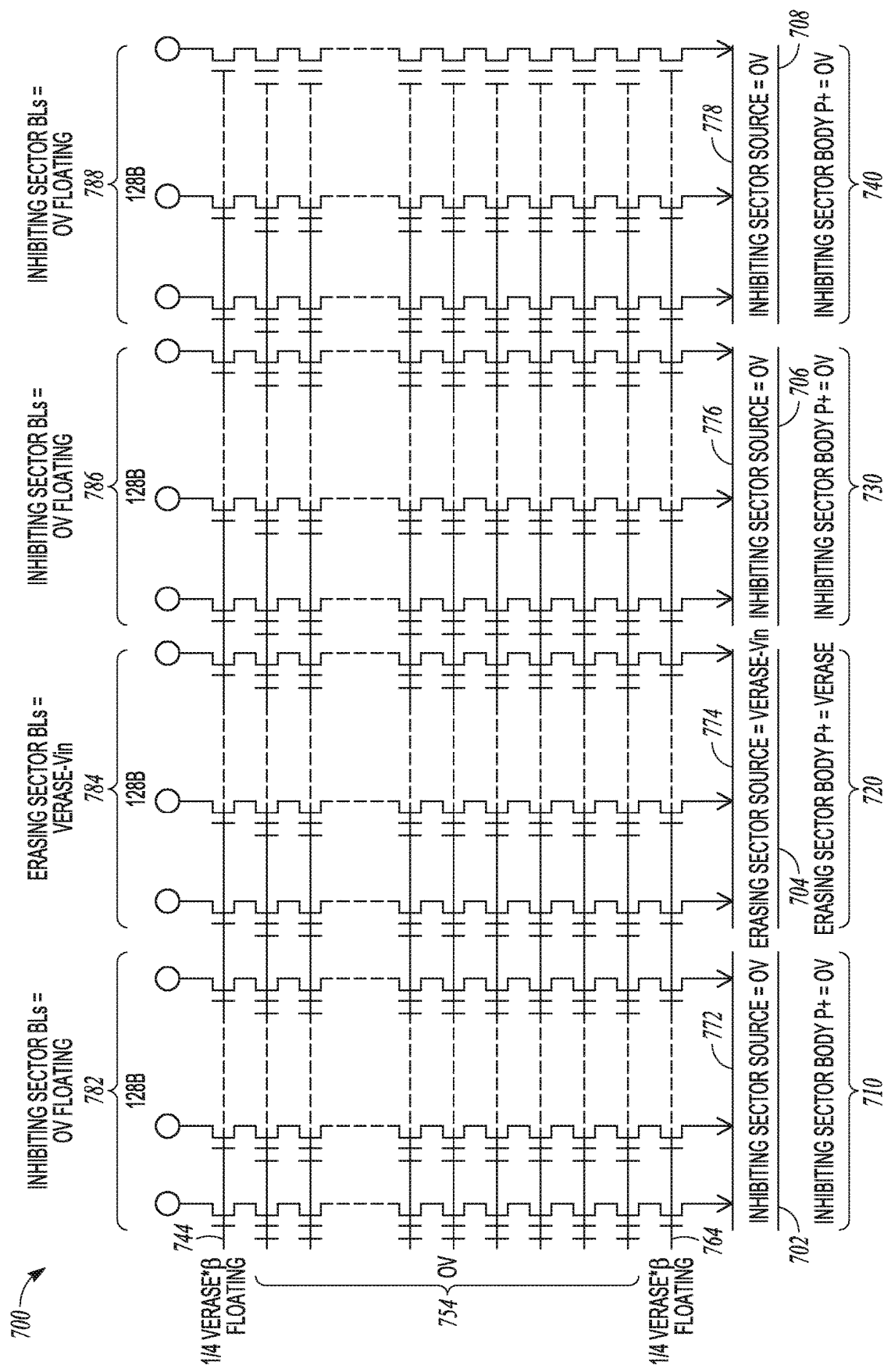
FIG. 33 shows a selected memory block of the 3D NAND memory device of FIG. 2 when performing an erase operation on a partial block in the form of a sector column using sub-body decoding, according to various embodiments.

FIG. 33 shows a selected memory block (e.g., the selected memory block 700) of the 3D NAND memory device of FIG. 2 when performing an erase operation on a partial block in the form of a sector column using sub-body decoding, according to various embodiments. As described with respect to FIG. 25, the selected memory block 700, such as the partial block (e.g., tile column) 320, may be coupled to a plurality of (e.g., 512×8) page buffers, and may be electrically grouped into, for example, four sector columns 710-740 with each sector column being about 128 Bytes. Each of the four sector columns 710-740 may be coupled to a respective one of a plurality (e.g., four) of sub-bodies 702-708, as described with respect to FIG. 32. As also described with respect to FIG. 25, in the case when the selected memory block 700 is the partial block (e.g., tile column) 320, the data lines 782-788 may correspond to the data lines 384, the sub-SGD line 744 to the sub-SGD line 344, the sub-CG lines 754 to the sub-CG lines 354, and the sub-SGS line 764 to the sub-SGD line 364. The sub-sources 772-778 may correspond to the sub-source 374, or may be additional or alternative to the sub-source 374.

In various embodiments, for example, to select the sector column 720 as a target sector column to be erased, the sub-body 704 ("erasing sector body") of the sector column 720 may be biased to an erasing enable voltage, such as the voltage Verase (e.g., about 20V), and the sub-bodies 702, 706 and 708 ("inhibiting sector bodies") of the respective sector columns 710, 730 and 740 to an erasing inhibit voltage, such as about 0V. The sub-source 774 ("erasing sector source") of the sector column 720 may be pulled to the voltage Verase Vin, and the sub-sources 772, 776 and 778 ("inhibiting sector sources") of the respective sector columns 710, 730 and 740 to about 0V.

The data lines 784 of the (selected) sector column 720 may be pulled to the voltage Verase−Vin while the data lines 782, 786 and 788 corresponding to the respective (unselected) sector columns 710, 730 and 740 may be pulled to (or remain at) a first floating voltage (e.g., about 0V floating). The sub-SGD line 744 may be pulled to a second floating voltage, such as "¼*Verase*β floating" where β is a capacitive coupling ratio (e.g., about 0.8), All of the sub-CG lines 754 may be biased to about 0V. The sub-SGS line 764 may be pulled to the second floating voltage (e.g., ¼*Verase*β floating).

Figure 34:
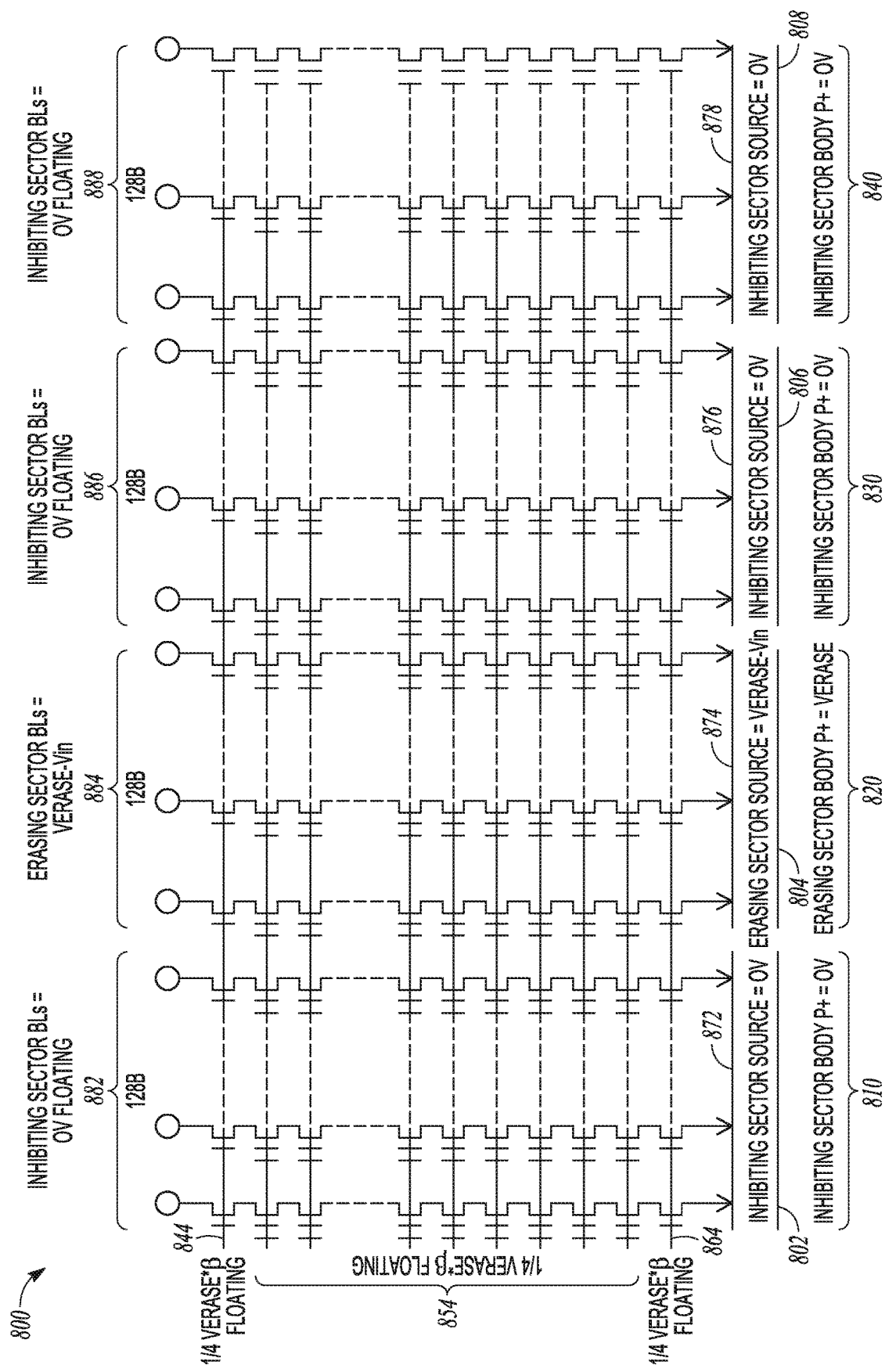
FIG. 34 shows an unselected memory block of the 3D NAND memory device of FIG. 2 when performing an erase operation on a partial block the form of a sector column using sub-body decoding, according to various embodiments.

FIG. 34 shows an unselected memory block (e.g., the unselected memory block 800) of the 3D NAND memory device 200 of FIG. 2 when performing an erase operation on a partial block in the form of a sector column using sub-body decoding, according to various embodiments. As described with respect to FIG. 18, the unselected memory block 800 may comprise, for example, the partial block (e.g., tile column) 520. In such a scenario, the data lines 882-888 may correspond to the data lines 584, the sub-SGD line 844 to the sub-SGD line 544, the sub-CG lines 854 to the sub-CG lines 554, and the sub-SGS line 864 to the sub-SGD line 564. The sub-sources 872-878 may correspond to the sub-source 574, or may be additional or alternative to the sub-source 574. As also described with respect to FIG. 18, the sector columns 810-840 of the unselected memory block 800 may correspond (e.g., be parallel) to the respective sector columns 710-740 of the selected memory block 700.

Referring to FIG. 34, in various embodiments, all of the sub-bodies 802-808, sub-sources 872-878, data lines 882-888, sub-SGD 844 and sub-SGS 864 of the respective sector columns 810-840 of the unselected memory block 800 may operate in the same way as those of the selected memory block 700 of FIG. 33. Compared to the sub-CG lines 754 of the selected memory block 700 of FIG. 33, which may be biased to about 0V, the sub-CG lines 854 of the unselected memory block 800 may be pulled to the same voltage (e.g., ¼*Verase*β floating) as that of the sub-SGD line 844 or the sub-SGS line 864.

Figure 35:
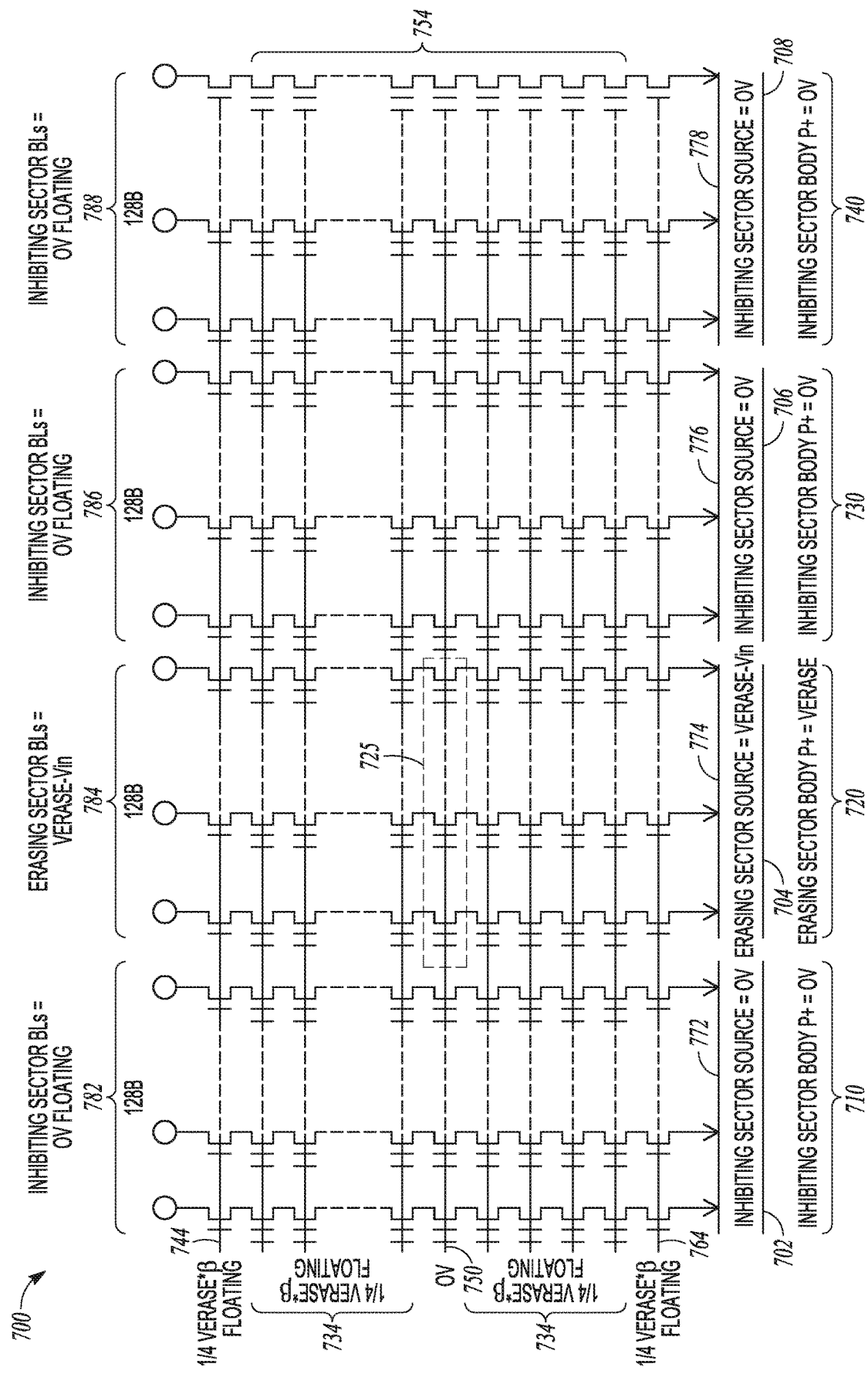
FIG. 35 shows a selected memory block of the 3D NAND memory device of FIG. 2 when performing an erase operation on a partial tier in the form of a sector using sub-body decoding, according to various embodiments

FIG. 35 shows a selected memory block (e.g., the selected memory block 700) of the 3D NAND memory device 200 of FIG. 2 when performing an erase operation on a partial tier in the form of a sector using sub-body decoding, according to various embodiments. Referring to FIGS. 33 and 35, in various embodiments, all of the sub-bodies 702-708, sub-sources 772-778, data lines 782-788, sub-SGD 744 and sub-SGS 764 of the respective sector columns 710-740 may operate in the same way as they operate for an erase operation on a sector column using the sub-body decoding, as described with respect to FIG. 33. Compared to the erase operation on the sector column using the sub-body decoding described with respect to FIG. 33, where all of the sub-CG lines 754 may be biased to about 0V, in FIG. 35, only the (target) sub-CG line 750 corresponding to the (target) partial tier 725 to be erased may be biased to about 0V. The sub-CG lines 734 above or below the (target) sub-CG line 750 may be pulled to the same voltage (e.g., ¼*Verase*β floating) as that of the sub-SGD line 744 or the sub-SGS line 764.

Figure 36:
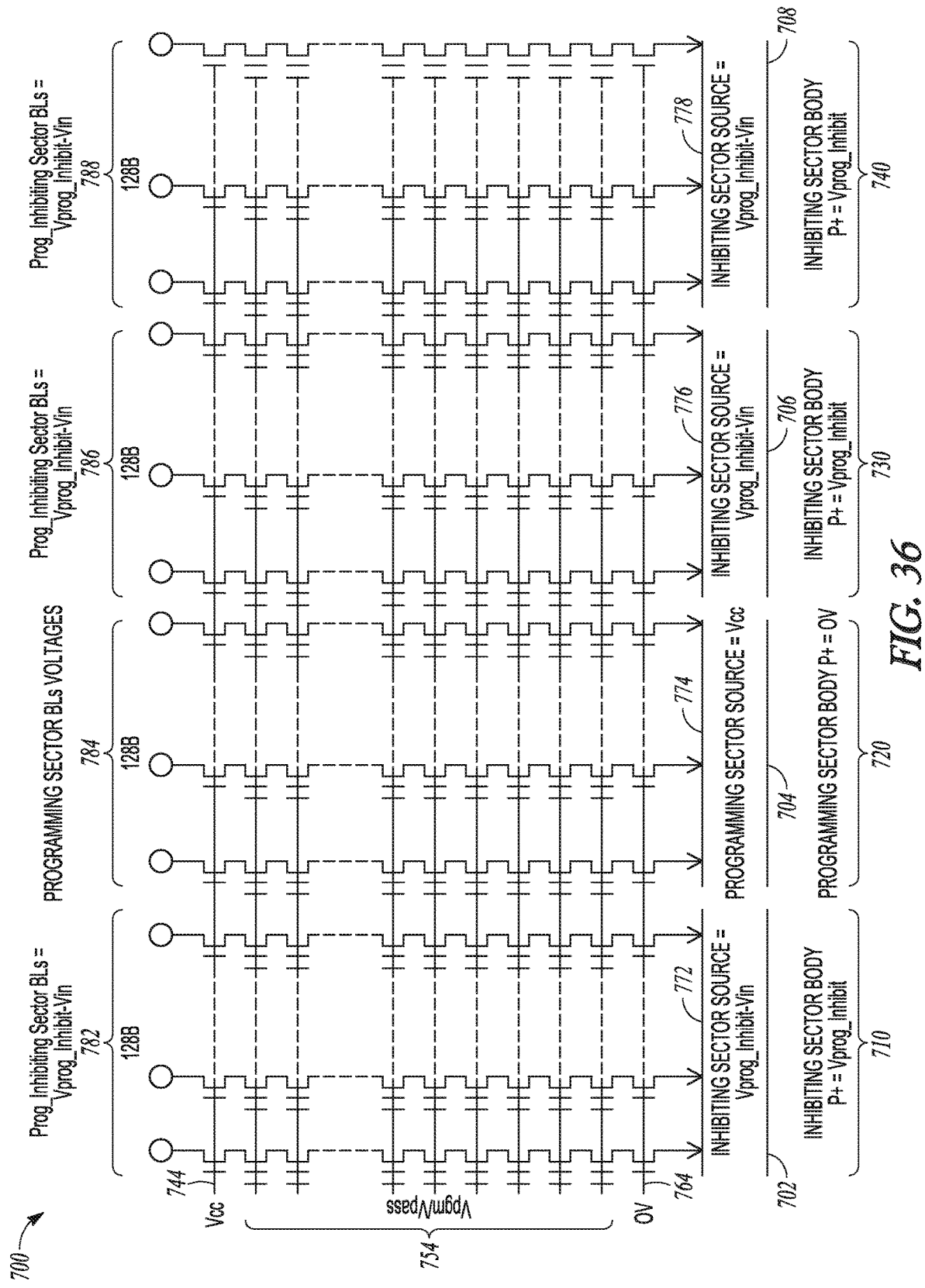
FIG. 36 shows a selected memory block of the 3D NAND memory device of FIG. 2 when performing a program operation on a partial block in the form of a sector column using sub-body decoding, according to various embodiments.

FIG. 36 shows a selected memory block (e.g., the selected memory block 700) of the 3D NAND memory device 200 of FIG. 2 when performing a program operation on a partial block in the form of a sector column using sub-body decoding, according to various embodiments. Referring to FIG. 36, in various embodiments, for example, to select the sector column 720 as a target sector column to be programmed, the sub-body 704 ("programming sector body") of the sector column 720 may be biased to a programming enable voltage, such as about 0V, and the sub-bodies 702, 706 and 708 ("inhibiting sector bodies") of the respective sector columns 710, 730 and 740 to a programming inhibit voltage, such as the voltage "Vprog_inhibit." The sub-source 774 ("programming sector source") of the sector column 720 may be biased to the voltage Vcc (e.g., about 2.5V), and the sub-sources 772, 776 and 778 ("inhibiting sector sources") of the respective sector columns 710, 730 and 740 pulled to the voltage "Vprog_inhibit−Vin."

The data lines 784 of the (selected) sector column 720 may be biased to one or more voltages while the data lines 782, 786 and 788 corresponding to the respective (unselected) sector columns 710, 730 and 740 may be pulled to the voltage Vprog_inhibit−Vin. The sub-SGD line 744 may be biased to the voltage Vcc. For example, in various embodiments, all of the sub-CG lines 754 may be biased to the voltage "Vpass" simultaneously, and then only one selected sub-CG of the sub-CG lines 754 may be biased up to the voltage "Vpgm" at a time (while the rest of the sub-CG lines 754 remain at the voltage Vpass) to program the charge storage devices corresponding to the selected sub-CG. The sub-SGS line 764 may be biased to about 0V.

Figure 37:
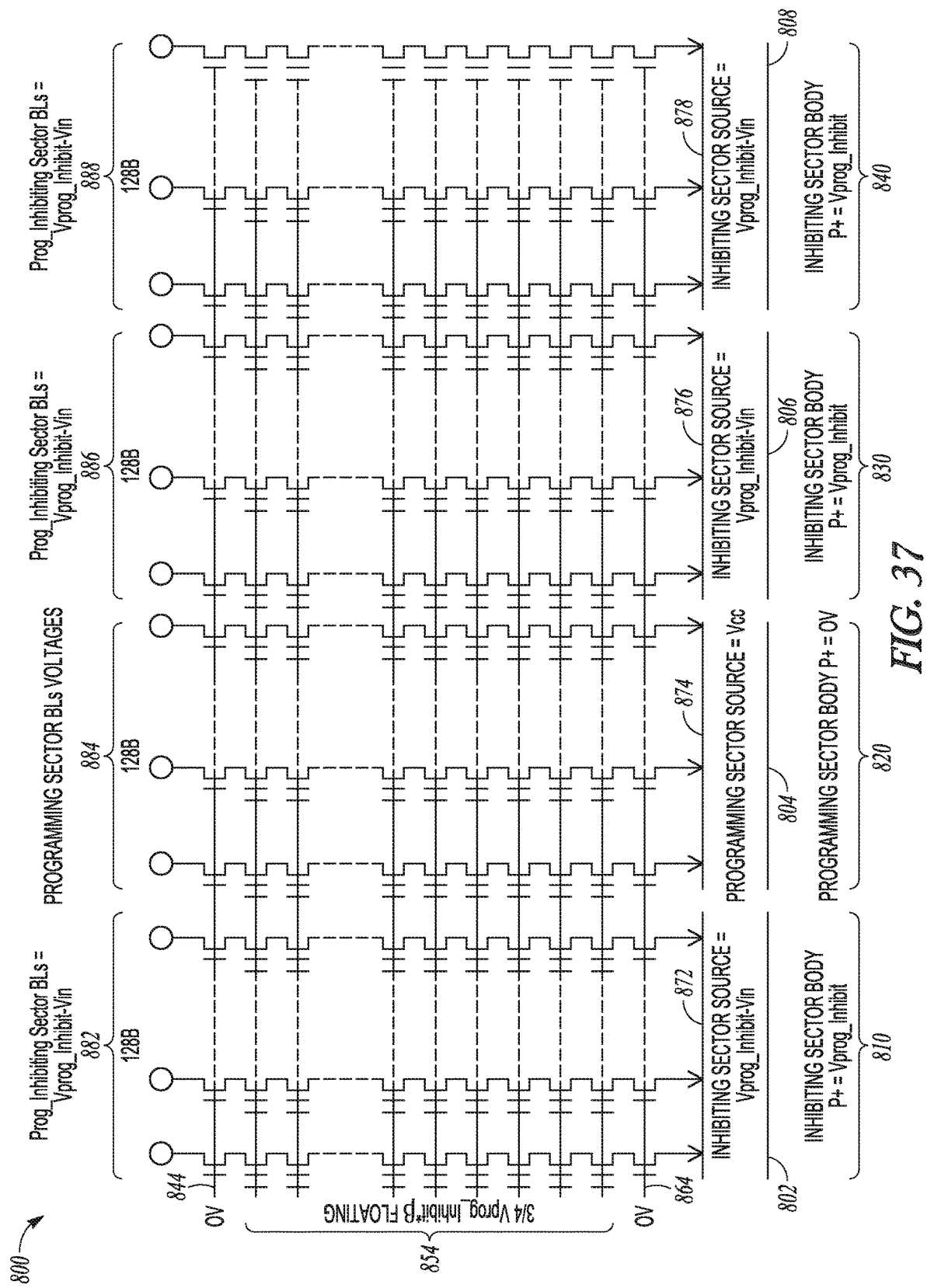
FIG. 37 shows an unselected memory block of the 3D NAND memory device of FIG. 2 when performing a program operation on a partial block in the form of a sector column using sub-body decoding, according to various embodiments.

FIG. 37 shows an unselected memory block (e.g., the unselected memory block 800) of the 3D NAND memory device 200 of FIG. 2 when performing a program operation on a partial block in the form of a sector column using sub-body decoding, according to various embodiments. Referring to FIG. 37, in various embodiments, for example, all of the sub-bodies 802-808, sub-sources 872-878, and data lines 882-888 of the respective sector columns 810-840 of the unselected memory block 800 may operate in the same way as those of the selected memory block 700 of FIG. 36. Compared to the selected memory block 700 of FIG. 36, the sub-SGD line 844 and sub-SGS line 864 of the unselected memory block 800 may be biased to about 0V. The sub-CG lines 854 of the unselected memory block 800 may be pulled to the voltage "¾*Vprog_inhibit*β floating."

Figure 38:
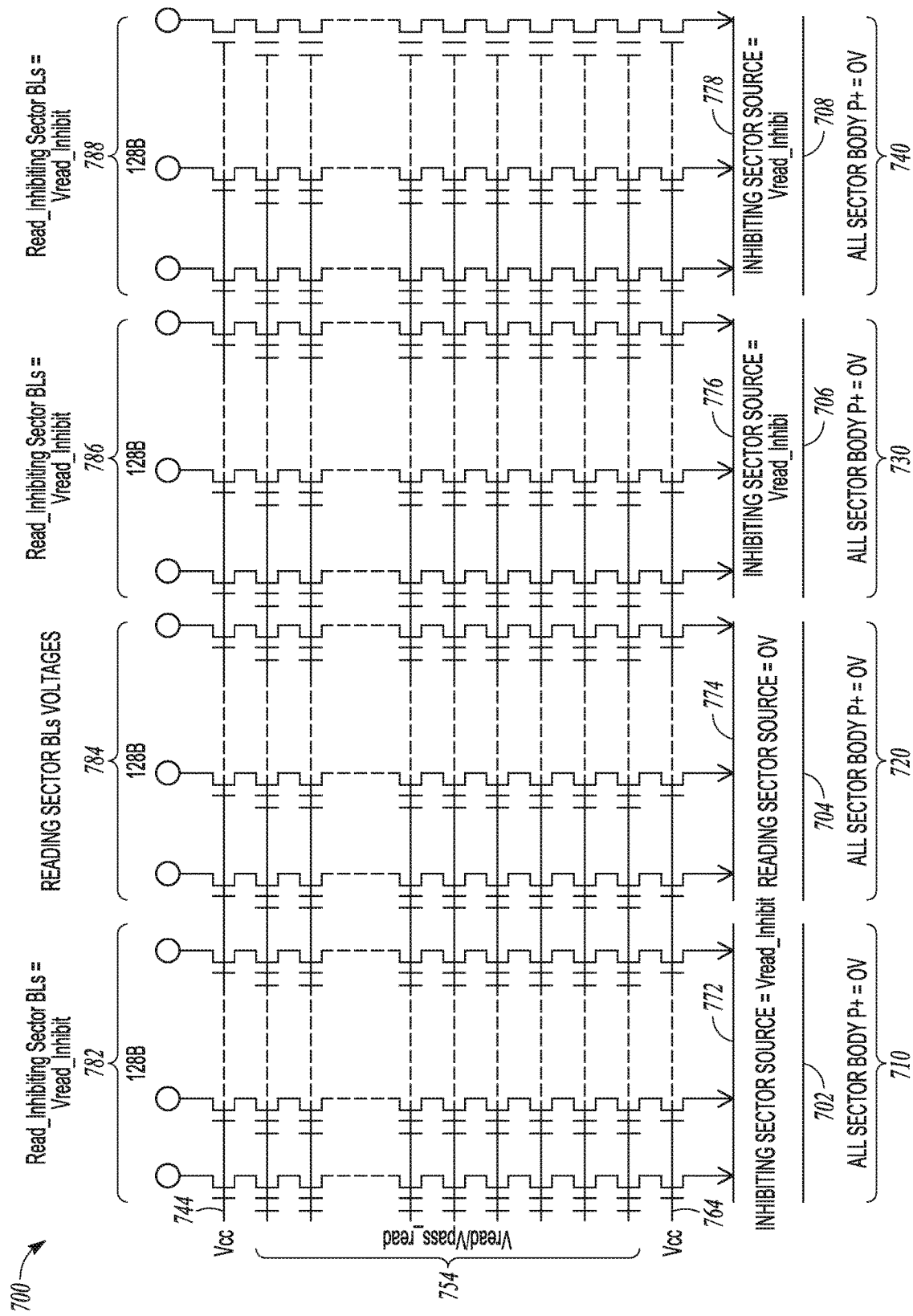
FIG. 38 shows a selected memory block 700 of the 3D NAND memory device of FIG. 2 when performing a read operation on a partial block in the form of a sector column using sub-body decoding, according to various embodiments.

FIG. 38 shows a selected memory block (e.g., the selected memory block 700) of the 3D NAND memory device 200 of FIG. 2 when performing a read operation on a partial block in the form of a sector column using sub-body decoding, according to various embodiments. Referring to FIG. 38, in various enibodiments, all of the sub-bodies 702-708 of the respective sector columns 710-740 may be biased to about 0V. The sub-source 774 ("reading sector source") of the sector column 720 may be biased to a reading enable voltage, such as about 0V, and the sub-sources 772, 776 and 778 ("inhibiting sector sources") of the respective sector columns 710, 730 and 740 to a reading inhibit voltage, such as the voltage "Vread_inhibit". The data lines 784 corresponding to the (selected) sector column 720 may be biased to one or more voltages and the data lines 782, 786 and 788 corresponding to the respective (unselected) sector columns 710, 730 and 740 to the voltage Vread_inhibit. The sub-SGD line 744 and sub-SGS line 764 may be biased to the voltage Vcc. All of the sub-CG lines 754 may be selectively biased to a respective one of the "Vread/Vpass_read" voltages, depending on the page being read. For example, in one embodiment, the voltage Vread may be applied to the selected cell which is to be read, and the voltage Vpass_read may be applied to the other cells in the same string.

Figure 39:
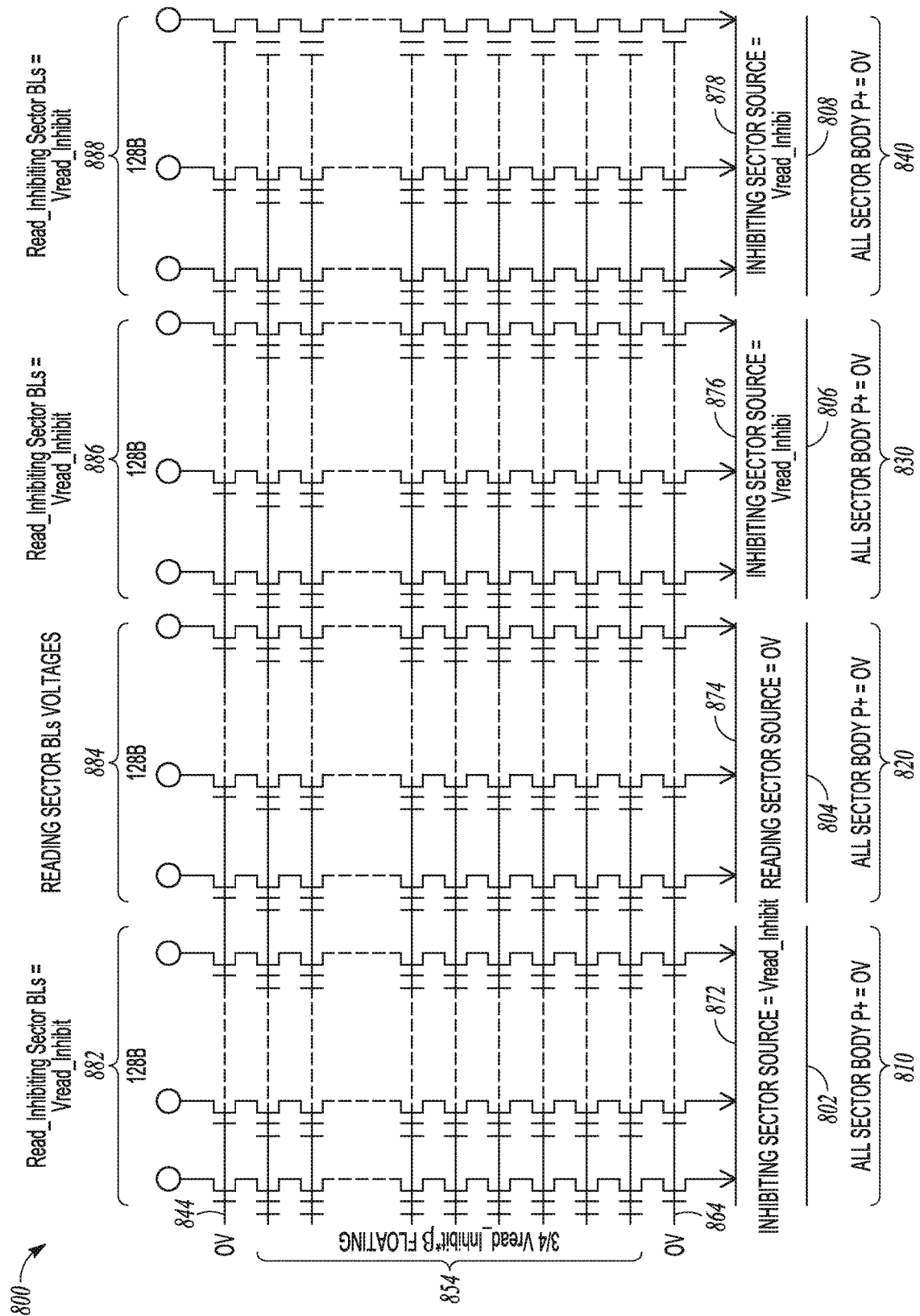
FIG. 39 shows an unselected memory block of the 3D NAND memory device of FIG. 2 when performing a read operation on a partial block in the form of a sector column using sub-body decoding, according to various embodiments.

FIG. 39 shows an unselected memory block (e.g., the unselected memory block 800) of the 3D NAND memory device 200 of FIG. 2 when performing a read operation on a partial block in the form of a sector column using sub-body decoding, according to various embodiments. Referring to FIGS. 38 and 39, all of the sub-bodies 802-808 of the respective sector columns 810-840 may be biased to about 0V. The sub-source 874 ("reading sector source") of the sector column 820 may be biased to about 0V, and the sub-sources 872, 876 and 878 ("inhibiting sector sources") of the respective sector columns 810, 830 and 840 to the voltage Vread_inhibit. The data lines 882, 886 and 888 of the respective (inhibiting) sector columns 810, 830 and 840 may be biased to the voltage Vread_inhibit and the data lines 884 of the (reading) sector column 820 to the one or more voltages different from the voltage Vread_inhibit. The sub-SGD line 844 and sub-SGS line 864 may be biased to about 0V. All of the sub-CG lines 854 may be pulled to a floating voltage, such as the voltage ¾*Vread_inhibit*β floating, wherein β is a capacitive coupling ratio (e.g., 0.8).

In various embodiments, an apparatus may comprise a block of memory cells, the block comprising: strings of charge storage devices, each string comprising charge storage devices formed in a plurality of tiers; access lines shared by the strings, each access line coupled to the charge storage devices corresponding to a respective tier of the plurality of tiers; and sub-sources, each sub-source coupled to a source select gate (SGS) of each string of a respective subset of the strings, and each sub-source independently selectable from other sub-sources to select the strings of its respective subset independently of other strings corresponding to other subset.

In various embodiments, each of the access lines may be coupled to sub-access lines.

In various embodiments, the charge storage devices coupled by a respective sub-access line of the sub-access lines may comprise a respective memory tile of a plurality of memory tiles.

In various embodiments, each of the access lines may be coupled to its sub-access lines via sub-string drivers.

In various embodiments, the apparatus may further comprise sub-source drivers, each sub-source driver coupled to a respective sub-source of the sub-sources, and each sub-source driver to apply a control signal to the respective sub-source independently of other sub-source drivers corresponding to other sub-sources.

In various embodiments, the subsets of the strings of the block may comprise tile columns.

In various embodiments, the subsets of the strings of the block may comprise sector columns.

In various embodiments, the apparatus may further comprise sub-source select gate (sub-SOS) lines, each sub-SGS line coupled to the SGS of each string of a respective subset of the strings, each sub-SGS line independently selectable from other sub-SOS lines corresponding to other subsets of strings.

In various embodiments, the apparatus may further comprise sub-SGS drivers, each sub-SGS driver coupled to a respective sub-SGS line to apply a control signal to the respective sub-SOS line independently of other sub-SGS drivers corresponding to other sub-SGS lines.

In various embodiments, the apparatus may further comprise sub-drain select gate (sub-SGD) lines, each sub-SGD line coupled to a SGD of each string of a respective subset of the strings, each sub-SGD line independently selectable from other sub-SGD lines corresponding to other subsets of strings.

In various embodiments, the apparatus may further comprise sub-SGD drivers, each sub-SGD driver coupled to a respective sub-SGD line to apply a control signal to the respective sub-SGD line independently of other sub-SGD drivers corresponding to other sub-SGD lines.

In various embodiments, the apparatus may further comprise data lines, each data line coupled to a drain select gate (SGD) of a respective string of the strings, the data lines comprising subsets of data lines, each of the subsets of the data lines corresponding to a respective sub-source of the sub-sources.

In various embodiments, each data line of the plurality of data lines may be coupled to a respective plurality of strings of charge storage devices including the respective string.

In various embodiments, an apparatus may comprise a first memory block and a second memory block, at least one of the first and second memory blocks comprising: strings of charge storage devices, each string comprising charge storage devices formed in a plurality of tiers; access lines shared by the strings, each access line coupled to the charge storage devices corresponding to a respective tier of the plurality of tiers; and sub-drain select gate (sub-SGD) lines, each sub-SGD line coupled to a SGD of each string of a respective subset of the strings, and each sub-SGD line independently selectable from other sub-SGD lines to select the strings of its respective subset independently of other strings corresponding to other subsets.

In various embodiments, the apparatus may further comprise sub-SGD drivers, each sub-SGD driver coupled to a respective sub-SGD line of the sub-SGD lines to apply a control signal to the respective sub-SGD line independently of other sub-SGD drivers corresponding to other SGD lines.

In various embodiments, each of the access lines may be coupled to sub-access lines and each of the sub-access lines coupled to a respective access line of the access lines may correspond to a respective subset of the strings.

In various embodiments, an apparatus may comprise a block of memory cells, the block comprising: strings of charge storage devices, each string comprising charge storage devices formed in a plurality of tiers; access lines shared by the strings, each access line coupled to the charge storage devices corresponding to a respective tier of the plurality of tiers; and sub-bodies, each sub-body coupled to each string of a respective subset of the strings, and each sub-body independently selectable from other sub-bodies to select the strings of its respective subset independently of other strings corresponding to other subsets.

In various embodiments, at least one of the sub-bodies comprises a $P^+$ Poly-Silicon line.

In various embodiments, the apparatus may further comprise sub-body drivers, each sub-body driver coupled to a respective sub-body of the sub-bodies to apply a control signal to the respective sub-body independently of other sub-body drivers corresponding to other sub-bodies.

In various embodiments, each of the access lines may be coupled to sub-access lines and each of the sub-access lines coupled to a respective access line of the access lines may correspond to a respective subset of the strings.

In various embodiments, the charge storage devices coupled by a respective sub-access line of the sub-access lines coupled to a respective access line may comprise a memory tile of a plurality of memory tiles, each memory tile independently accessible with respect to other memory tiles when performing a memory operation.

In various embodiments, the apparatus may further comprise sub-sources, each sub-source coupled to a source select gate (SGS) of each string of a respective subset of the strings, and each sub-source independently selectable from other sub-sources to select the strings of its respective subset independently of other strings corresponding to other subsets.

In various embodiments, at least one of the sub-sources may comprise an $N^+$ Poly-Silicon line.

Figure 40:
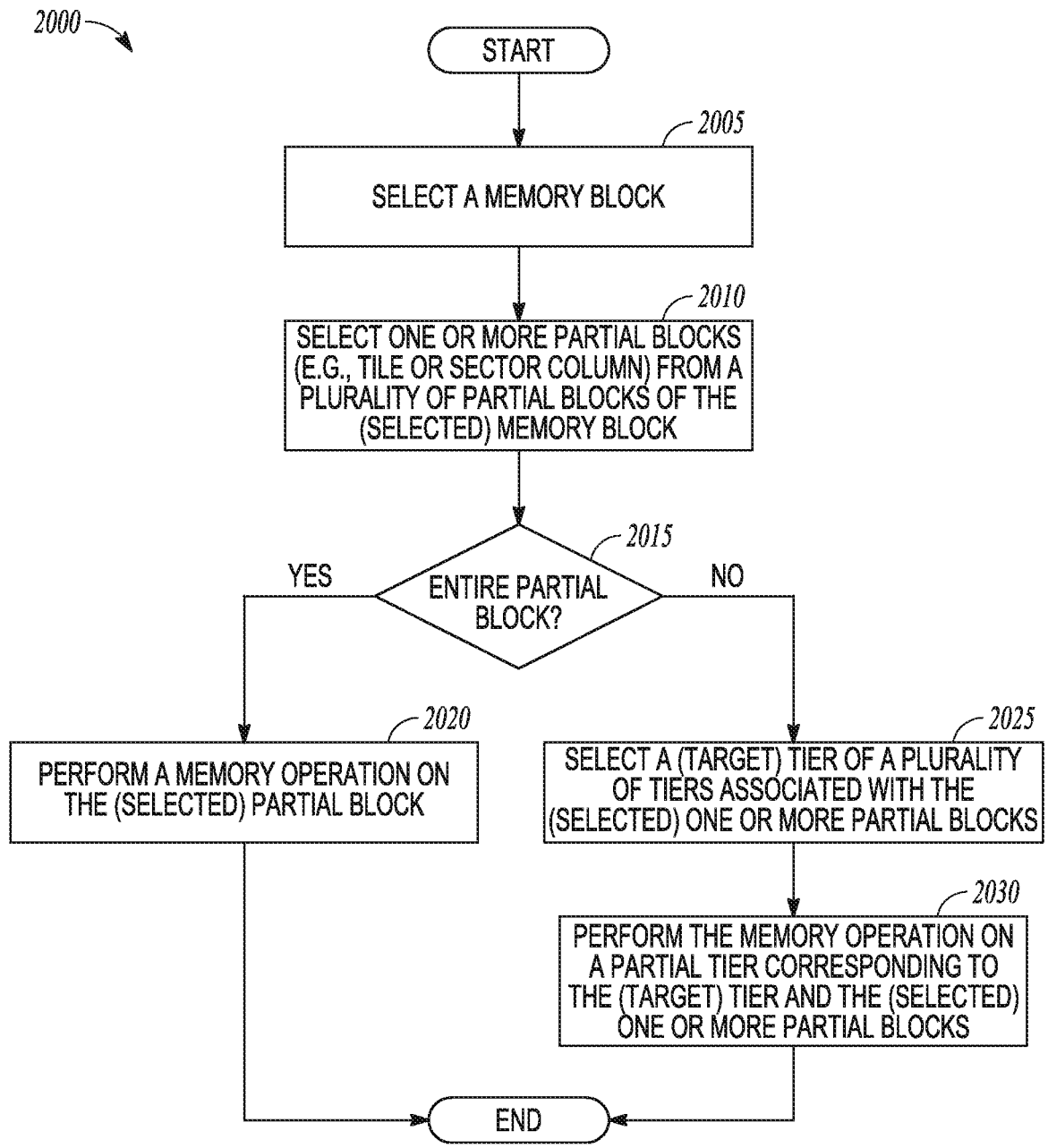
FIG. 40 shows a flow diagram illustrating methods of performing a memory operation on a partial block, according to various embodiments.

FIG. 40 shows a flow diagram illustrating methods 2000 of performing a memory operation (e.g., erase, program, read or verify) on a partial block, according to various embodiments. The methods 2000 may be implemented using the apparatuses shown in FIGS. 1-39, among others. In various embodiments, the methods 2000 may commence at block 2005 with selecting a memory block (e.g., the memory block 300 or 700) from a plurality of memory blocks of a memory array (e.g., the 3D NAND memory device 200), including the unselected memory blocks 500 and/or 800.

At block 2010, one or more partial blocks (e.g., the partial block 320 or 720), such as tile columns or sector columns, may be selected from a plurality of partial blocks of the selected memory block (e.g., the memory block 300 or 700) to perform a memory operation. At block 2015, it may be checked whether the memory operation is directed to the entire (selected) partial block. In various embodiments, if the memory operation is directed to the entire (selected) partial block (as indicated by "YES"), then, at block 2020, the memory operation may be performed only on the selected partial block. In various embodiments, if the memory operation is not directed to the entire (selected) partial block (as indicated by "YES"), then, at block 2025, a (target) tier may be selected from a plurality of tiers associated with the (selected) one or more partial blocks. At block 2030, the memory operation may be performed only on a partial tier that corresponds to the selected (target) tier and the (selected) one or more partial blocks.

In various embodiments, a method may operate a memory block comprising strings of charge storage devices associated with a plurality of access lines and a plurality of sub-sources, each sub-source coupled to the strings of a respective subset of a plurality of subsets of the strings, the method comprising: applying a first signal to a selected sub-source of the plurality of sub-sources and a second signal to other sub-sources of the plurality of sub-sources to perform a memory operation on a charge storage device of a string of the respective subset of the strings corresponding to the selected sub-source.

In various embodiments, the memory block may comprises a plurality of sub-bodies, and the method may further comprise: applying a third signal to a selected sub-body of the plurality of sub-bodies corresponding to the selected sub-source and a fourth signal to other sub-bodies of the plurality of sub-bodies.

In various embodiments, the method may further comprise refraining from performing the memory operation on charge storage devices of the strings of the other subsets of the strings corresponding to the other sub-sources while performing the memory operation on the charge storage device of the string of the respective subset of the strings corresponding to the selected sub-source.

In various embodiments, applying a first signal to a selected sub-source may comprise applying an enable voltage to the selected sub-source, and applying a second signal to other sub-sources may comprise applying an inhibit voltage to the other sub-sources.

In various embodiments, each access line may be associated with a plurality of sub-access lines, and the method may further comprise: applying a third signal to a selected sub-access line of the plurality of sub-access lines and a fourth signal to other sub-access lines of the plurality of sub-access lines, to select the selected sub-access line, wherein the charge storage device on which the memory operation is performed corresponds to the selected sub-access line.

In various embodiments, the method may further comprise refraining from performing the memory operation on charge storage devices corresponding to the other sub-access lines of the plurality of sub-access lines while performing the memory operation on the charge storage device corresponding to the selected sub-access line.

In various embodiments, the memory block may comprise a plurality of data lines associated with the strings of charge storage devices, and the method may further comprise: applying a fifth signal to a data line coupled to the string of the respective subset of the strings corresponding to the selected sub-source and a sixth signal to other data lines coupled to the strings of the other subsets.

In various embodiments, the memory block may comprise a plurality of sub-drain select gate (SGD) lines, each sub-SGD line coupled to the strings of a respective subset of a plurality of subsets of the strings, and the method may further comprise: applying a seventh signal to a selected sub-SGD line of the plurality of sub-SGD lines and a eighth signal to other sub-SGD lines of the plurality of sub-SGD lines, wherein the selected sub-SGD line corresponds to the selected sub-source and the other sub-SGD lines correspond to the other sub-sources.

In various embodiments, the memory block may comprise a plurality of sub-source select gate (SGS) lines, each sub-SGS line coupled to the strings of a respective subset of a plurality of subsets of the strings, and the method may further comprise: applying a ninth signal to a selected sub-SGD line of the plurality of sub-SGD lines and a tenth signal to other sub-SOS lines of the plurality of sub-SGS lines, wherein the selected sub-SGS line corresponds to the selected sub-source and the other sub-SGS lines correspond to the other sub-sources.

In various embodiments, a method may operate a memory block comprising strings of charge storage devices associated with a plurality of access lines and a plurality of sub-drain select gate (SGD) lines, each sub-SGD line coupled to the strings of a respective subset of a plurality of subsets of the strings, the method comprising: applying a first signal to a selected sub-SGD line of the plurality of sub-SGD lines and a second signal to other sub-SGD lines of the plurality of sub-SGD lines to perform a memory operation on a charge storage device of a string of the respective subset of the strings corresponding to the selected sub-SGD line.

In various embodiments, the memory block may comprise a plurality of data lines associated with the strings of charge storage devices, and the method further comprises: applying a third signal to a data line coupled to the string of the respective subset of the strings corresponding to the selected sub-SGD line and a fourth signal to data lines coupled to the strings of the other subsets.

In various embodiments, the method may further comprise refraining from performing the memory operation on charge storage devices of the strings of the other subsets of the strings corresponding to the other sub-SGD lines while performing the memory operation on the charge storage device of the string of the respective subset of the strings corresponding to the selected sub-SGD line.

In various embodiments, the method may further comprise: selecting an access line of the plurality of access lines; and selecting a sub-access line of a plurality of sub-access lines associated with the selected access line, each sub-access line coupled to a respective subset of a plurality of subsets of the charge storage devices shared by the selected access line, the selected sub-access line corresponding to the selected sub-source, wherein the charge storage device on which the memory operation is performed corresponds to the selected sub-access line.

In various embodiments, the method may further comprise applying a third signal to the sub-access line corresponding to the selected sub-source and the selected access line, and a fourth signal to other sub-access lines corresponding to the selected sub-source and the other access lines.

The illustrations of the apparatus, signals and methods described with respect to FIGS. 1-40 are intended to provide a general understanding of the structures and functionalities of various embodiments, and not as a complete description of all the elements and features of apparatus, signals, or methods that might make use of the structures and functionalities described herein.

The novel apparatus and methods of various embodiments may comprise and/or be included in electronic circuitry used in computers, communication and signal processing circuitry, single or multi-processor modules, single or multiple embedded processors, multi-core processors, data switches, and application-specific modules including multilayer, multi-chip modules. Such apparatuses and methods may further be included as sub-components within a variety of electronic systems, such as televisions, cellular telephones, personal computers (e.g., laptop computers, desktop computers, handheld computers, tablet computers, etc.), workstations, radios, video players, audio players MP3 (Motion Picture Experts Group, Audio Layer 3) players), vehicles, medical devices (e.g., heart monitor, blood pressure monitor, etc.), set top boxes, and others.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed. Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. § 1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus comprising a block of memory cells, the block comprising:
strings of charge storage devices, each string comprising charge storage devices formed in a plurality of tiers;
access lines shared by the strings, each access line coupled to the charge storage devices of a respective tier of the plurality of tiers;
sub-bodies, each sub-body coupled to each string of a respective subset of the strings, and each sub-body independently selectable from other sub-bodies to select the strings of its respective subset independently of other strings corresponding to other subsets;
additional strings of charge storage devices, each string the additional strings comprising charge storage devices formed in a plurality of tiers;
additional access lines shared by the additional strings, each access line of the additional access lines coupled to the charge storage devices of the additional strings of a respective tier of the plurality of tiers associated with the additional strings;
additional sub-bodies, each sub-body of the additional sub-bodies coupled to each string of a respective subset of the strings of the additional strings, and each sub-body of the additional sub-bodies independently selectable from other sub-bodies of the additional sub-bodies to select the strings of its respective subset of the strings of the additional strings independently of other strings corresponding to other subsets of the strings of the additional strings;
a global access line;
a first string driver coupled between the global access line and one of the access lines; and
a second string driver coupled between the global access line and one of the additional access lines, wherein:
the strings of charge storage devices and the access lines are included in a first partial block of the block of memory cells; and
the additional strings of charge storage devices and the additional access lines are included in a second partial block of the block of memory cells, and wherein the access lines coupled to the strings of charge storage devices in the first partial block of the block of memory cells are electrically separated from the additional access lines coupled to the additional strings of charge storage devices in the second partial block of the block of memory cells.

2. The apparatus of claim 1, wherein at least one of the sub-bodies comprises a $P^+$ Poly-Silicon line.

3. The apparatus of claim 1, further comprising:
sub-body drivers, each sub-body driver coupled to a respective sub-body of the sub-bodies to apply a control signal to the respective sub-body independently of other sub-body drivers corresponding to other sub-bodies.

4. The apparatus of claim 1, further comprising:
sub-sources, each sub-source coupled to a source select gate (SGS) of each string of a respective subset of the strings, and each sub-source independently selectable from other sub-sources to select the strings of its respective subset independently of other strings corresponding to other subsets.

5. The apparatus of claim 1, wherein at least one of the sub-sources comprises an $N^+$ Poly-Silicon line.

6. The apparatus of claim 1, further comprising:
sub-drain select gate (sub-SGD) lines, each sub-SGD line coupled to a SGD of each string of a respective subset of the strings, and each sub-SGD line independently selectable from other sub-SGD lines to select the strings of its respective subset independently of other strings corresponding to other subsets.

7. The apparatus of claim 6, further comprising:
sub-SGD drivers, each sub-SGD driver coupled to a respective sub-SGD line of the sub-SGD lines to apply a control signal to the respective sub-SGD line independently of other sub-SGD drivers corresponding to other SGD lines.

8. An apparatus comprising:
a global access line;
first strings of charge storage devices, each string of the first strings comprising charge storage devices formed in a plurality of tiers;
first access lines shared by the first strings, each access line of the first access lines coupled to the charge storage devices of a respective tier of the plurality of tiers;
first sub-bodies, each sub-body of the first sub-bodies coupled to each string of a respective subset of the first strings;
a first string driver coupled between the global access line and one of the first access lines; and
second strings of charge storage devices, each string of the second strings comprising charge storage devices formed in a plurality of tiers;
second access lines shared by the second strings, each access line of the second access lines coupled to the charge storage devices of the second strings of a respective tier of the plurality of tiers associated with the second strings;
second sub-bodies, each sub-body of the second sub-bodies coupled to each string of a respective subset of the strings of the second strings; and
a second string driver coupled between the global access line and one of the second access lines, wherein:
the first strings of charge storage devices and the first access lines are included in a first partial block of a block of memory cells; and
the second strings of charge storage devices and the second access lines are included in a second partial block of the block of memory cells, and wherein the first access lines coupled to the first strings of charge storage devices in the first partial block of the block of memory cells are electrically separated from the second access lines coupled to the second strings of charge storage devices in the second partial block of the block of memory cells.

9. The apparatus of claim 8, further comprising:
a first sub-source coupled to the first strings; and
a second sub-source coupled to the second strings, wherein the first sub-source is separated from the first sub-source.

10. The apparatus of claim 8, further comprising:
first sub-drain select gate lines coupled to the first strings; and
second sub-drain select gate lines coupled to the second strings, wherein the first sub-drain select gate lines are separated from the second sub-drain select gate lines.

11. The apparatus of claim 10, further comprising:
a global drain select line;
a first drain select line driver coupled between the global drain select line and one of the first sub-drain select gate lines; and
a second drain select line driver coupled between the global drain select line and one of the second sub-drain select gate lines.

\* \* \* \* \*